(12) United States Patent
Sreenivasan et al.

(10) Patent No.: US 11,881,435 B2
(45) Date of Patent: Jan. 23, 2024

(54) CATALYST INFLUENCED CHEMICAL ETCHING FOR FABRICATING THREE-DIMENSIONAL SRAM ARCHITECTURES

(71) Applicant: Board of Regents, The University of Texas System, Austin, TX (US)

(72) Inventors: Sidlgata V. Sreenivasan, Austin, TX (US); Akhila Mallavarapu, Philadelphia, PA (US); Jaydeep Kulkarni, Austin, TX (US); Michael Watts, Austin, TX (US); Sanjay Banerjee, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 17/735,476

(22) Filed: May 3, 2022

(65) Prior Publication Data
US 2022/0270930 A1 Aug. 25, 2022

Related U.S. Application Data

(62) Division of application No. 16/872,651, filed on May 12, 2020, now Pat. No. 11,355,397.
(Continued)

(51) Int. Cl.
*H01L 21/8234* (2006.01)
*H01L 29/786* (2006.01)
(Continued)

(52) U.S. Cl.
CPC .. *H01L 21/823431* (2013.01); *H01L 21/3065* (2013.01); *H01L 21/30604* (2013.01);
(Continued)

(58) Field of Classification Search
CPC ....... H01L 21/823431; H01L 29/78696; H01L 29/66795; H01L 27/0886; H01L 27/1104;
(Continued)

(56) References Cited

U.S. PATENT DOCUMENTS

2013/0052762 A1  2/2013 Li et al.
2013/0280908 A1* 10/2013 Li ...................... H01L 33/0062
                                                                977/762
(Continued)

FOREIGN PATENT DOCUMENTS

WO       2019108366 A1    6/2019

OTHER PUBLICATIONS

International Search Report for International Application No. PCT/US2020/032527 dated Oct. 28, 2020, pp. 1-4.
(Continued)

*Primary Examiner* — Jonathan Han
(74) *Attorney, Agent, or Firm* — Robert A. Voigt, Jr.; Shackelford, Bowen, McKinley & Norton, LLP

(57) ABSTRACT

A method for fabricating a three-dimensional (3D) static random-access memory (SRAM) architecture using catalyst influenced chemical etching (CICE). Utilizing CICE, semiconductor fins can be etched with no etch taper, smooth sidewalls and no maximum height limitation. CICE enables stacking of as many nanosheet layers a desired and also enables a 3D stacked architecture for SRAM cells. Furthermore, CICE can be used to etch silicon waveguides thereby creating waveguides with smooth sidewalls to improve transmission efficiency and, for photon-based quantum circuits, to eliminate charge fluctuations that may affect photon indistinguishability.

5 Claims, 47 Drawing Sheets

Related U.S. Application Data

(60) Provisional application No. 62/911,837, filed on Oct. 7, 2019, provisional application No. 62/847,196, filed on May 13, 2019.

(51) Int. Cl.

| | | |
|---|---|---|
| *H01L 29/66* | (2006.01) | |
| *H01L 27/088* | (2006.01) | |
| *H01L 21/3065* | (2006.01) | |
| *H01L 29/423* | (2006.01) | |
| *H01L 21/306* | (2006.01) | |
| *H10B 10/00* | (2023.01) | |

(52) U.S. Cl.
CPC .... *H01L 27/0886* (2013.01); *H01L 29/42392* (2013.01); *H01L 29/66795* (2013.01); *H01L 29/78696* (2013.01); *H10B 10/12* (2023.02)

(58) Field of Classification Search
CPC ........... H01L 21/3065; H01L 29/42392; H01L 21/30604; H01L 29/66439; H01L 27/092; H01L 21/8221; H01L 21/823807; H01L 27/0688; H01L 29/0673; H01L 29/775; H01L 29/0696; H01L 29/4238; H01L 29/7804; H01L 29/1095; H01L 29/1608; H01L 29/0878; H01L 29/0623; H01L 29/66734; H01L 29/7813; H01L 29/7815; H01L 27/0207; H01L 27/0255; H01L 27/0296; H01L 27/088; H01L 22/34; H01L 29/0684; H01L 29/0615; G02B 2006/12061; G02B 6/12004; G02B 6/1223; G02B 6/136; B82Y 10/00

See application file for complete search history.

(56) References Cited

U.S. PATENT DOCUMENTS

| | | | |
|---|---|---|---|
| 2014/0353574 A1 | 12/2014 | Li et al. | |
| 2017/0117291 A1* | 4/2017 | Or-Bach | H10B 43/27 |
| 2017/0243751 A1* | 8/2017 | Li | H01L 21/0475 |
| 2019/0148286 A1* | 5/2019 | Or-Bach | H10B 43/20 |
| | | | 257/315 |
| 2019/0172751 A1* | 6/2019 | Smith | H01L 27/0924 |

OTHER PUBLICATIONS

Written Opinion of the International Searching Authority for International Application No. PCT/US2020/032527 dated Oct. 28, 2020, pp. 1-6.

IEEE, "International Roadmap for Devices and Systems," 2017, pp. 1-30.

Chang et al., "A 7nm 256MB Sram in High-K Metal-Gate FinFET Technology with Write-Assist Circuitry for Low-Vmin Applications," IEEE International Solid-State Circuits Conference, 2017, pp. 206-208.

Koichiro iShibashi, Low Power and Reliable SRAM Memory Cell and Array Design, Chapter 1: Introduction, 2011, pp. 1-4.

Nii et al., Low Power and Reliable SRAM Memory Cell and Array Design, Chapter 7: Technologies, pp. 125-138.

Ryckaert et al., "The Complementary FET (CFET) for CMOS Scaling Beyond N3," Symposium on VLSI Technology Digest of Technical Papers, 2018, pp. 141-142.

C. Shin, Variation-Aware Advanced CMOS Devices and SRAM, Chapter 8: Applications in Static Random Access Memory (SRAM), 2016, pp. 123-140.

Song et al., "A 14 nm FinFET 128 Mb SRAM with Vmin Enhancement Techniques for Low-Power Applications," IEEE Journal of Solid-State Circuits, vol. 50, No. 1, Jan. 2015, pp. 158-169.

Song et al., "A 7nm FinFET SRAM Using EUV Lithography with Dual Write-Driver-Assist Circuitry for Low-Voltage Applications," IEEE International Solid-State Circuits Conference, 2018, pp. 198-200.

Veloso et al., "Vertical Nanowire FET Integration and Device Aspects," ESC Transactions, vol. 72, No. 4, 2016, pp. 31-42.

Veloso et al., "Challenges and Opportunities of Vertical FET Devices Using 3D Circuit Design Layouts," IEEE, 2016, pp. 1-3.

Xiuling Li, "Metal Assisted Chemical Etching for High Aspect Ratio Nanostructures: A Review of Characteristics and Applications in Photovoltaics,"Current Opinion in Solid State and Materials Science, 2012, pp. 1-11.

Huang et al., "Metal-Assisted Chemical Etching of Silicon: A Review," Advanced Materials, vol. 23, 2011, pp. 285-308.

* cited by examiner

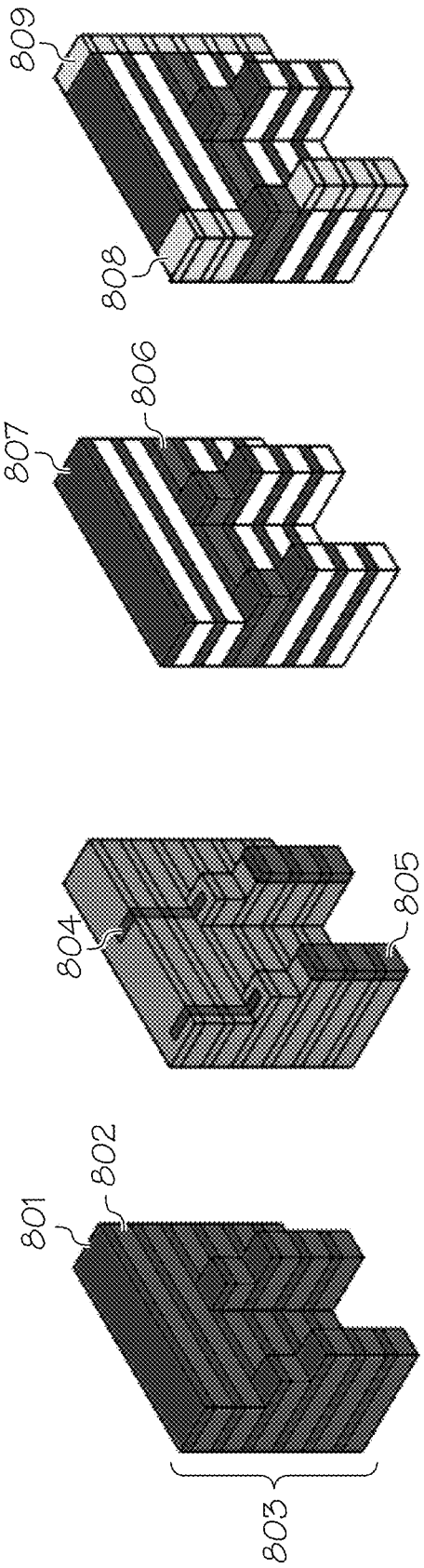
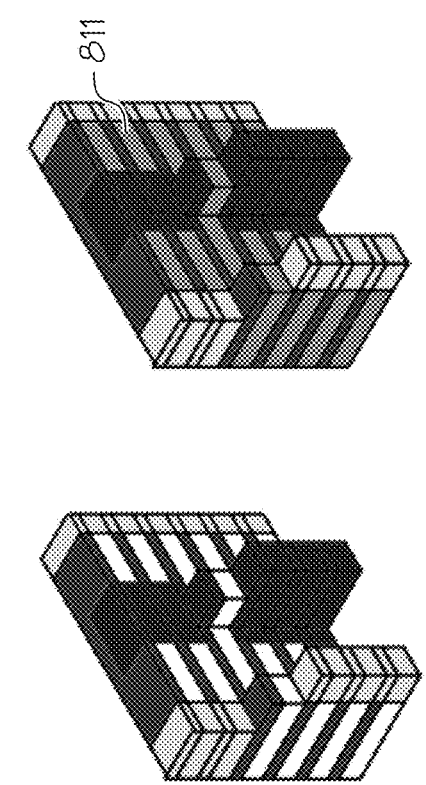
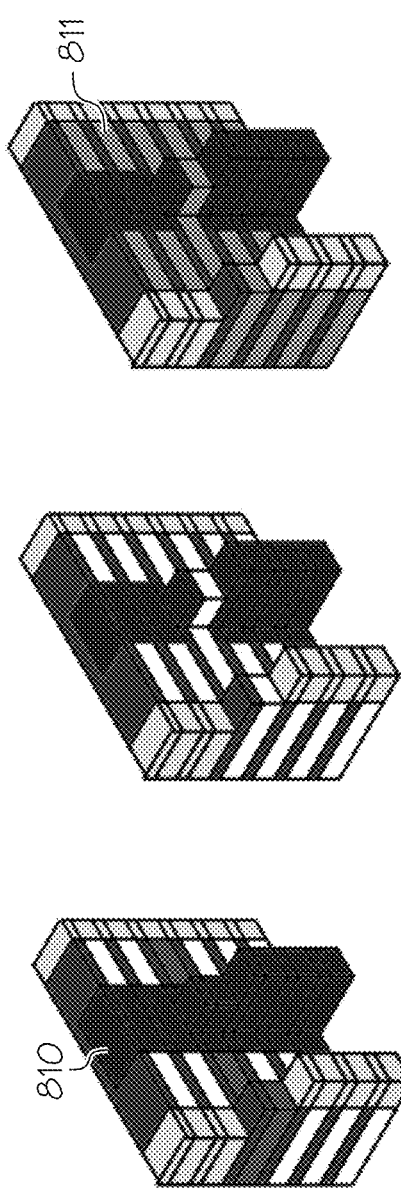
FIG. 8A
FIG. 8B
FIG. 8C
FIG. 8D
FIG. 8E
FIG. 8F
FIG. 8G

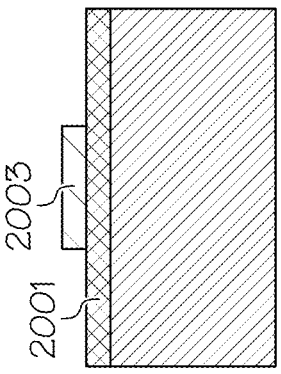
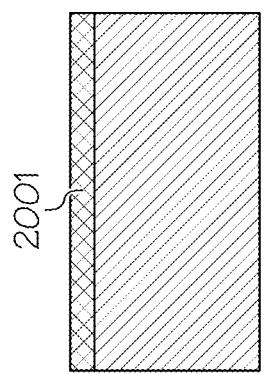
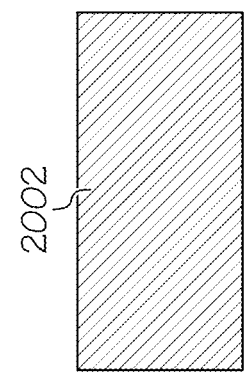
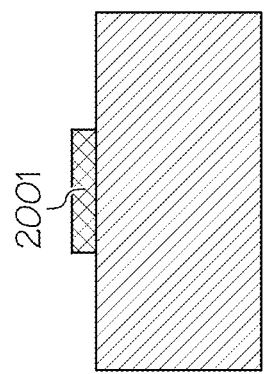
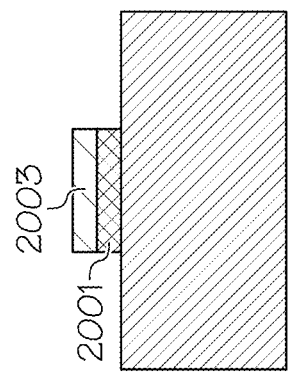

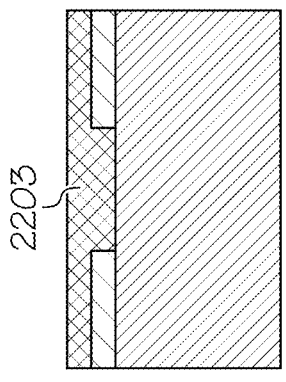
FIG. 22A
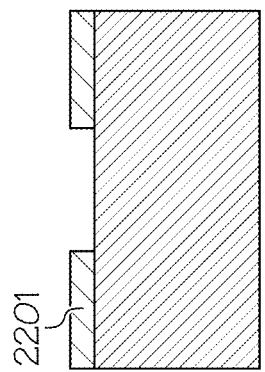
FIG. 22B
FIG. 22C
FIG. 22D
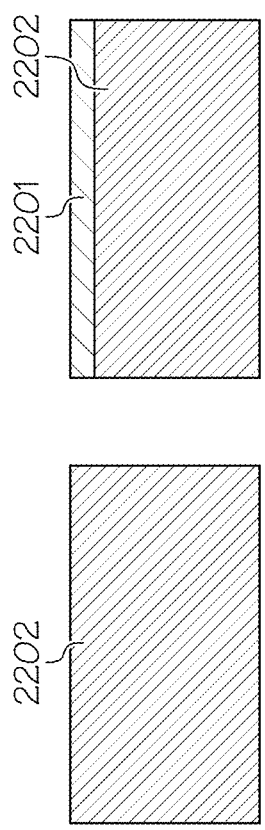
FIG. 22E
FIG. 22F
FIG. 22G

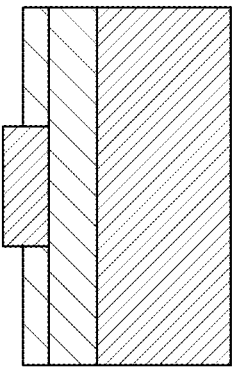
FIG. 24C
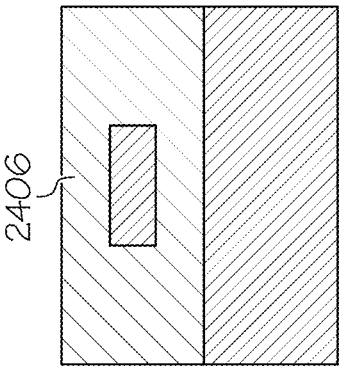
FIG. 24E
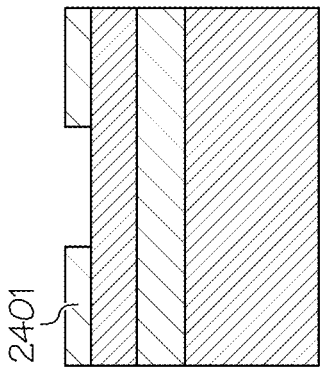
FIG. 24B
FIG. 24D
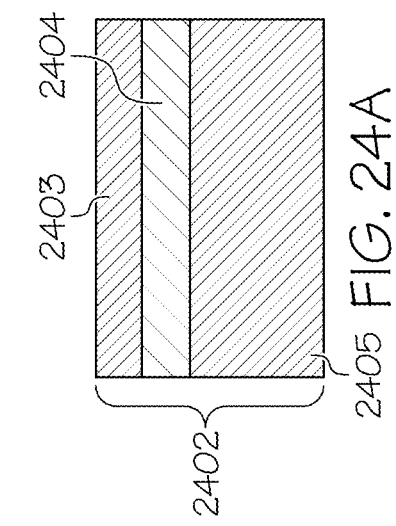
FIG. 24A

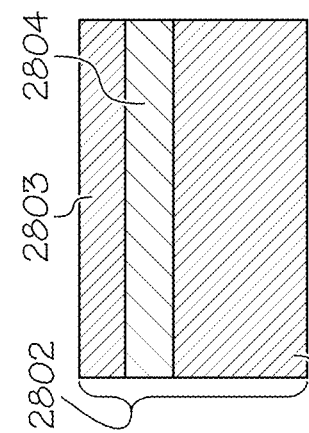
FIG.28A
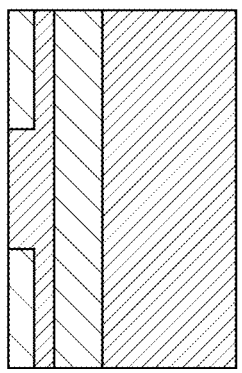
FIG.28B
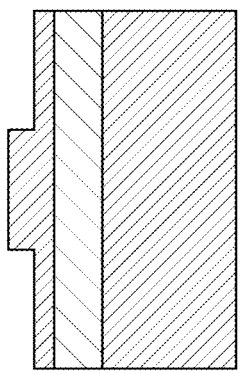
FIG.28C
FIG.28D
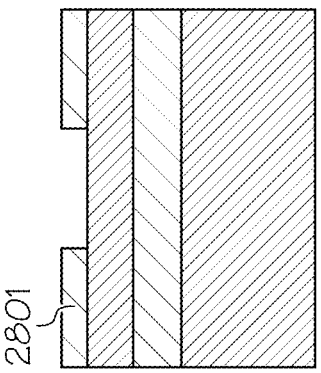
FIG.28E
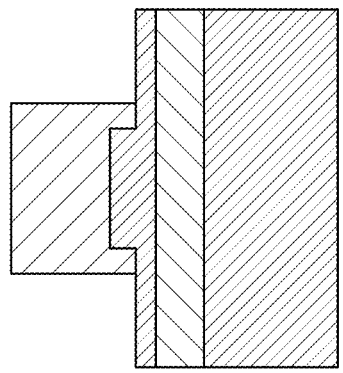
FIG.28F
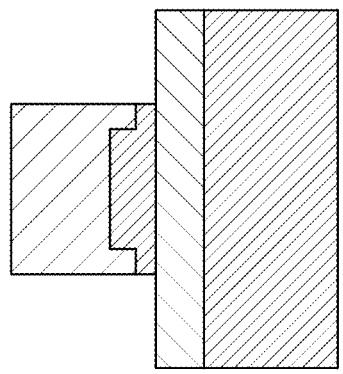
FIG.28G
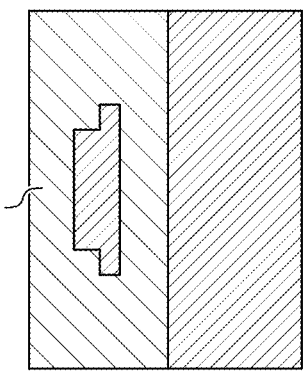
FIG.28H

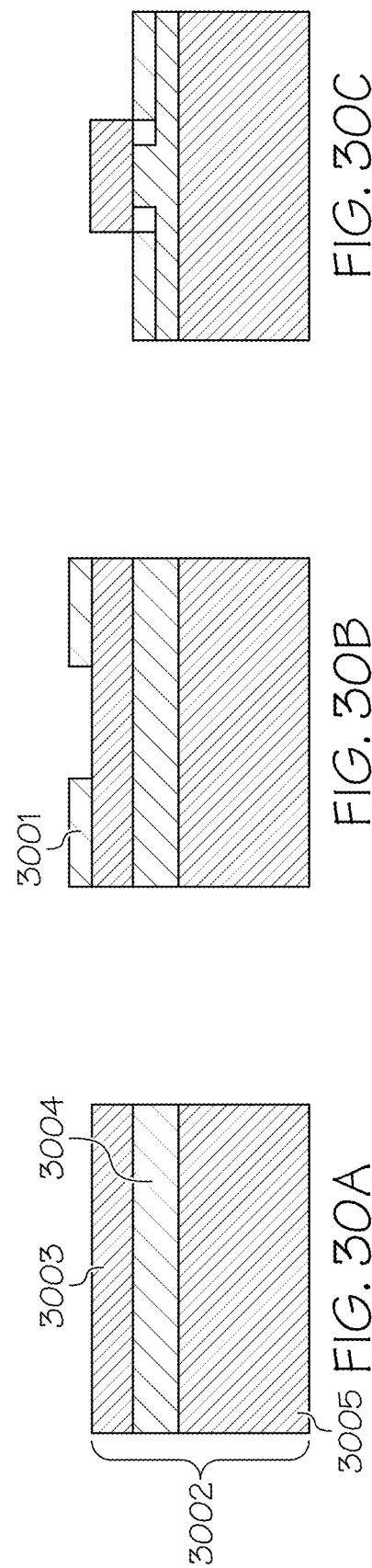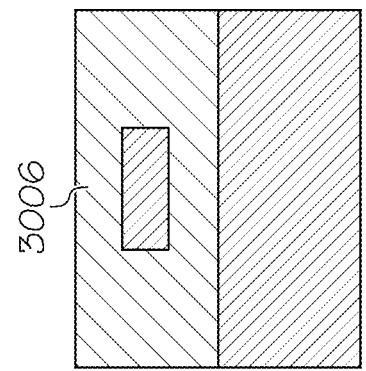

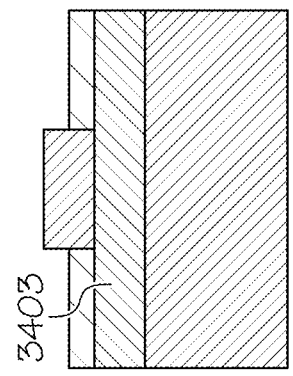
FIG. 34A
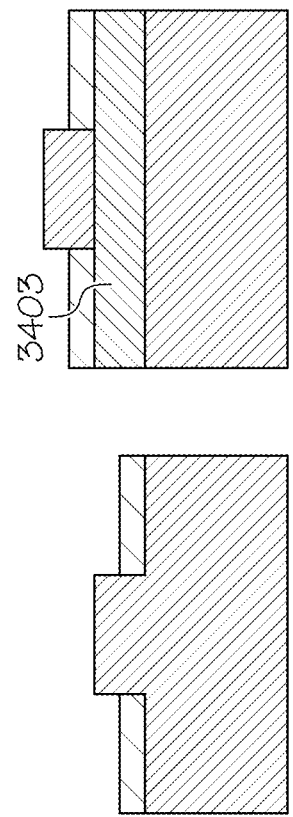
FIG. 34B
FIG. 34C
FIG. 34D
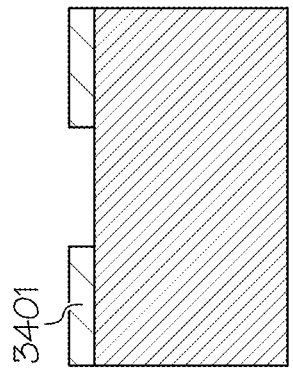
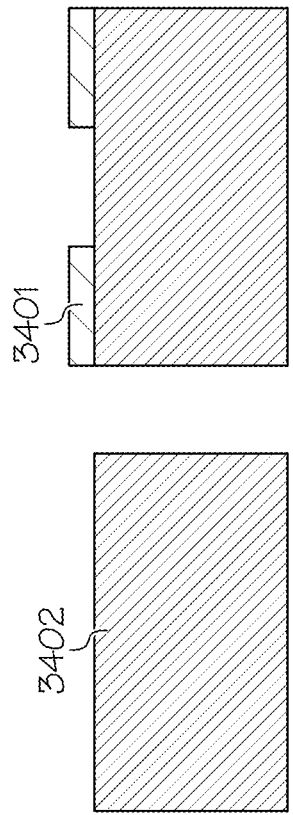
FIG. 34E
FIG. 34F
FIG. 34G

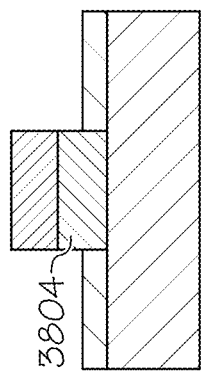
FIG. 38A
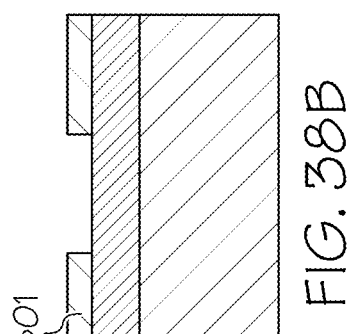
FIG. 38B
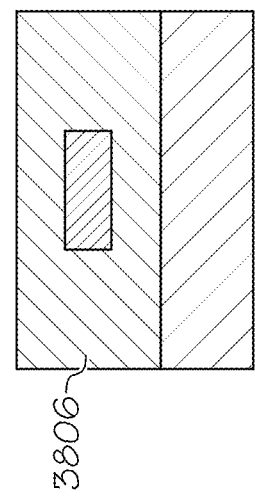
FIG. 38C
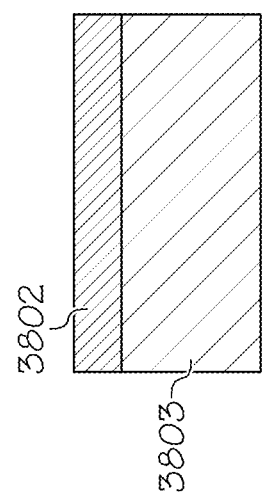
FIG. 38D
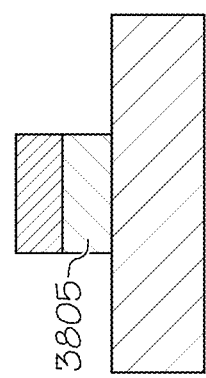
FIG. 38E
FIG. 38F

CATALYST INFLUENCED CHEMICAL ETCHING FOR FABRICATING THREE-DIMENSIONAL SRAM ARCHITECTURES

TECHNICAL FIELD

The present invention relates generally to Static Random-Access Memory (SRAM) architectures and photonic integrated circuits, and more particularly to utilizing catalyst influenced chemical etching for fabricating three-dimensional SRAM architectures and fabricating optical waveguides with low line edge roughness and sidewall roughness.

BACKGROUND

Catalyst Influenced Chemical Etching (CICE) is a catalyst-based etching method that can be used to fabricate features in semiconductors, such as silicon, germanium, etc., where such features have high aspect ratios, low sidewall taper, low sidewall roughness, and/or controllable porosity. This method is used to create higher density and higher performance Static Random-Access Memory (SRAM) as well as low-loss waveguides.

Static Random-Access Memory (SRAM) is a type of semiconductor Random-Access Memory (RAM) that uses bistable latching circuitry (flip-flop) to store each bit. SRAM exhibits data remanence, but it is still volatile in the conventional sense that data is eventually lost when the memory is not powered.

SRAM is commonly used in integrated circuits due to its fast access time, stability and compatibility with CMOS logic devices. It is an embedded memory designed to have performance benefits of having both the processor and memory on the same chip. SRAM arrays occupy a large fraction of the chip area in many circuit designs. There are many types of SRAM bit cells, the most commonly used being a six-transistor (6T) SRAM cell due to its superior robustness, low-power operations and high capacity. Other cell designs use four-transistors (4T), seven-transistors (7T), eight-transistors (8T), etc. depending on the performance and stability requirements. Higher SRAM density is achieved with the scaling of transistors, such as the shift to FinFET based SRAM designs. Although transistors have scaled to three-dimensions, such as with FinFETs and next-generation nanosheet transistors, the placement of SRAM transistors remains two-dimensional. Other memory devices, such as three-dimensional (3D) NAND Flash, utilize stacking of memory cells to increase memory density without increasing the footprint. As SRAM is embedded with logic, it is difficult to integrate 3D stacked SRAM cells in integrated circuits.

Furthermore, Photonic Integrated Circuits (PICs) are being developed in the semiconductor industry for optical interconnects. A PIC is a device that integrates multiple (at least two) photonic functions, and as such, is similar to an electronic integrated circuit. The major difference between the two is that a PIC provides functions for information signals imposed on optical wavelengths (e.g., 300 nm-1650 nm).

PICs can be used in various applications to improve speed of circuits and enable faster, higher performance classical and quantum computers. Optical waveguides can enable faster interconnects in silicon chips. Interposers and across-die-chips can be connected using optical interconnects instead of classical metal-based interconnects. However, these waveguides need to be integrated with existing circuitry. An important consideration is the transmission loss during operation, which is affected by imperfections during the fabrication process.

Photon-based quantum computing when integrated with PICs, single photon sources and detectors can enable large scale quantum circuits with the potential of scale up using mature CMOS technology. However, certain challenges arise in the miniaturization of photonic quantum circuits due to extremely low defect tolerance during fabrication of these quantum circuit elements.

Integration with other elements of photonic circuits and losses during transmission of photons in PICs affect yield and are a barrier to deployment in industry.

SUMMARY

In one embodiment of the present invention, a method for making multilayer nanostructures comprises providing a semiconducting material comprising five or more layers. The method further comprises patterning a catalyst layer on a surface of the semiconducting material. The method additionally comprises exposing the patterned catalyst layer to an etchant, where the patterned catalyst layer and the etchant cause etching of the semiconducting material to form vertical nanostructures, and where the vertical nanostructures comprise five or more layers and have at least one lateral dimension that is less than 10 nm. Furthermore, the method comprises selectively processing one or more of the five or more layers of the vertical nanostructures to either change its chemical composition or remove it.

In another embodiment of the present invention, a three-dimensional (3D) SRAM device comprises one or more nanosheet FETs along a vertical direction of a fin, where a wall angle of the fin is greater than 89.5 degrees, and where the one or more nanosheet FETs are created using two or more layers of material different in at least one of the following: material, morphology, porosity, etch rates, thermal processing rates, doping concentration and dopant material. Furthermore, the one or more nanosheet FETs are separated by a material with a different composition than that of the fin or are separated by air.

In a further embodiment of the present invention, a three-dimensional (3D) SRAM device comprises one or more fin field-effect transistors (FinFETs) along a vertical direction of a fin, where a wall angle of the fin is greater than 89.5 degrees, and where the one or more FinFETs are created using two or more layers of a material different in at least one of the following: material, morphology, porosity, etch rates, thermal processing rates, doping concentration and dopant material. Furthermore, the one or more FinFETs are separated by a material with a different composition than that of the fin or are separated by air.

The foregoing has outlined rather generally the features and technical advantages of one or more embodiments of the present invention in order that the detailed description of the present invention that follows may be better understood. Additional features and advantages of the present invention will be described hereinafter which may form the subject of the claims of the present invention.

BRIEF DESCRIPTION OF THE DRAWINGS

A better understanding of the present invention can be obtained when the following detailed description is considered in conjunction with the following drawings, in which:

FIGS. 8A-8G and 9A-9G depict cross-sectional views of two alternate staircase fin-geometries for fabricating nanosheet multi-FETs using the steps described in FIG. 7 in accordance with an embodiment of the present invention;

FIGS. 20A-20E depict the cross-sectional views for patterning of superconducting material without surface damage using the steps described in FIG. 19 in accordance with an embodiment of the present invention;

FIGS. 22A-22G depict the cross-sectional views for patterning of superconducting material without surface damage using the steps described in FIG. 21 in accordance with an embodiment of the present invention;

FIGS. 24A-24E depict the cross-sectional views for creating waveguides with CICE using the steps described in FIG. 23 in accordance with an embodiment of the present invention;

FIGS. 28A-28H depict the cross-sectional views for creating waveguides with CICE using the steps described in FIG. 27 in accordance with an embodiment of the present invention.

FIGS. 30A-30E depict the cross-sectional views for creating waveguides with CICE using the steps described in FIG. 29 in accordance with an embodiment of the present invention;

FIGS. 34A-34G depict the cross-sectional views for creating waveguides using bulk silicon wafers with CICE using the steps described in FIG. 33 in accordance with an embodiment of the present invention;

FIGS. 38A-38F depict the cross-sectional views for creating waveguides using silicon wafers with CICE using the steps described in FIG. 37 in accordance with an embodiment of the present invention;

DETAILED DESCRIPTION

Figure 1:
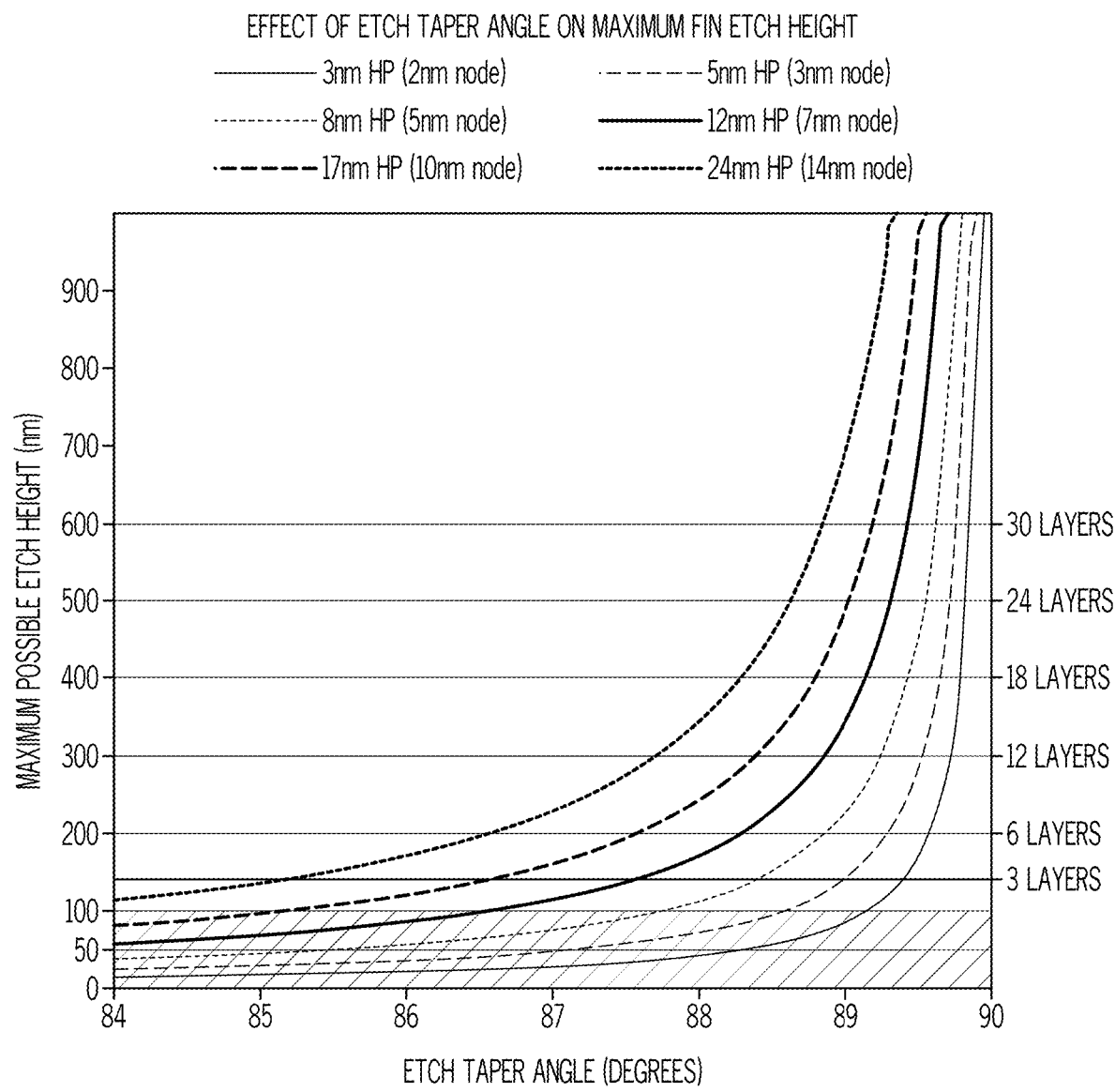
FIG. 1 illustrates the maximum number of nanosheet layers due to different etch taper angles in accordance with an embodiment of the present invention.

As stated in the Background section, Catalyst Influenced Chemical Etching (CICE) is a catalyst based etching method that can be used on semiconductor substrates, such as silicon (Si), germanium (Ge), silicon-germanium alloy ($Si_xGe_{1-x}$), gallium nitride (GaN), indium phosphide (InP), gallium arsenide (GaAs), indium arsenide (InAs), gallium phosphide (GaP), indium gallium arsenide (InGaAs), indium gallium phosphide (InGaP), silicon carbide (SiC), silicon-germanium (SiGe), Group IV element, Group III-V compounds, Group II-V compounds, etc. as well as multilayers of the semiconductors. Substrates for CICE include any of the following: a single crystal bulk silicon wafer, a silicon-on-insulator wafer, a silicon on sapphire wafer, germanium wafers, doped silicon wafers, etc. Additionally, the substrate can include a layer of semiconductor material, such as a layer of polysilicon of thickness greater than 100 nm deposited on a substrate, a layer of amorphous silicon of thickness greater than 100 nm deposited on a substrate and a layer of epitaxial silicon of thickness greater than 100 nm on a substrate. In one embodiment, the substrate can include a material stack that consists of alternating layers of silicon of different doping types and/or concentrations, alternating layers of silicon, silicon-germanium alloy ($Si_xGe_{1-x}$) and/or germanium, etc. In one embodiment, the thickness of each layer of the alternating layers is between 1 nm and 500 nm.

CICE is used to etch highly anisotropic semiconductor nanostructures with a sidewall taper >89.5 degrees (where 90 degrees is completely a vertical structures), where the resulting structure has at least one lateral dimension that is less than 100 nm and an aspect ratio of height of features to minimum lateral dimension that is at least 5:1. In one embodiment, the feature size in at least one dimension in the nanostructure geometry is less than 200 nm, and the aspect ratio is greater than 10:1. In one embodiment, the aspect ratio is greater than 50:1. In one embodiment, the wall angle is measured by measuring the critical feature dimension at the top and bottom of the nanostructures, for instance, the top of the nanostructure cross-section measures 50 nm, and the bottom measures 50.5 nm. In one embodiment, the cross-section measurements are performed using metrology techniques, such as scanning electron microscopy (SEM), atomic force microscopy (AFM), transmission electron microscopy (TEM), optical scatterometry, etc.

CICE uses a catalyst to etch semiconducting substrates, and it has been used to fabricate high aspect ratio features with patterning techniques, such as photolithography, electron beam lithography, nanosphere lithography, block co-polymers, laser interference lithography, colloidal lithography, double patterning, quad patterning, nanoimprint lithography and anodized aluminum oxide (AAO) templates to pattern the catalyst. The catalyst can be used in conjunction with etch-retarding materials, such as carbon, chromium (Cr), etc. This setup is immersed in a solution containing an etchant (e.g., fluoride species, such as hydrofluoric acid (HF), ammonium fluoride ($NH_4F$), buffered HF, and/or sulfuric acid ($H_2SO_4$), $H_2O$, etc. and an oxidant, such as hydrogen peroxide ($H_2O_2$), vanadium oxide ($V_2O_5$), potassium permanganate ($KMnO_4$), dissolved oxygen, etc.). Other chemicals, such as alcohols (e.g., ethanol, isopropyl alcohol, ethylene glycol, etc.), materials to regulate etch uniformity (e.g., surfactants, soluble polymers, dimethyl sulfoxide (DMSO), etc.), solvents (e.g., deionized (DI) water, DMSO, etc.), and buffer solutions can also be included in the etch composition. The chemicals used depend on the semiconducting substrate to be etched. Non-aqueous etchants can also be used if needed. An embodiment of such an etchant for silicon substrates comprises DI $H_2O$, $H_2O_2$, ethanol and HF. Embodiments of catalyst materials include ruthenium (Ru), iridium (Ir), silver (Ag), gold (Au), nickel (Ni), palladium (Pd), platinum (Pt), copper (Cu), tungsten (W), ruthenium(IV) oxide ($RuO_2$), iridium(IV) oxide ($IrO_2$), titanium nitride (TiN), graphene and carbon.

In one embodiment, the resulting substrate with the catalyst mesh is placed in an etchant solution and etched precisely to a certain depth actively controlled by electrical fields, temperature gradients and optical imaging systems that can determine the etch depth in situ. After CICE, the catalyst is removed using atomic layer etching, chemical or plasma etching, such as with aqua regia, chlorine-based plasmas, etc.

In one embodiment, the mechanism for the CICE process may involve the reduction of the oxidant by a catalyst thereby creating positively charged holes h+. These holes are then injected through the metal to the metal-semiconductor interface thereby oxidizing the semiconductor underneath the metal. The oxidized silicon is dissolved by the fluoride component of the etchant that diffuses from the sides of and through the catalyst and the soluble products diffuse away. The etch rate and resulting porosity of this process depends on dopant type, concentration, catalyst film thickness and etchant concentrations. Both electric and magnetic fields have been used to achieve greater uniformity/control of porosity due to diffusion of holes during the etch process.

In one embodiment, deposition of the catalyst material is accomplished using one of the following: chemical vapor deposition (CVD), atomic layer deposition (ALD), physical vapor deposition, thermal evaporation, electron beam evaporation, electrodeposition, selective atomic layer deposition, etc.

Precursors for atomic layer deposition (ALD) are listed in Table 1 shown below:

TABLE 1

| Catalyst Material | Precursors A | Gas B | ALD Chemistry |
|---|---|---|---|
| Platinum | Trimethyl(methylcyclo-pentadienyl) platinum(IV) | Oxygen | Plasma-enhanced, Thermal - combustion chemistry |
| Palladium | Pd(hfac)2 | Formalin, $H_2$ | Thermal - hydrogen reduction chemistry |
| Gold | trimethylphosphinotrimethylgold(III) | Oxygen | Plasma |
| TiN | Tetrakis(diethylamido) titanium(IV), Tetrakis(dimethylamido) titanium(IV), Titanium tetrachloride, Titanium(IV) isopropoxide | $NH_3$ | Plasma-enhanced, Thermal |
| TaN | Tris(diethylamido)(tert-butylamido) tantalum(V) | Hydrogen, $NH_3$ | Plasma-enhanced, Thermal |
| Ru | Bis(ethylcyclopentadienyl) ruthenium(II) | $NH_3$, $O_2$ | Plasma, Thermal - combustion chemistry |
| Ir | Ir(acac)3 | $O_2$ | Thermal - combustion chemistry |
| Ag | Ag(fod)(PEt3) | Hydrogen | Plasma-enhanced |
| Cu | (Cu(thd)2); Copper beta-diketonate: Cu(II) 1,1,1,5,5,5-hexafluoroacetylacetonate (Cu(hfac)2) | Methanol, ethanol, formalin | Thermal - hydrogen reduction chemistry |
| Co | Co(MeCp)2 Bis(N-tert butyl, N'-ethylpropionamidinato) cobalt (II) | $H_2$ or $NH_3$ $H_2O$ | Plasma-enhanced Thermal |
| W | Bis(tert-butylamido) bis(dimethylamino) tungsten(VI), WF6 | $Si_2H_6$ | Thermal - fluorosilane elimination chemistry |

In one embodiment, the deposited catalysts need to be patterned using plasma etching, wet etching, vapor etching, lift-off, deposition with a metal break, atomic layer etching, etc.

In one embodiment, Ru is used as a catalyst for catalyst influenced chemical etching (CICE).

In one embodiment, Ru can be deposited using atomic layer deposition with (a) Bis(ethylcyclopentadienyl) ruthenium(II) and $O_2$, $NH_3$, etc. as possible coreactants (b) (ethylbenzyl) (1-ethyl-1,4-cyclohexadienyl) Ru(0) precursors and $O_2$ as a possible coreactant, (c) thermal $RuO_4$ (ToRuS)/$H_2$, etc. Ru can also be selectively deposited in desired areas using selective ALD, with a patterned ALD-suppressing material and/or ALD-enhancing material depending on the precursors used. In one embodiment, the ALD-suppressing material is $SiO_2$ and the ALD-enhancing material is titanium (Ti). In another embodiment, the ALD-suppressing material is Si—H and the ALD-enhancing material is $SiO_2$.

In one embodiment, the deposited Ru can be patterned and etched using ozone, plasma $O_2$, $O_2/Cl_2$ chemistries, with etch masks, such as photoresist, polymer, imprint resist, silicon oxide, silicon nitride, etc. Ru can also be etched using atomic layer etching with similar gas chemistries as for plasma etching. Ru can also be wet etched using a sodium hypochlorite mixture.

After CICE with Ru, the metal can be removed using ozone, plasma $O_2$, $O_2/Cl_2$ chemistries, or wet or vapor chemistries with CMOS-compatible hypochlorite solutions A discussion regarding this aspect is provided in U.S. Patent Application Publication No. 2018/060176, Sreenivasan et al., "Catalyst Influenced Pattern Transfer Technology," which is hereby incorporated by reference herein in its entirety.

In one embodiment, the catalyst is designed for prevention of collapse such that all fins are connected using lithographic links. To further prevent wandering of the catalyst, connected links are made with lithographic links connecting all the catalyst regions while ensuring that all the fins are connected to prevent collapse. In one embodiment, a method for preventing substantial collapse of high aspect ratio semiconducting structures by catalyst influenced chemical etching includes patterning a catalyst layer on a surface of a semiconducting material, where the catalyst layer includes an intended design and lithographic links. Furthermore, the lithographic links substantially connect one or more isolated features of the semiconducting material. The method further includes exposing the patterned catalyst layer on the surface of the semiconducting material to an etchant, where the patterned catalyst layer causes etching of the semiconducting material to form interconnected high aspect ratio structures.

In one embodiment, for creating porous silicon during CICE, a modulated electric field is used. Modulation in parameters, such as current density and illumination density with time, can create porosity in silicon. The current density can be modulated, such that, for a p-type silicon substrate, a positive current density causes porosity as the catalyst sinks into the silicon, and a zero or negative current density gives crystalline layers with only the catalyst etch. Alternatively, the etchant concentration can be modified to have higher ratio of oxidant to create porosity. In another embodiment, an epitaxial layer with higher doping of silicon is used to create porosity.

Alternating layers of porous and non-porous silicon can be made using silicon superlattice etching (SiSE). SiSE uses the catalyst to etch a semiconducting substrate while simultaneously creating a superlattice with alternating layers where at least one of the layers is porous. The alternating layers are formed by electric field parameter modulation and/or etching through layers with alternating doping characteristics. Alternatively, the etchant concentration can be alternated to create porosity (higher oxidant ratio) and low/non-porous silicon layers (lower oxidant ratio).

In one embodiment, nanostructures with alternating layers of material are fabricated using SiSE. The alternating layers may include alternating layers of silicon, silicon-germanium alloy ($Si_xGe_{1-x}$) and/or germanium. In one embodiment, the thickness of each layer of the alternating layers is between 1 nm and 500 nm.

In one embodiment, vertical multilayer nanostructures are formed by SiSE, and one or more layers can be modified based on device and design requirements. In one embodiment, the multilayer nanostructures include alternating layers, where the layers are different in at least one of the following: material, morphology, porosity, etch rates, thermal processing rates, doping concentration and dopant material. In one embodiment, the alternating layers are silicon and silicon-germanium alloys. In another embodiment, the alternating layers are porous and non-porous silicon. In another embodiment, the alternating layers are porous silicon with alternating porosities. In one embodiment, the morphology is used to describe whether the layers are porous or non-porous, the pore sizes, pore orientations, etc. The thermal processing rate describes the temperature for a process, such as oxidation, annealing, creating of silicides, etc.

In one embodiment, one or more layers of the multilayer nanostructures are selectively processed to change its chemical composition. In one embodiment, the chemical composition is selectively varied by oxidizing the structures such that the oxidation rate for one of the layers (e.g., porous silicon) is much greater than that of the other layers (e.g., silicon). In one embodiment, the oxidation rate of porous silicon is 5 times greater than that of non-porous silicon. In another embodiment, the chemical composition is changed by doping the porous silicon or creating a silicide by imbibing the porous silicon with metal and annealing it, without substantially affecting the non-porous silicon.

In another embodiment, one of the layers (e.g., SiGe alloy) is removed by selectively etching it (e.g., using hydrochloric acid or atomic layer etching) without substantially affecting the other layers (e.g., silicon). In another embodiment, porous silicon is selectively etched away without substantially etching the non-porous silicon in a gentle fluorine-containing chemical. This can be used to create suspended nanosheets or horizontal suspended nanowires made of the unetched (e.g., silicon) material. In one embodiment, these suspended nanosheets or nanowires are used to make transistors.

As stated in the Background section, SRAM is commonly used in integrated circuits due to its fast access time, stability and compatibility with CMOS logic devices. It is an embedded memory designed to have performance benefits of having both the processor and memory on the same chip. SRAM arrays occupy a large fraction of the chip area in many circuit designs. There are many types of SRAM bit cells, the most commonly used being a six-transistor (6T) SRAM cell due to its superior robustness, low-power operations and high capacity. Other cell designs use four-transistors (4T), seven-transistors (7T), eight-transistors (8T), etc. depending on the performance and stability requirements. Higher SRAM density is achieved with the scaling of transistors, such as the shift to FinFET based SRAM designs. Although transistors have scaled to three-dimensional, such as with FinFETs and next-generation nanosheet transistors, the placement of SRAM transistors remains two-dimensional. Other memory devices, such as three-dimensional (3D) NAND Flash, utilize stacking of memory cells to increase memory density without increasing the footprint. As SRAM is embedded with logic, it is difficult to integrate 3D stacked SRAM cells in integrated circuits.

There are various SRAM layouts used in industry, such as a 6T SRAM cell that consists of four n-type (NMOS) transistors (two pull-down (PD) and two pass-gate (PG) transistors) and two p-type (PMOS) pull-up (PU) transistors.

For FinFETs-based 6T-SRAM cells, each of the 6 transistors have 1 fin for high-density cell sizes; whereas, for high performance, nFETs have 2 fins and pFETs have 1 fin.

For lateral nanowire and nanosheet transistors on the other hand, the high-density cells can also be high performance as increasing the number of horizontal layers does not increase the footprint. Nanosheet FETs whose fin (or sheet) width is much lower than the fin length (thereby forming horizontal nanowires as opposed to horizontal nanosheets) are lateral nanowire FETs. In embodiments of the present invention, the design option of stacking different transistors on top of each other is added. Each transistor can have one or more layers of fins or nanosheets, and the different transistor sources, drains and gates are accessed using a staircase-type contact architecture. Additional transistors per SRAM cell can be added for 7T-, 8T-, 10T- etc. cell designs in the same manner as 6T SRAM.

The smallest SRAM bit-cell uses "7 nm-node" FinFETs and has an area of 0.026 $\mu m^2$. In one embodiment, the minimum metal half-pitch is 14 nm, contacted poly half-pitch is 24 nm, physical gate length is 18 nm, minimum fin width is 7 nm, fin minimum half-pitch is 14 nm, minimum contact hole or via pitch is 40 nm, contact/via critical dimension (CD) after etch is 14 nm and overlay is 3.5 nm. However, even with the 7 nm FinFET SRAM cells, the layout of the six transistors is planar. Although scaling to nanosheet fins for next generation SRAM will improve performance and reduce parasitic capacitances, it will not reduce the bit-cell size significantly compared to FinFETs.

However, even with the 7 nm FinFET SRAM cells, the layout of the six transistors is planar. Although scaling to nanosheet fins for next generation SRAM will improve performance and reduce parasitic capacitances, it will not reduce the bit-cell size significantly compared to FinFETs.

Vertical nanowire (NW) FETs, on the other hand, can reduce the bit-cell size and can also enable stacking of SRAM cells on top of each other to create 3D SRAMs. Complementary FETs (CFETs) comprised of nFETs stacked on top of pFETs can also reduce the bit-cell size. Fabrication of such stacked Gate-All-Around (GAA) FETs, however, is challenging due to multiple timed etch back steps that may have non-uniform thicknesses over a 12" wafer. Such non-uniformities propagate into variations in transistor properties, such as threshold voltage, thereby affecting device performance. Therefore, they require accurate control of the etch back dimensions for manufacturability.

Other types of 3D stacked SRAM designs use polycrystalline silicon or laser-induced crystallization which is lower quality, more expensive, and is not easily integrable with CMOS logic.

Some key constraints in logic cell designs, such as minimum patterning resolution and metal pitch, are shown below in Table 2, with dimensions from International Roadmap for Devices and Systems (IRDS) reports. As seen in Table 2, the contacts for transistor sources, drains and gates limit the area efficiency.

TABLE 2

| Metric<br>Logic "Node" (nm) | 2017<br>"10" | 2019<br>"7" | 2021<br>"5" | 2024<br>"3" | 2027<br>"2.1" | 2030<br>"1.5" | 2033<br>"1.0" |
| --- | --- | --- | --- | --- | --- | --- | --- |
| Logic device structure options | FinFET<br>FDSOI | FinFET<br>LGAA | LGAA<br>FinFET | LGAA<br>VGAA | LGAA<br>VGAA | VGAA<br>LGAA<br>3DVLSI | VGAA<br>LGAA<br>3DVLSI |
| Avg. cell width scaling factor | 1.0 | 0.9 | 0.9 | 0.9 | 0.9 | 0.9 | 0.9 |
| Min. metal half-pitch (nm) | 18 | 14 | 12 | 10.5 | 7 | 7 | 7 |
| Contacted poly half-pitch (nm) | 27 | 24 | 21 | 18 | 16 | 16 | 16 |
| Physical gate length for HP logic (nm) | 20 | 18 | 16 | 14 | 12 | 12 | 12 |
| Min. fin width or diameter (nm) | 8 | 7 | 7 | 7 | 6 | 6 | 6 |
| Fin min. half-pitch (nm) | 16 | 14 | 12 | 10.5 | 9 | 7 | 7 |
| Min. contact hole or via pitch (nm) | 51 | 40 | 34 | 30 | 20 | 20 | 20 |
| Contact/via CD after etch (nm) | 18 | 14 | 12 | 10.5 | 7 | 7 | 7 |
| Overlay (3 sigma) (nm) | 3.6 | 3.5 | 3.4 | 2.8 | 2.2 | 1.7 | 1.5 |

Embodiments of the present invention utilize a CMOS integrable stacked SRAM technology based on lateral nanowire and nanosheet FETs (e.g., Gate-All-Around (GAA) FETs). Some embodiments of the present invention that are based on 6T SRAM designs are discussed below. The metrics corresponding to the "7 nm" node are used in the designs, but they can be extended to smaller nodes as well.

Nanosheet FETs have horizontally stacked gate-all-around structures that can be a good replacement of FinFETs at the 5 nm technology node and beyond. They enable versatile designs and show higher performance and electrostatics than FinFETs for the same footprint. An exemplar nanosheet FET can be envisioned by replacement of the fin in a FinFET by stacked nanosheets with three layers of 5 nm sheet thickness and 10 nm vertical sheet-to-sheet spacing. Greater number of nanosheet layers can further improve the performance of the transistors. However, the maximum height of the fins and thereby the maximum number of nanosheet layers is limited by a non-zero etch taper during the pattern transfer step to etch the fins using plasma etching. With Catalyst Influenced Chemical Etching (CICE), semiconductor fins can be anisotropically etched with very low to no etch taper, smooth sidewalls, and no maximum height limitation, where the collapse of fins can be avoided by designing substantially non-free-standing nanostructures. Catalyst Influenced Chemical Etching (CICE) is a catalyst-based etching method that can be used to fabricate features in semiconductors. such as silicon, germanium, etc., where such features have high aspect ratios, low sidewall taper, low sidewall roughness, and/or controllable porosity.

In one embodiment, a method for making multilayer nanostructures comprises providing a semiconducting material comprising alternating layers, where the semiconducting material comprises alternating layers of silicon, silicon-germanium alloy ($Si_xGe_{1-x}$) and/or germanium, and where a thickness of each layer of the alternating layers is between 1 nm and 500 nm. In one embodiment, the semiconducting material comprises one or more of the following: germanium (Ge), gallium arsenide (GaAs), gallium nitride (GaN), silicon (Si), silicon carbide (SiC), silicon-germanium (SiGe), indium gallium arsenide (InGaAs), Group IV element, Group III-V compounds, and Group II-V compounds.

In one embodiment, the semiconducting material is a single crystal bulk silicon wafer or a silicon on insulator wafer. The method further comprises patterning a catalyst layer on a surface of the semiconducting material. The catalyst layer comprises one or more of the following: gold (Au), platinum (Pt), palladium (Pd), ruthenium (Ru), silver (Ag), copper (Cu), nickel (Ni), tungsten (W), titanium nitride (TiN), Chromium (Cr), graphene, and carbon. In one embodiment, lithographic links are patterned in the catalyst layer to have connecting lines that join substantially isolated nodes of the catalyst layer. The method additionally comprises exposing the patterned catalyst layer to an etchant, where the catalyst layer sinks into a semiconducting substrate in the presence of the etchant. The etchant comprises at least two of the following: fluoride species, oxidants, alcohols and solvents, where the fluoride species contains one of the following: hydrofluoric acid and ammonium fluoride, where the oxidants comprise one of the following: hydrogen peroxide, potassium permanganate and dissolved oxygen, where the alcohols comprise one of the following: ethanol, isopropyl alcohol, and ethylene glycol, and where the solvents comprise one of the following: deionized water and dimethyl sulfoxide. The patterned catalyst layer and the etchant cause etching of the semiconducting material to form vertical nanostructures, where the vertical nanostructures comprise more than one layer different in at least one of the following: material, morphology, porosity, etch rates, thermal processing rates, doping concentration and dopant material. Furthermore, the method comprises forming staircase-like structures in a portion of the vertical nanostructures, where the staircase-like structures are used to create contacts to sources, drains and gates of underlying nanosheet FETs. In one embodiment, the staircase structures are formed by etching the semiconducting material along a crystal plane using a crystallographic dependent etch with the etchant comprising one of the following: potassium hydroxide (KOH), tetra-methyl ammonium hydroxide (TMAH), ammonium hydroxide ($NH_4OH$), and ethylene di-amine (EDP). Additionally, the method comprises filling a second material in at least a portion of the vertical nanostructures. In addition, the method comprises selectively processing one of the alternating layers to either change its chemical composition or remove it. In one embodiment, the alternating layers comprise silicon-germanium alloy ($Si_xGe_{1-x}$) layers, where the silicon-germanium alloy ($Si_xGe_{1-x}$) layers are removed using hydrochloric acid to create silicon nanosheets and/or lateral nanowires. In another embodiment, the alternating layers comprise doped layers of silicon, where one of the doped layers of silicon becomes porous in the presence of the etchant, where the porous silicon layers are removed using one or more of the following: hydrofluoric acid (HF), HF vapor, HF and an oxidant. The method further comprises using a time-varying electric filed to produce the alternating layers, where at least one of the alternating layers is porous.

FIG. 1 illustrates how the etch taper angle defines the maximum number of nanosheet layers that can be stacked in a fin in accordance with an embodiment of the present invention. CICE has an etch taper angle >89.5 and thus enables stacking of as many transistors as desired, and also enables a new 3D stacked architecture for SRAM cells. A sidewall angle etch taper of 90 degrees provides a perfectly vertical sidewall fin. A discussion regarding nanosheet multi-FETs based SRAM layouts is provided below.

Separate contacts to the source, drain, and gates for the individual transistors in the nanosheet fin is required to individually address them. Thus, packing more nanosheet fins into the same area needs to account for the increased footprint of the contact vias. In logic designs with common contact-nodes (sources, drains or gates) between the transistors, the sources, drains, and/or gates may be connected in the same nanosheet multi-FET thereby decreasing the footprint of the contact vias. Contacts to the contact-nodes of the individual transistors in the multi-FET designs can be made using staircase-like structures to create contacts to the sources, drains and gates of the underlying transistors, such as FinFETs, lateral nanowire FETs and nanosheet FETs.

Figure 2A:
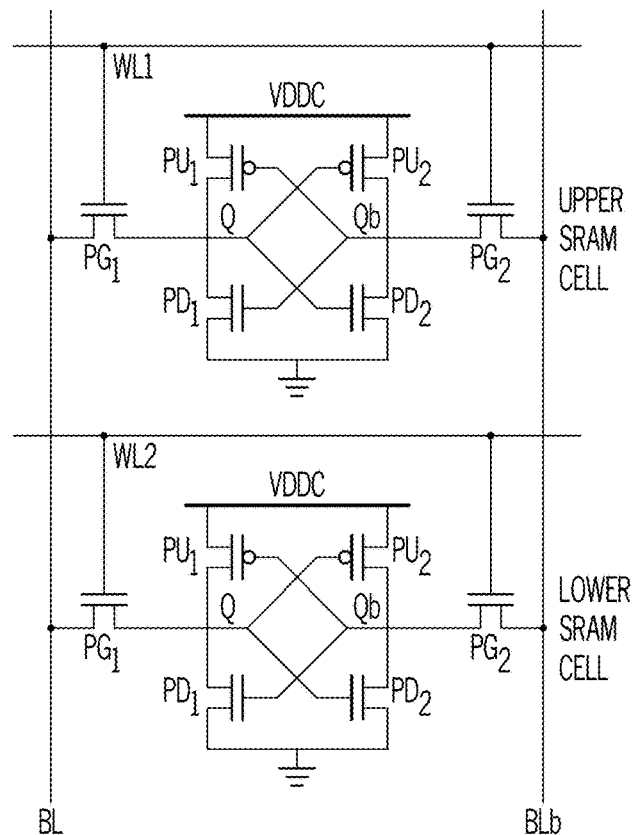
FIG. 2A illustrates SRAM circuit connections for a two layer "upper" and "lower" SRAM cell in accordance with an embodiment of the present invention.
Figure 2B:
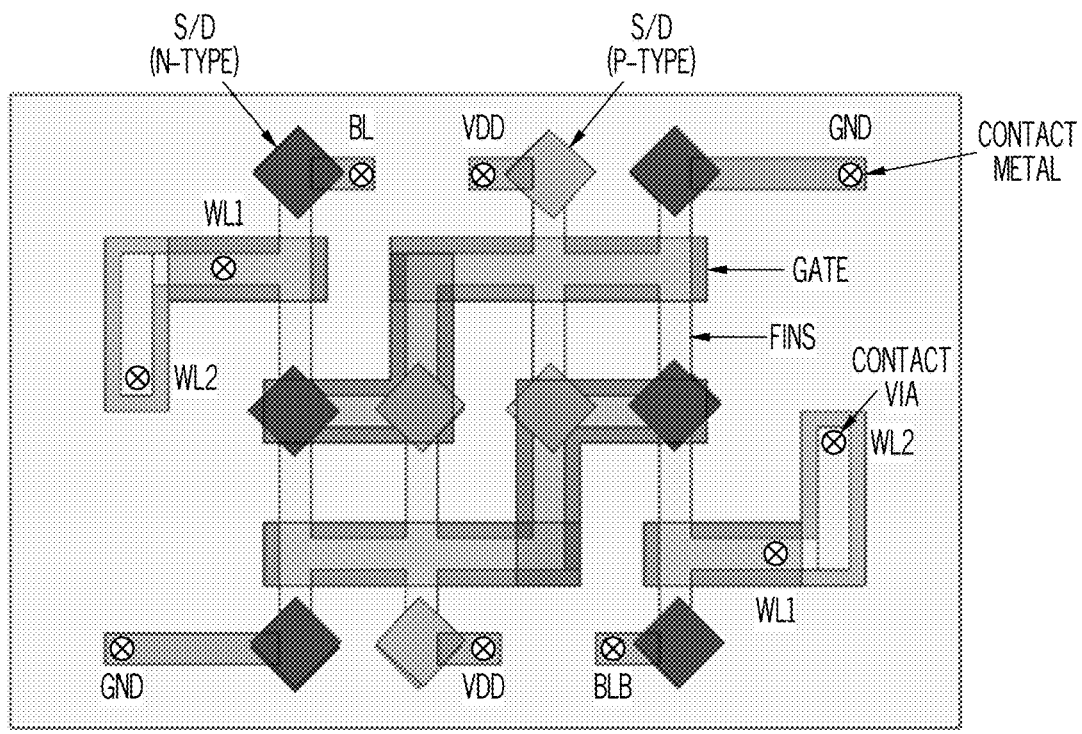
FIG. 2B shows a top-down SRAM 2-bit-cell layout showing the fins, gates, sources and drains and contact vias to the word-line (WL) and bit-lines (BL) for the upper and lower SRAM cells in accordance with an embodiment of the present invention.

FIGS. 2A-2I illustrate an exemplar layout of two SRAM cells stacked on top of each other, with connected fins to realize internal stacked SRAM bit-cell connections without the need for separate contacts to the lower SRAM transistors, in accordance with an embodiment of the present invention. Referring to FIG. 2A, FIG. 2A illustrates SRAM circuit connections for a two layer "upper" and "lower" SRAM cell, called an "SRAM 2-bit-cell," in accordance with an embodiment of the present invention. FIG. 2B shows a top-down SRAM 2-bit-cell layout showing the fins, gates, sources and drains and contact vias to the word-line (WL) and bit-lines (BL) for the upper and lower SRAM cells in accordance with an embodiment of the present invention. The two SRAM cells in this layout share common bit-lines and have separate word-lines.

Figure 2C:
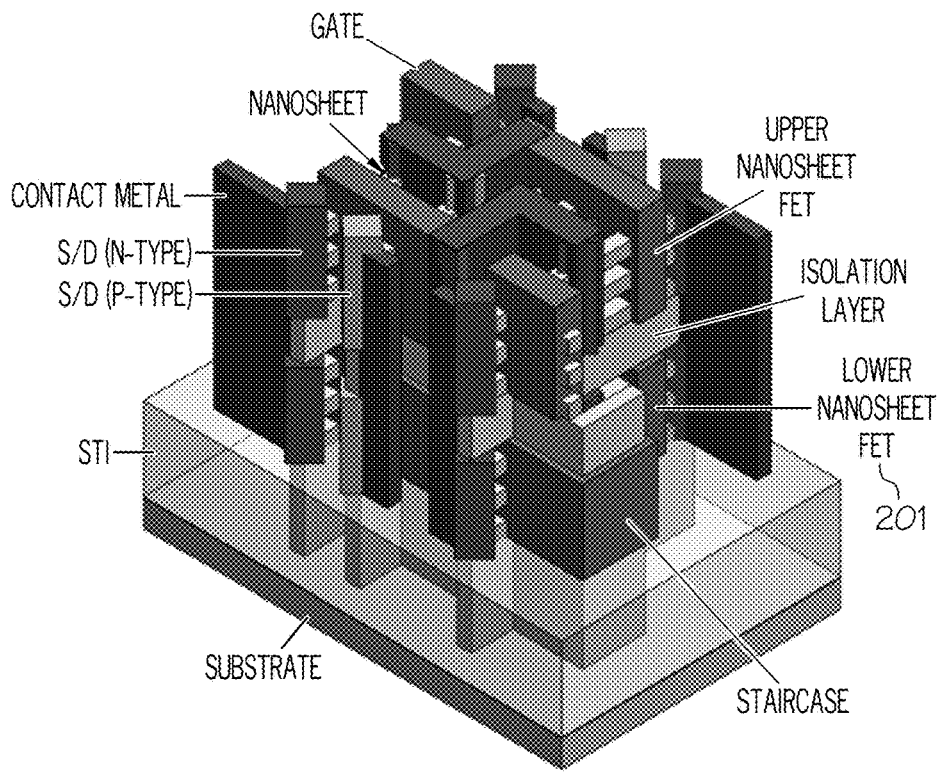
FIGS. 2C and 2D illustrate the SRAM 2-bit-cell with nanosheet FETs with three nanosheet layers underneath the gates in accordance with an embodiment of the present invention.
Figure 2D:
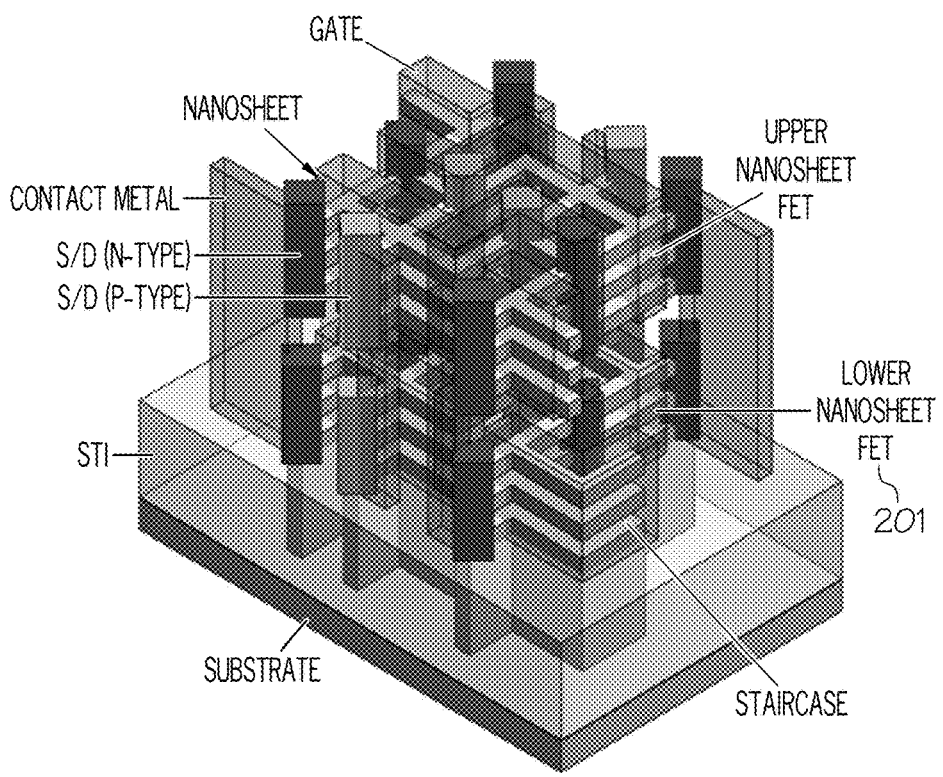
Figure 2E:
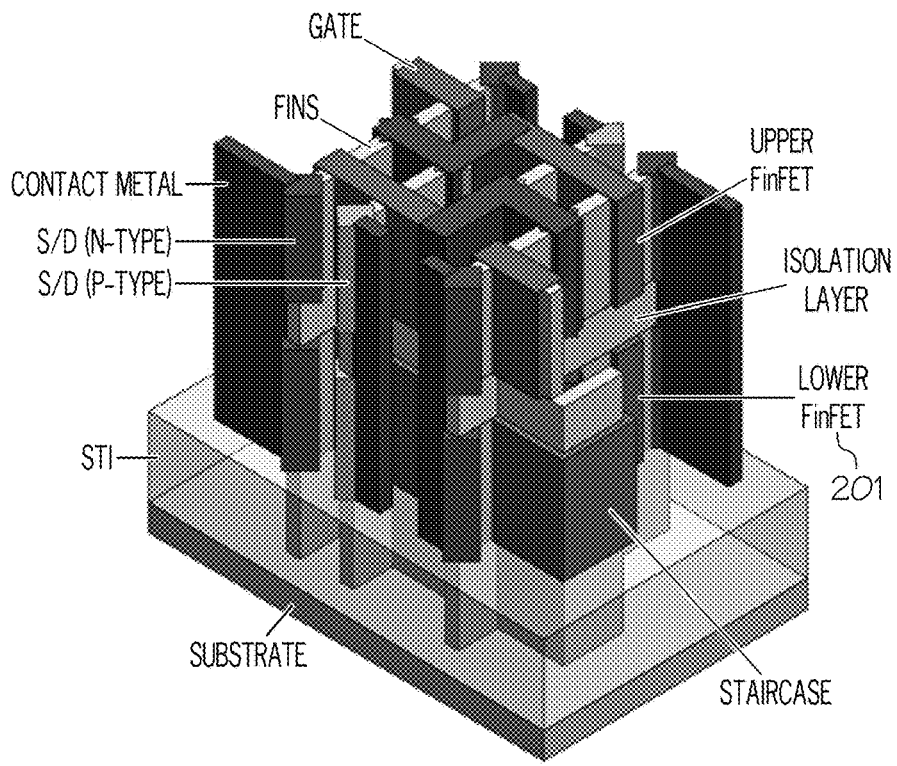
FIGS. 2E and 2F illustrate the SRAM 2-bit-cell with FinFETs with fins underneath the gates in accordance with an embodiment of the present invention.
Figure 2F:
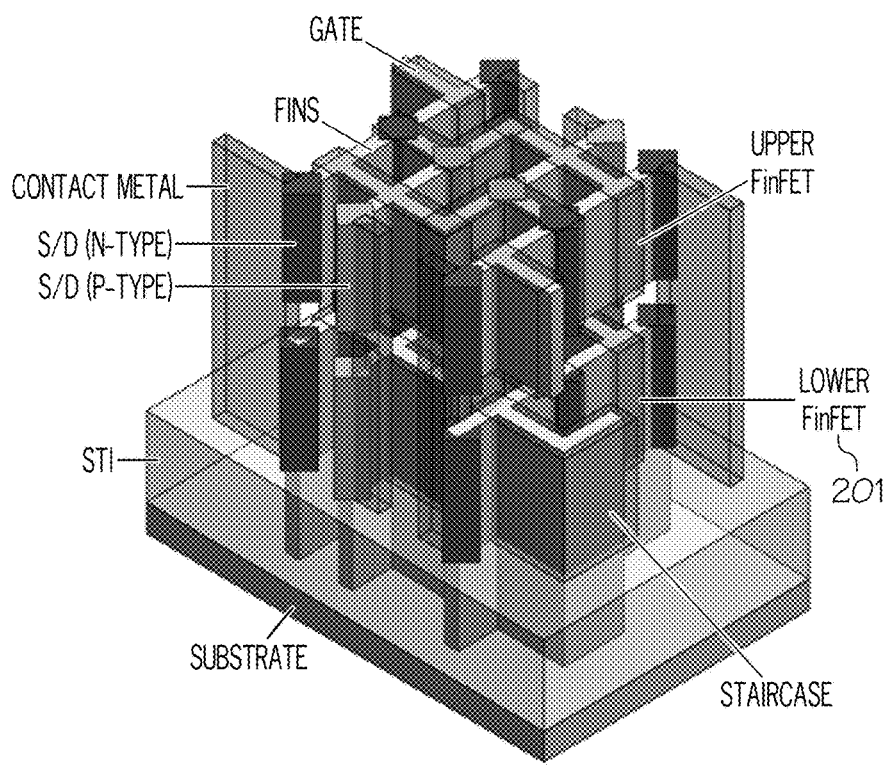

FIGS. 2C and 2D illustrate a three-dimensional view of the SRAM 2-bit-cell with every fin having two transistors stacked on top of each other in accordance with an embodiment of the present invention. FIGS. 2C and 2D further illustrate the SRAM 2-bit-cell with nanosheet FETs with three nanosheet layers underneath the gates in accordance with an embodiment of the present invention. In one embodiment, such a layer can be used for stacking FinFETs instead of nanosheet FETs. FIGS. 2E and 2F illustrate the SRAM 2-bit-cell with FinFETs with fins underneath the gates in accordance with an embodiment of the present invention. In one embodiment, the isolated layer is used to separate the stacked transistors along the vertical direction of a fin. In one embodiment, it comprises of a different composition than that of the fin, or air (see FIGS. 2D, 2F). Contact vias to address the word-lines for the lower SRAM bit-cell can be made using a staircase contact.

In one embodiment, staircase-like structures are used to crate contacts to sources, drains and gates of underlying FETs. Layouts of staircase connections are shown in FIGS. 2G-2I.

Figure 2G:
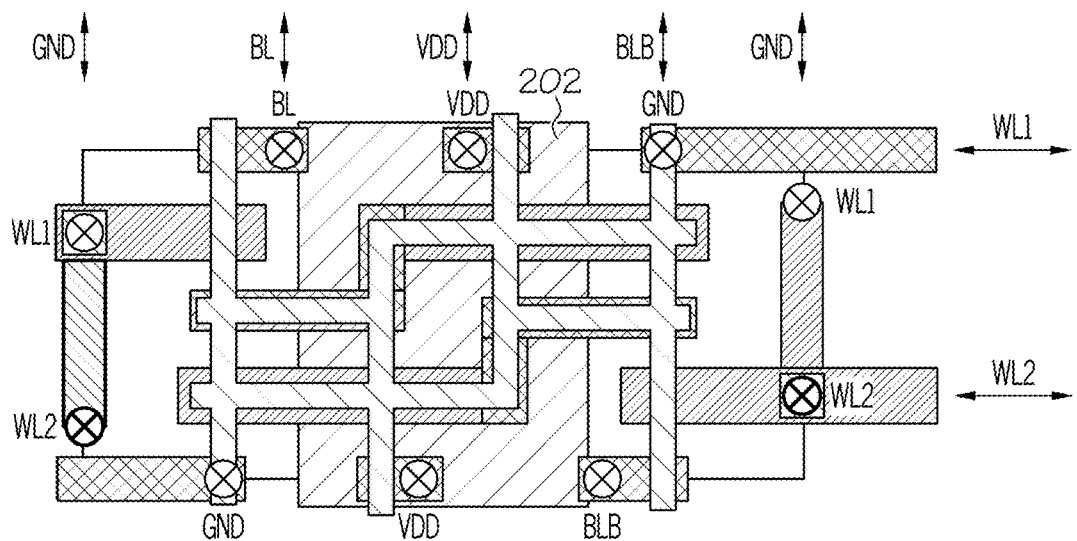
FIG. 2G illustrates an alternative layout of word lines (WLs) with a modified staircase connection for access to the lower transistor in accordance with an embodiment of the present invention.
Figure 2H:
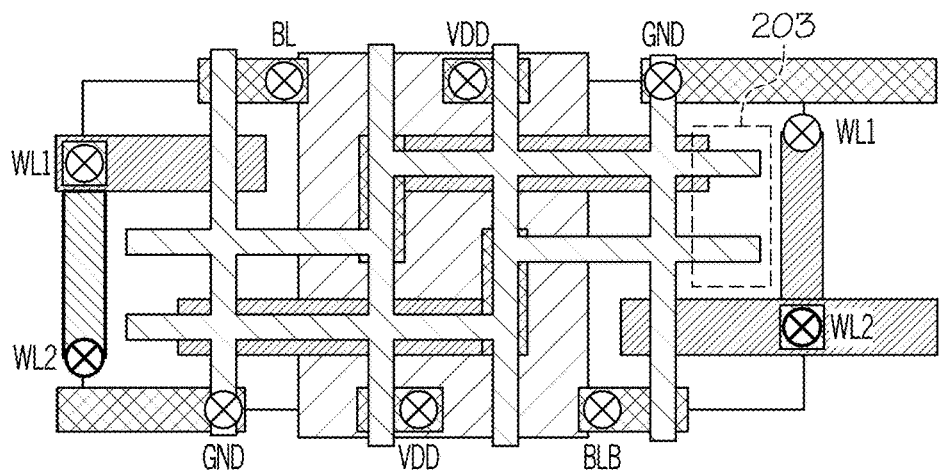
FIG. 2H illustrates the extended fins for the sub-layer access to the sub-layer transistors using staircase-like structures in accordance with an embodiment of the present invention.
Figure 2I:
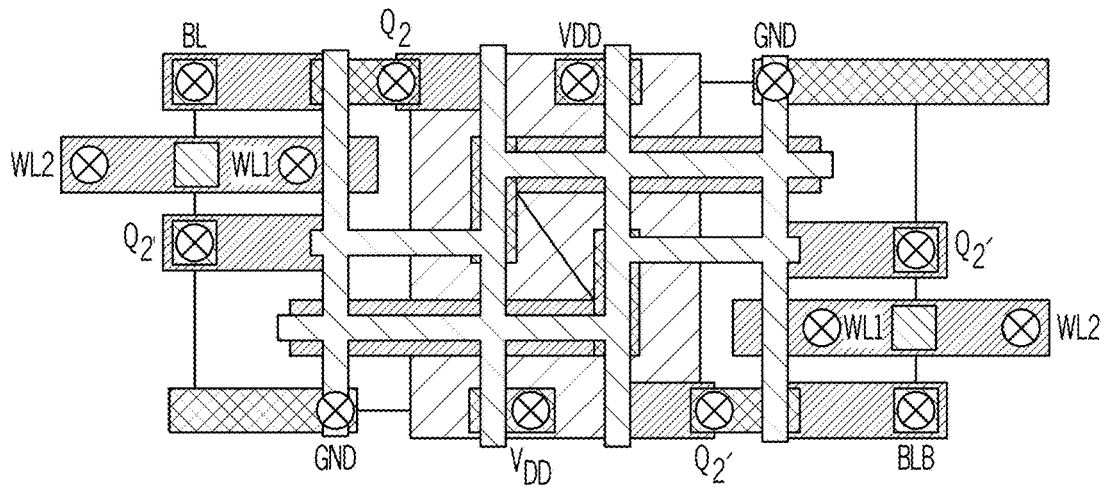
FIG. 2I illustrates an alternative layout with fins connected only in the gate regions in accordance with an embodiment of the present invention.

An alternative layout of SRAM 2-bitcell having contact-node connections with a modified staircase connection for access to the lower transistor 201 (FIGS. 2C, 2D, 2E, 2F) is also shown in FIG. 2G in accordance with an embodiment of the present invention. The SRAM layout also shows an n-well 202 having a different doping compared to the surrounding p-type silicon in accordance with an embodiment of the present invitation. FIG. 2H illustrates the extended fins for sub-layer access 203 to sub-layer transistors using staircase-like structures in accordance with an embodiment of the present invention. FIG. 2I illustrates an alternative layout with fins connected only in the gate regions in accordance with an embodiment of the present invention.

In one embodiment, the SRAM array layout is designed to create nanostructures with CICE with a catalyst comprising intended design and lithographic links to prevent substantial collapse of high aspect ratio semiconducting structures made by catalyst influenced chemical etching.

Figure 2K:
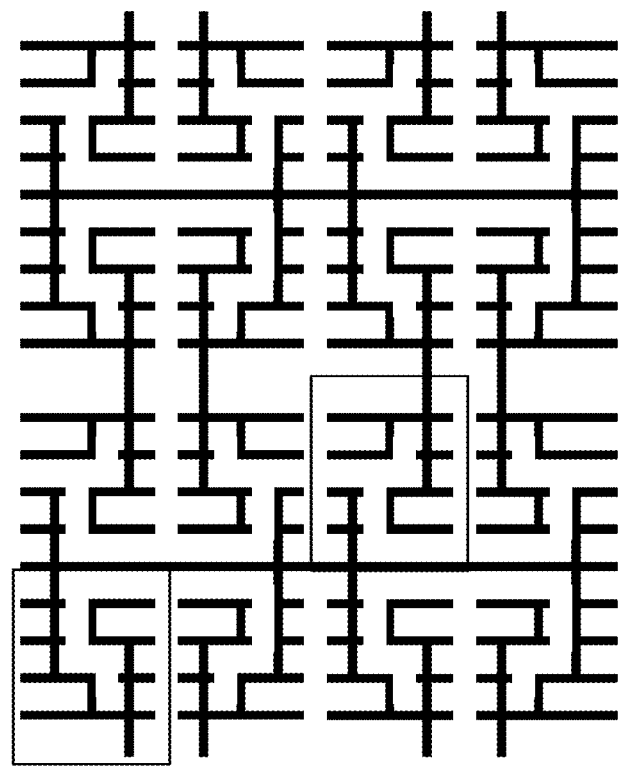
FIG. 2K illustrates an exemplar layout of many SRAM 2-bit-cells to create arrays of SRAM cells with lithographic link connections in accordance with an embodiment of the present invention.
Figure 2J:
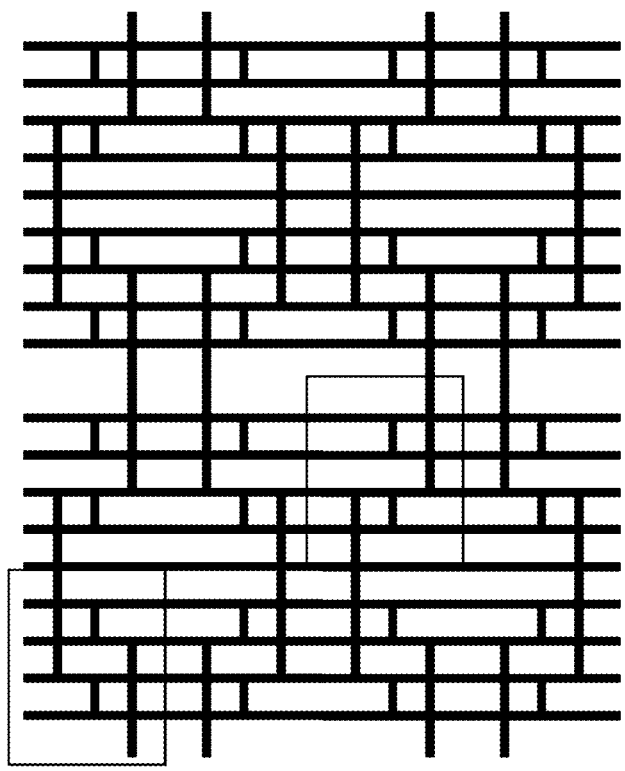
FIG. 2J illustrates an exemplar layout of many SRAM 2-bit-cells arranged to create an arrays of SRAM cells in accordance with an embodiment of the present invention.

FIG. 2J illustrates an exemplar layout of many SRAM 2-bit-cells arranged to create an arrays of SRAM cells in accordance with an embodiment of the present invention. FIG. 2K illustrates an exemplar layout of many SRAM 2-bit-cells to create arrays of SRAM cells with lithographic link connections in accordance with an embodiment of the present invention.

Similarly, more than two transistors can be stacked on top of each other per nanosheet fin to stack multiple SRAM cells on top of each other. Other embodiments include rearranged layouts with common metal contacts to decrease the footprint of the metal vias. In one embodiment, one of the parameters to be optimized in the layout is the placement of metal contacts in adherence to the lithography and parasitic capacitance limitations of the contact vias. In one embodiment, fins with 6 transistors each are used to stack 6 SRAM cells such that there is at least a 20% decrease in area footprint compared to two-dimensional (2D) SRAM layouts.

Other embodiments include using lateral nanowire FETs or FinFETs or a combination of FinFETs and nanosheet FETs to create the multiple layers of SRAM cells in three-dimensions. In one embodiment, a topology optimization algorithm can be used to optimize common contact-node connections in the SRAM transistor layouts to decrease the footprint of the SRAM cells while increasing the number of stacks without increasing footprint of contact vias required for the lower layer transistor gates, sources and drains. In another embodiment, the multiple layers of SRAM cells are arranged in a manner similar to 3D NAND Flash architectures with staircase connections to the lower SRAM layers fanned-out towards the ends of the entire SRAM array on an integrated circuit.

Other logic transistors adjacent to the SRAM cells can also be multi-level to reduce footprint, or they may utilize all the nanosheet layers per fin. For example, fins with 6 nanosheet layers may have one logic transistor in the non-SRAM regions of the die and two multi-transistors in the SRAM region.

Multi-FETs, as discussed herein, refer to transistors with two or more transistors stacked vertically, along the vertical direction of a fin, on top of each other. The transistors can be FinFETs, nanosheet FETs, lateral NW FETs and other Gate-All-Around (GAA) FETs.

In one embodiment, the upper and lower FETs consist of a single thick nanosheet layer akin to the height of FinFETs. In another embodiment, two FETs are realized in one nanosheet fin, with the lower FET and the upper FET each having three nanosheet layers in their GAA design.

The thickness of each layer for the FETs can be varied based on the design requirements, and an additional layer in between the FETs may be used to facilitate electrical isolation between the FETs.

Figure 3:
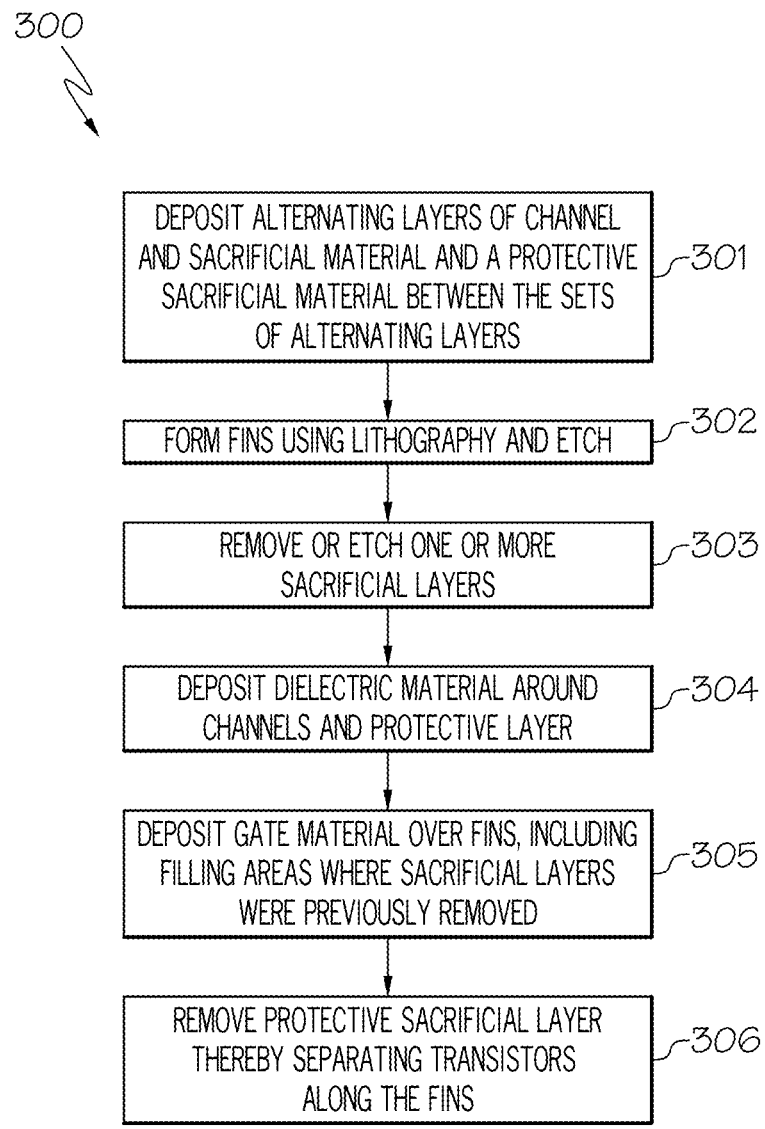
FIG. 3 is a flowchart of a method for fabricating nanosheet multi-FETs in accordance with an embodiment of the present invention.

Referring now to FIG. 3, FIG. 3 is a flowchart of a method 300 for fabricating nanosheet multi-FETs in accordance with an embodiment of the present invention. FIGS. 4A-4E depict the cross-sectional views for fabricating nanosheet multi-FETs using the steps described in FIG. 3 in accordance with an embodiment of the present invention.

Figure 4A:
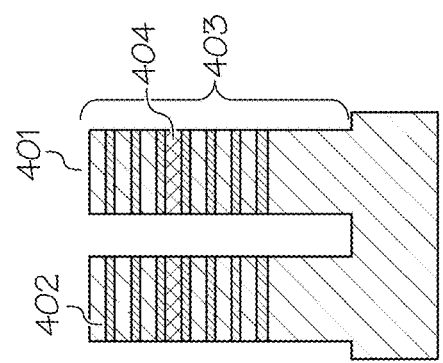
FIGS. 4A-4E depict the cross-sectional views for fabricating nanosheet multi-FETs using the steps described in FIG. 3 in accordance with an embodiment of the present invention.

Referring now to FIG. 3, in conjunction with FIGS. 4A-4E, in step 301, alternating layers of channel 401 and sacrificial material 402 are deposited, and a protective sacrificial material 404 is deposited between the sets of alternating layers, as shown in FIG. 4A.

In one embodiment, channel material 401 includes silicon, sacrificial material 402 includes $Si_xGe_{1-x}$, and the protective sacrificial material 404 includes Ge. In another embodiment, channel material 401 includes low doped silicon, sacrificial material 402 includes highly doped silicon, and protective sacrificial material 404 includes moderately doped silicon. In one embodiment, the materials are deposited using one or more of the following: epitaxial deposition, chemical vapor deposition, physical vapor deposition, and atomic layer deposition. In one embodiment, protective sacrificial layer 404 is used to create an isolation layer, where the isolated layer is used to separate the stacked transistors along the vertical direction of a fin. In one embodiment, it comprises of a different composition than that of the fin, or air.

The thickness of the alternating layers is defined by the design requirements of the transistors (e.g., nanosheet FETs, FinFETs, lateral nanowire FETs, multi-FETs), such as the transistor channel thickness and required fin width for maximizing surface area of gate-all-around transistors. This is limited by lithographic resolution, overlay limitations during lithographic patterning of the fins and resistance of contacts and gate material surrounding the fins and dielectric. In one embodiment, nanosheet FETs are made using CICE of alternating layers of 10 nm thick silicon and 10 nm thick silicon-germanium.

In step 302, fins 403 are formed using lithography and etch as shown in FIG. 4A. In one embodiment, the lithography is performed using one or more of the following: photolithography, extreme ultraviolet (EUV) lithography, imprint lithography, and electron-beam lithography. In one embodiment, the etch is performed using catalyst influenced chemical etching. In another embodiment, the etch is performed using plasma etching or atomic layer etching.

Figure 4B:
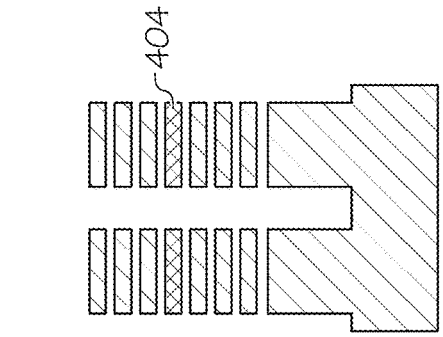

In step 303, one or more sacrificial layers 402 are removed or etched, leaving channel material layers 401 and protective sacrificial layer 404, as shown in FIG. 4B. In one embodiment, sacrificial layers 402 are removed using one or more of the following: phosphoric acid, hydrofluoric acid, hydrogen peroxide, hydrochloric acid, and sulphuric acid. In one embodiment, sacrificial layers 402 are etched using one of the following etch processes: wet etching, plasma etching, atomic layer etching, and vapor etching.

Figure 4C:
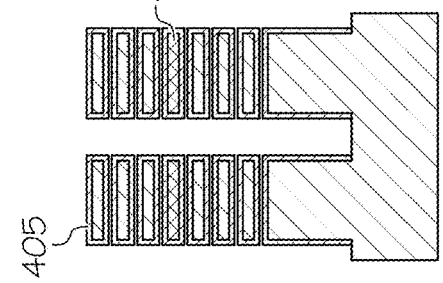

In step 304, dielectric material 405 is deposited around channels 401 and protective layer 404 as shown in FIG. 4C. Dielectric material 405 may include one of the following: silicon oxide, silicon oxynitride, aluminum silicon oxide, hafnium oxide, zirconium aluminum oxide, and strontium titanium oxide.

Figure 4D:
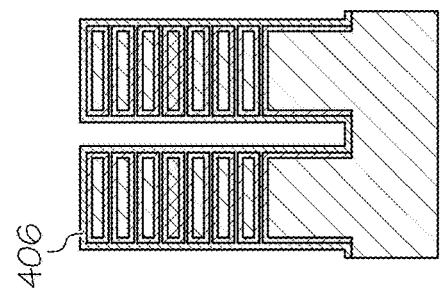

In step 305, gate material 406 is deposited over fins 403, including filling areas where sacrificial layers 402 were previously removed, as shown in FIG. 4D. Gate material 406 may include one of the following: polysilicon, tungsten, nickel, copper, ruthenium, cobalt, platinum, palladium, titanium, and titanium nitride.

Figure 4E:
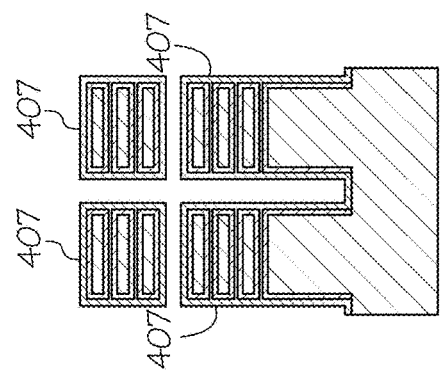

In step 306, protective sacrificial layer 404 is removed thereby separating transistors 407 along the fins 403 as shown in FIG. 4E.

Transistors 407 can be isolated by either removing a sacrificial layer as shown in FIG. 4E or by selectively depositing material such that there is no electrical connectivity between the transistors along the fin. Additionally, separate contacts to the source, drain and gates for the individual transistors in the nanosheet fin are required to individually address them. In one embodiment, a staircase structure can be used to drop contacts to the lower transistors.

In one embodiment, the base of the fins of the transistors is surrounded by a dielectric for shallow trench isolation. The dielectric may be silicon oxide, silicon oxynitride, low-k dielectrics, etc. The height of the fin includes the thickness required for the shallow trench isolation. In one embodiment, the height of the shallow trench isolation surrounding the base of the fins is 100 nm.

An alternative method for fabricating nanosheet multi-FETs is discussed below in connection with FIGS. 5 and 6A-6E. In such an alternative method, dielectric and gate material are deposited selectively on channel nanosheets (and not on a sacrificial layer) in between the nanosheet FETs. A fin with alternating nanosheet layers and having a staircase structure is shown in FIGS. 6A-6E. Each nanosheet stack includes two alternating layers A and B. Sacrificial material B is removed thereby releasing channel material A and suspending it between supporting structures (not shown in Figure). In one embodiment, selective atomic layer deposition is used to deposit high-k dielectric selectively (e.g., hafnium oxide, zirconium aluminum oxide, strontium titanium oxide) on the channel material and is used to deposit gate material (e.g., polysilicon, tungsten, nickel, copper, ruthenium, cobalt, platinum, palladium, titanium, titanium nitride, etc.) selectively on the high-k dielectric material. This ensures that the gates of the different transistors are not connected. A more detailed description of such a method is provided below in connection with FIGS. 5 and 6A-6E.

Figure 5:
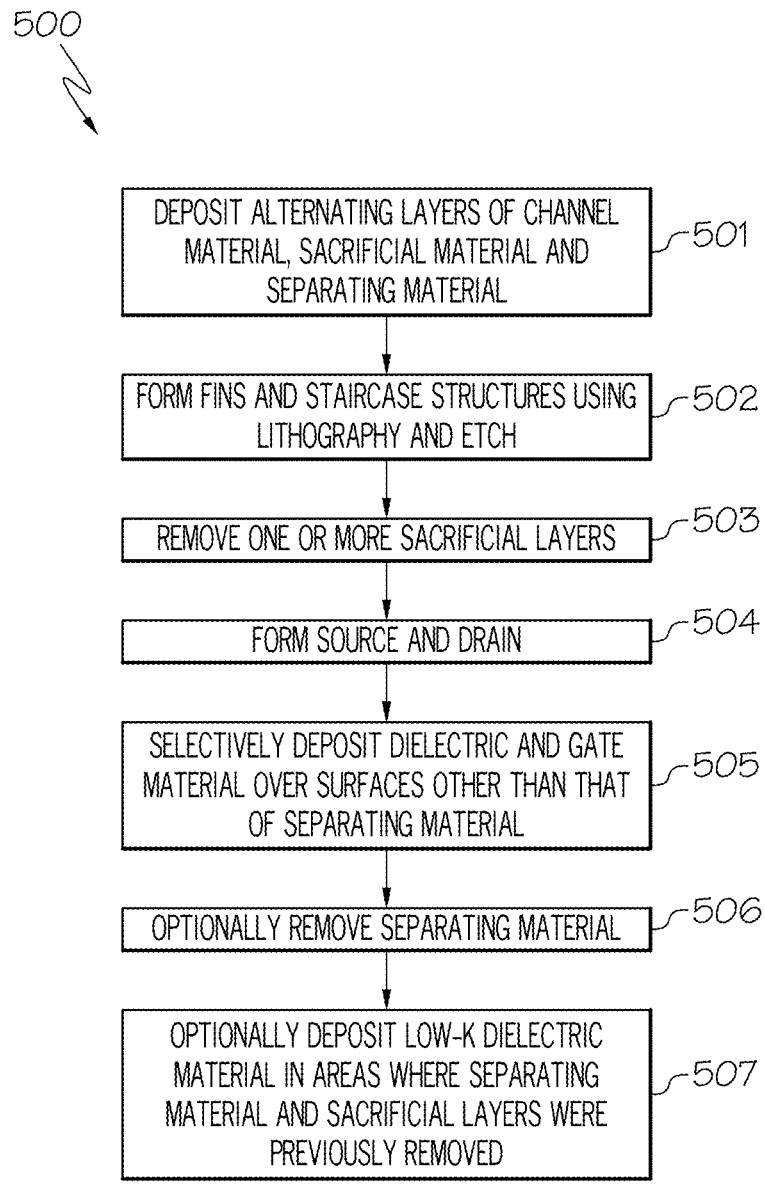
FIG. 5 is a flowchart of an alternative method for fabricating nanosheet multi-FETs in accordance with an embodiment of the present invention.

FIG. 5 is a flowchart of an alternative method 500 for fabricating nanosheet multi-FETs in accordance with an embodiment of the present invention. FIGS. 6A-6E depict the cross-sectional views for fabricating nanosheet multi-FETs using the steps described in FIG. 5 in accordance with an embodiment of the present invention.

Figure 6C:
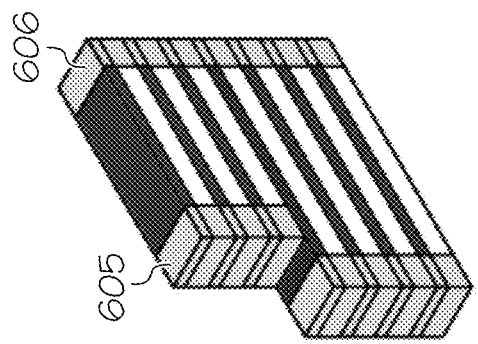
FIGS. 6A-6E depict the cross-sectional views for fabricating nanosheet multi-FETs using the steps described in FIG. 5 in accordance with an embodiment of the present invention.
Figure 6B:
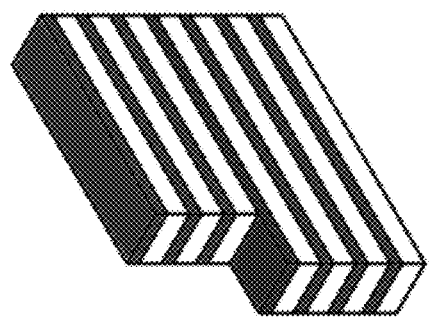
Figure 6E:
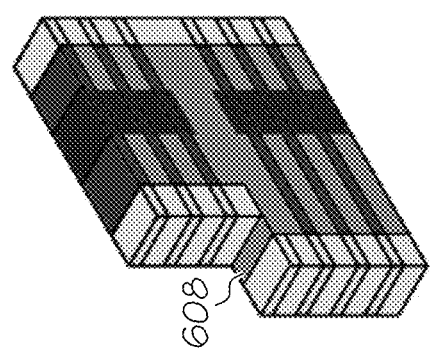
Figure 6D:
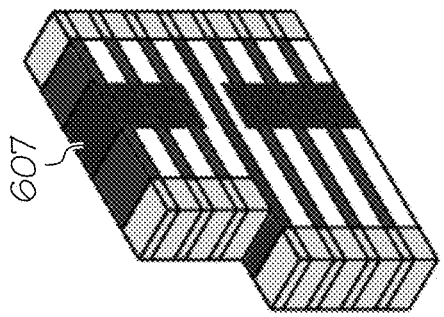
Figure 6A:
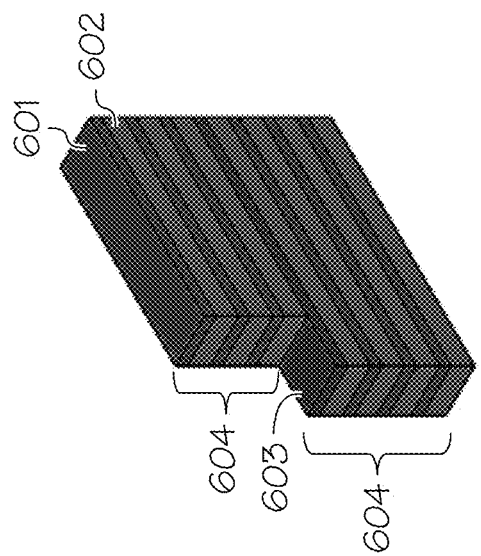

Referring to FIG. 5, in conjunction with FIGS. 6A-6E, in step 501, alternating layers of channel material 601, sacrificial material 602 and separating material 603 are deposited as shown in FIG. 6A. In one embodiment, channel material 601 includes silicon, sacrificial material 602 comprises $Si_xGe_{1-x}$, and separating material 603 includes Ge.

In step 502, fins and staircase structures 604 are formed using lithography and etch as shown in FIG. 6A.

In step 503, one or more sacrificial layers 602 are removed as shown in FIG. 6B, such as via a wet etch.

In step 504, source 605 and drain 606 are formed as shown in FIG. 6C. In one embodiment, the source and drain are formed by epitaxial deposition of silicon along with dopants, such as boron, phosphorous, germanium, arsenic, etc. In another embodiment, the source and drain are formed by deposition of metal with a device-specific work function, such as Ni, Mo, W, Pd, Pt, etc. An optional annealing step can convert them into metal silicides.

In step 505, dielectric and gate material 607 are selectively deposited over surfaces other than that of separating material 603 as shown in FIG. 6D. In one embodiment, selective atomic layer deposition is used to deposit dielectric and gate material 607 on channel material 601 (not on separating material layer 603).

In step 506, separating material 603 is optionally removed as shown in FIG. 6E.

In step 507, low-k dielectric material 608 (e.g., silicon oxide, silicon oxynitride, fluorine-doped silicon dioxide, etc.) is optionally deposited in areas where separating material 603 and sacrificial layers 602 were previously removed as shown in FIG. 6E.

Another method of isolating FETs without the need for selective atomic layer deposition is by blocking areas in between the FETs prior to deposition of material. This can be done by utilizing staircase structures and protecting a particular stack of alternating layers (e.g., SiGe/Si/SiGe nanosheet layers) in between the two FETs while removing all the other sacrificial layers (e.g., SiGe layers) similar to the typical nanosheet process flow, as shown in FIGS. 8A-8G and 9A-9G. Each nanosheet stack includes two alternating layers A (channel material) and B (sacrificial material). Certain layers of B between the transistors is protected during removal of the rest of the sacrificial layers of B and Gate-All-Around (GAA) deposition. These protected layers B are removed after GAA deposition to separate the gates. A more detailed description of such a method is provided below in connection with FIGS. 7, 8A-8G and 9A-9G.

Figure 7:
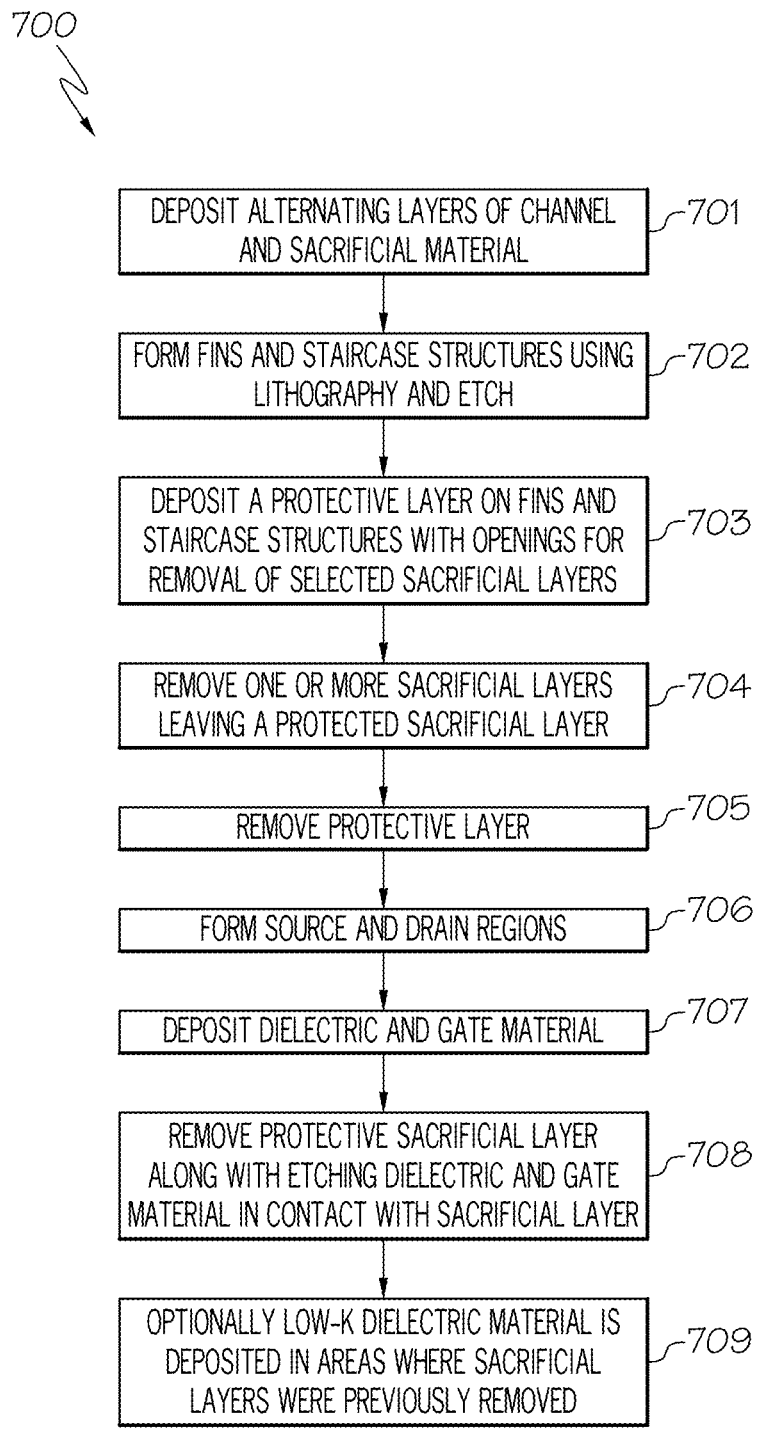
FIG. 7 is a flowchart of another alternative method for fabricating nanosheet multi-FETs in accordance with an embodiment of the present invention.

FIG. 7 is a flowchart of another alternative method 700 for fabricating nanosheet multi-FETs in accordance with an embodiment of the present invention. FIGS. 8A-8G and 9A-9G depict cross-sectional views of two alternate staircase fin-geometries for fabricating nanosheet multi-FETs using the steps described in FIG. 7 in accordance with an embodiment of the present invention.

Figures 9A, 9B, 9C, 9D:
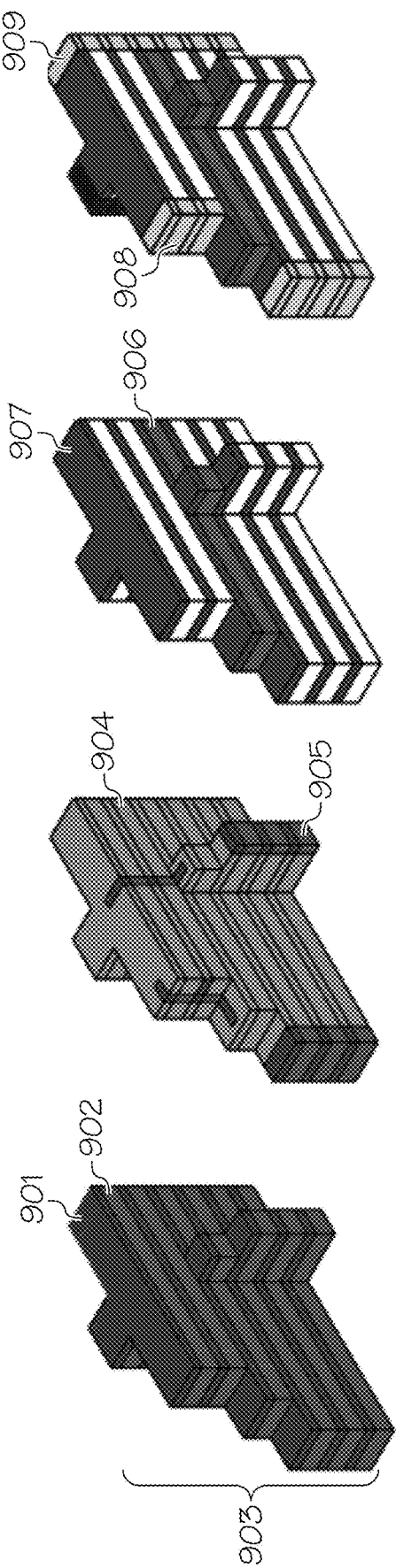

Referring to FIG. 7, in conjunction with FIGS. 8A-8G and 9A-9G, in step 701, alternating layers of channel 801, 901 and sacrificial material 802, 902 are deposited as shown in FIGS. 8A and 9A, respectively.

In step 702, fins and staircase structures 803, 903 are formed using lithography and etch as shown in FIGS. 8A and 9A, respectively.

In step 703, a protective layer 804, 904 is deposed on fins and staircase structures 803, 903 with openings (slots) 805, 905 for removal of selected sacrificial layers 802, 902 as shown in FIGS. 8B and 9B, respectively.

In step 704, one or more sacrificial layers 802, 902 are removed leaving a protected sacrificial layer 806, 906 as shown in FIGS. 8C and 9C, respectively.

In step 705, protective layer 804, 904 is removed as shown in FIGS. 8C and 9C, respectively.

In step 706, source 808, 908 and drain regions 809, 909 are formed as shown in FIGS. 8D and 9D, respectively.

Figure 9E:
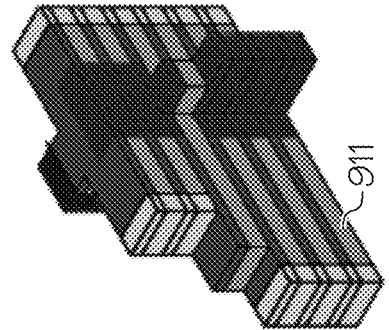

In step 707, dielectric and gate material 810, 910 are deposited as shown in FIGS. 8E and 9E, respectively.

Figure 9F:
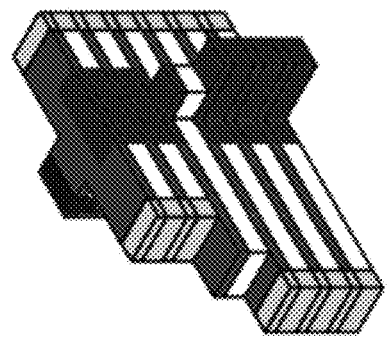

In step 708, protective sacrificial layer 806, 906 is removed along with etching dielectric and gate material 810, 910 in contact with sacrificial layer 806, 906 as shown in FIGS. 8F and 9F, respectively. In one embodiment, protective sacrificial layer 806, 906 is removed by exposing a portion of the staircase structure in contact with protective sacrificial layer 806, 906, to a chemical vapor. The vapor etches protective sacrificial layer 806, 906 and dielectric and gate material 810, 910 in contact with it without substantially affecting channel material 801, 901.

Figure 9G:
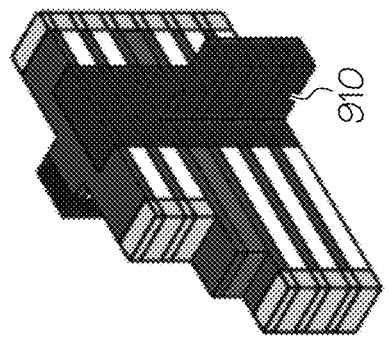

In step 709, low-k dielectric material 811, 911 (e.g., silicon oxide, silicon oxynitride, fluorine-doped silicon dioxide) is optionally deposited in areas where sacrificial layers 802, 902 were previously removed as shown in FIGS. 8G and 9G, respectively.

Figure 10A:
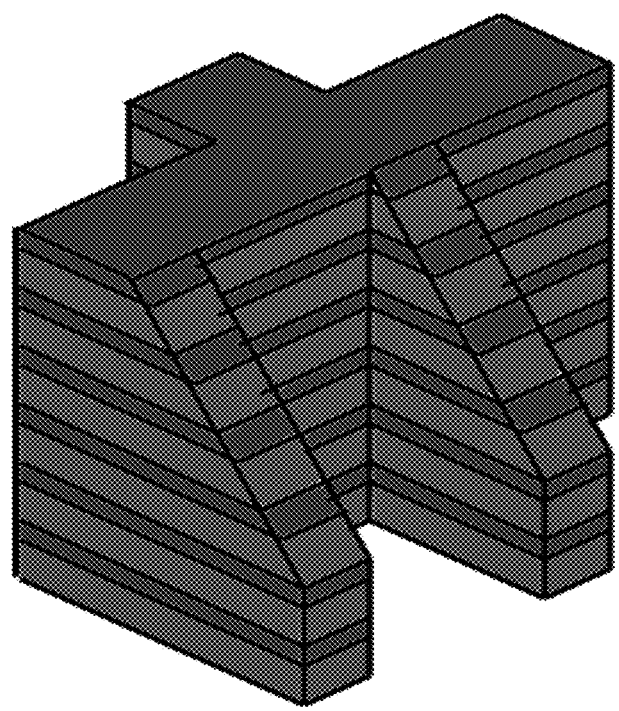
FIG. 10A illustrates using a crystallographic taper to create staircase contacts in accordance with an embodiment of the present invention.
Figure 10B:
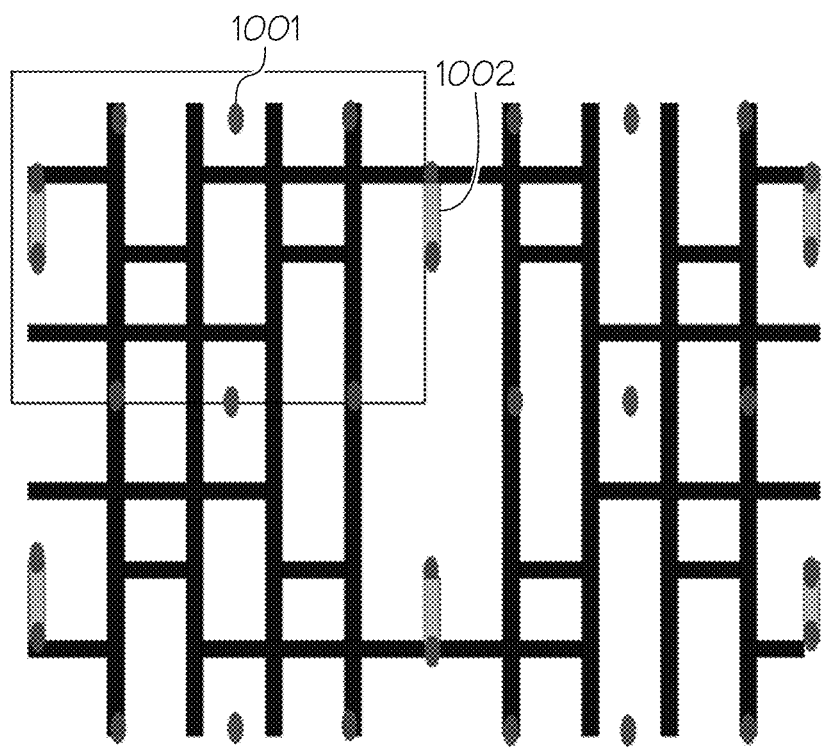
FIG. 10B illustrates an exemplary placement of contacts and staircases such that they are aligned in one direction in accordance with an embodiment of the present invention.

There are various lithography challenges of making the connected fins as well as placement of contact vias within lithography and overlay constraints. In one embodiment, for the "7 nm node," the physical thickness of the fins is 12 nm and the spacing between the fins is also 12 nm. Line/space patterns and cut-masks are created to make the initial fin pattern, such as shown in FIG. 10B. Contact vias have a critical dimension (CD) of 14 nm and a staggered metal pitch of 40 nm.

In one embodiment, the process of making nanosheet multi-transistors is similar to that of making traditional nanosheet transistors, except for creating contacts to individual nanosheet layers where necessary. The staircase formation to create contacts (contacts to sources, drains and gates) in lower transistors is done using lithography and plasma etch or by using crystallographic taper etching using etchants, such as tetra-methyl ammonium hydroxide (TMAH), potassium hydroxide (KOH), ammonium hydroxide ($NH_4OH$), ethylene di-amine (EDP), etc. followed by a single step plasma etch to create horizontal contacts as shown in FIG. 10A. FIG. 10A illustrates using a crystallographic taper to create staircase contacts in accordance with an embodiment of the present invention. For crystallographic etching, the pattern needs to be aligned with the crystallographic plane of the silicon substrate. FIG. 10B depicts the placement of such taper structures in an SRAM layout. FIG. 10B illustrates an exemplary placement of contacts 1001 and staircases 1002 such that they are aligned in one direction in accordance with an embodiment of the present invention.

A discussion regarding creating a three-dimensional SRAM architecture is provided below in connection with FIGS. 11 and 12A-12J.

Figure 11:
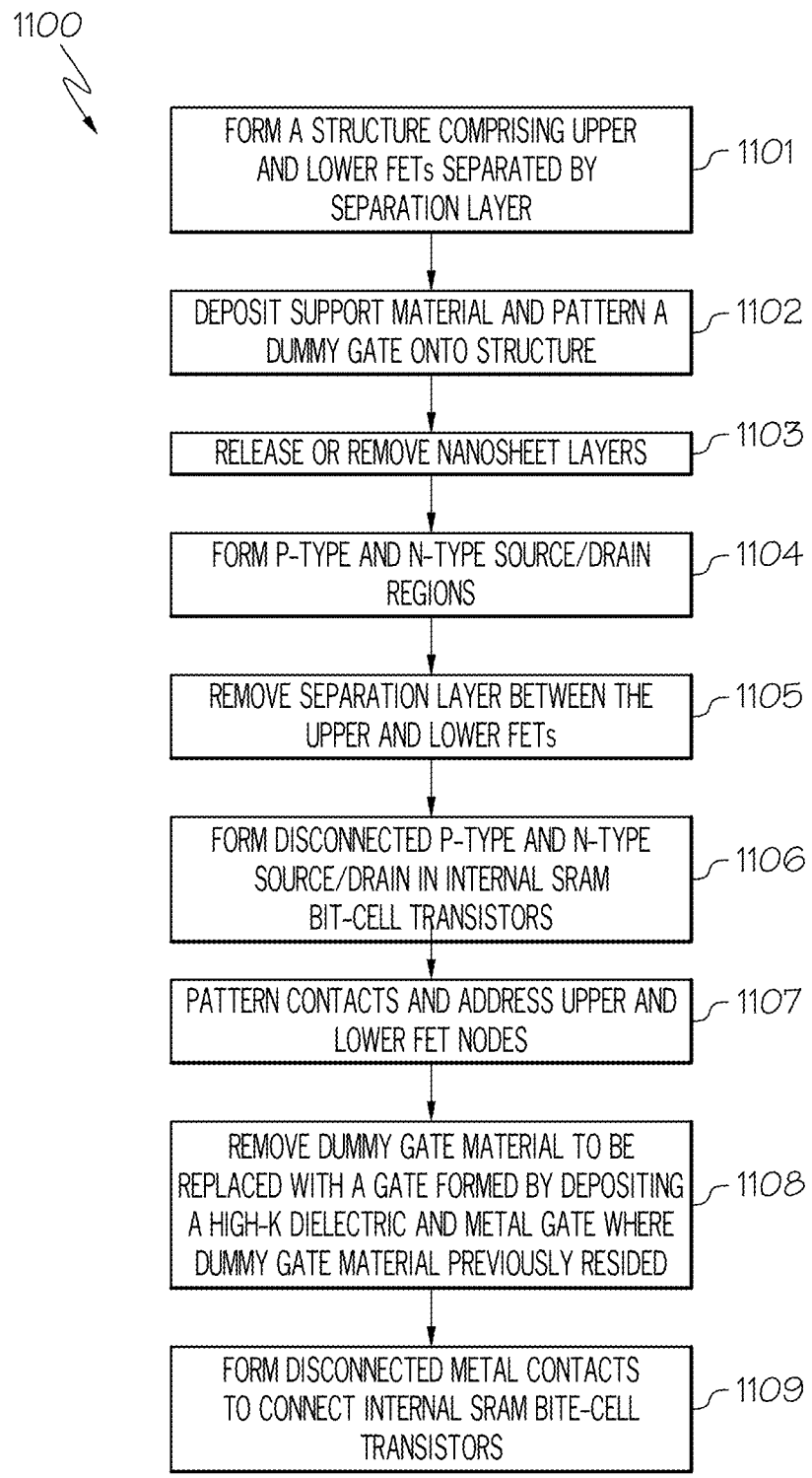
FIG. 11 is a flowchart of a method for creating a three-dimensional SRAM architecture in accordance with an embodiment of the present invention.

FIG. 11 is a flowchart of a method 1100 for creating a three-dimensional SRAM architecture in accordance with an embodiment of the present invention. FIG. 12A-12J depict the cross-sectional views for creating a three-dimensional SRAM architecture using the steps described in FIG. 11 in accordance with an embodiment of the present invention.

Figure 12A:
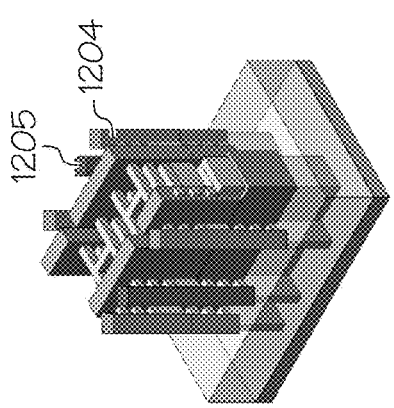
FIG. 12A-12J depict the cross-sectional views for creating a three-dimensional SRAM architecture using the steps described in FIG. 11 in accordance with an embodiment of the present invention.

Referring to FIG. 11, in conjunction with FIGS. 12A-12J, in step 1101, a structure comprising upper and lower nanosheet-FETs separated by a separation layer 1201 is formed by process steps previously described (see FIGS. 3, 4A-4E, 5, 6A-6E, 7, 8A-9G, 9A-9G, 10A and 10B). FIG. 12A shows an example of three-dimensional SRAM 2-bit-cells with nanosheet fins and staircase formation that consists of nanosheet layers 1402.

Figure 12B:
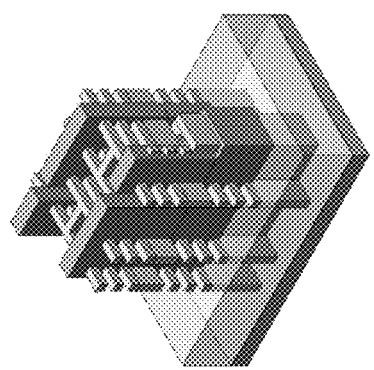

In step 1102, support material (not shown) is deposited and a dummy gate 1203 is patterned onto the structure as shown in FIG. 12B.

Figure 12C:
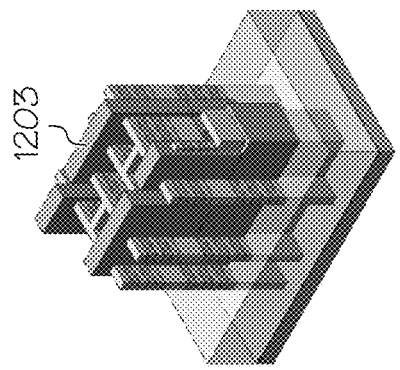

In step 1103, nanosheet layers 1202 are released or removed as shown in FIG. 12C.

Figure 12D:
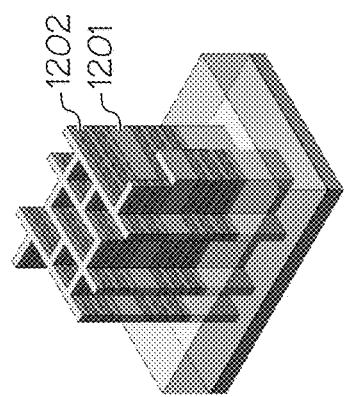

In step 1104, p-type and n-type source/drain regions 1204, 1205, respectively, are formed, such as via epitaxial deposition as shown in FIG. 12D.

Figure 12E:
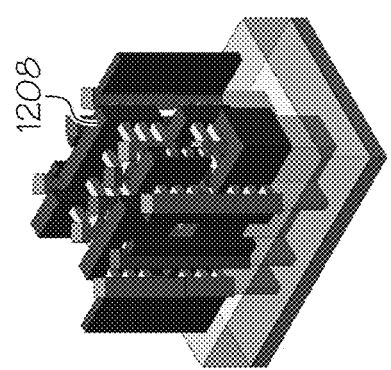

In step 1105, separation layer 1201 between the upper and lower FETs is removed as shown in FIG. 12E.

Figure 12F:
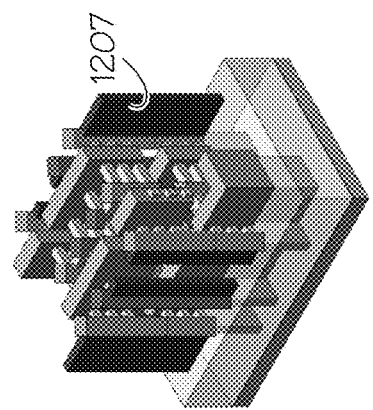

In step 1106, disconnected p-type and n-type source/drain regions 1204, 1205 are formed in internal SRAM bit-cell transistors. That is, additional p-type and n-type source/drain regions 1204, 1205 are formed in internal transistor regions 1206 of the SRAM bit-cell, such that the source and drain material 1204, 1205 deposited epitaxially is disconnected with no material in the separation layer region 1201 between the upper and lower FETs as shown in FIG. 12F.

Figure 12G:
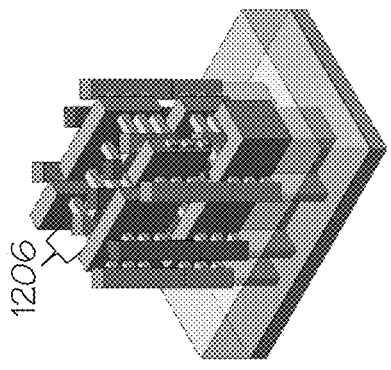

In step 1107, contacts 1207 are patterned to connect and address the upper and lower FET contact-nodes to each other as shown in FIG. 12G.

Figure 12H:
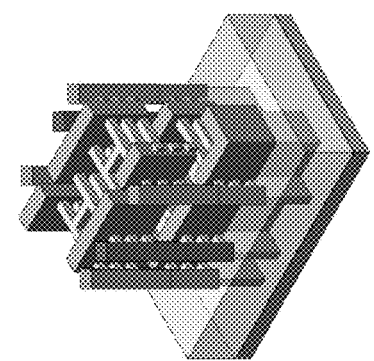

In step 1108, dummy gate material 1203 is removed and replaced with a gate formed by depositing a high-k dielectric (e.g., hafnium oxide, zirconium oxide, lanthanum oxide, titanium oxide, yttrium oxide, strontium titanate, other suitable metal-oxides, or combinations thereof) and metal gate (polysilicon, tungsten, nickel, copper, ruthenium, cobalt, platinum, palladium, titanium, titanium nitride, etc.) (collectively element 1208) where dummy gate material 1203 previously resided as shown in FIG. 12H. In one embodiment, dummy gate material 1203 is used as the final gate material with a high-k dielectric deposited prior to the dummy gate deposition in step 1102.

Figure 12I:
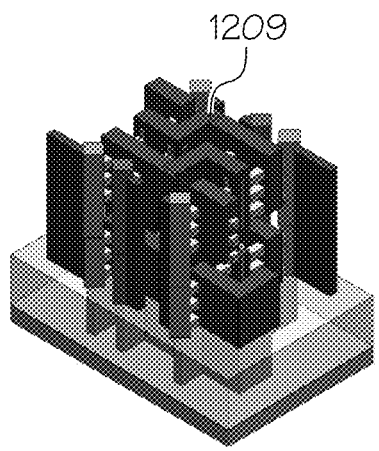
Figure 12J:
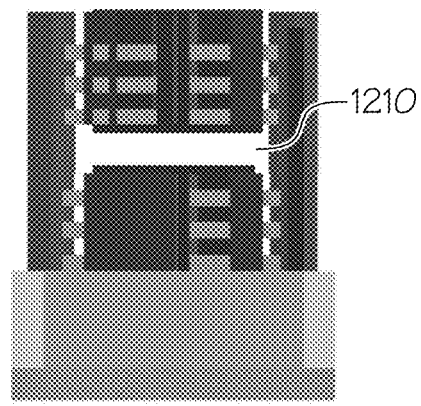

In step 1109, disconnected metal contacts are formed to connected internal SRAM bit-cell transistors. That is, patterning and a conformal deposition of metal contacts 1209, such as via atomic layer deposition, to connect SRAM cell contact-nodes is performed without connecting the upper and lower FET contact-nodes as shown in FIGS. 12I and 12J. FIG. 12J illustrates a side view of the structure shown in FIG. 12I showing a gap 1210 between the upper and lower FETs to avoid electrical contact between the FETs during contact metal deposition (e.g., selective atomic layer deposition around the silicon). In one embodiment, the gap or isolated layer is used to separate the stacked transistors along the vertical direction of a fin. In one embodiment, it comprises of a different composition than that of the fin, or air.

In an alternate process, the separation layer between the upper and lower FETs is not removed until after all the contacts are deposited. When the separation layer is removed, the metal connections in contact with the separation layer are also removed using a metal etch following the separation layer etch. Similarly, source/drains with unwanted connections between the top and bottom FET can also be removed by adding a silicon etch to remove silicon surrounding the separation layer. Access for etching the unwanted connections around the separation layer is provided using the staircase area In one embodiment, the separation layer is made of silicon-germanium (SiGe) and the contact metal is tungsten, cobalt or molybdenum.

Figure 13:
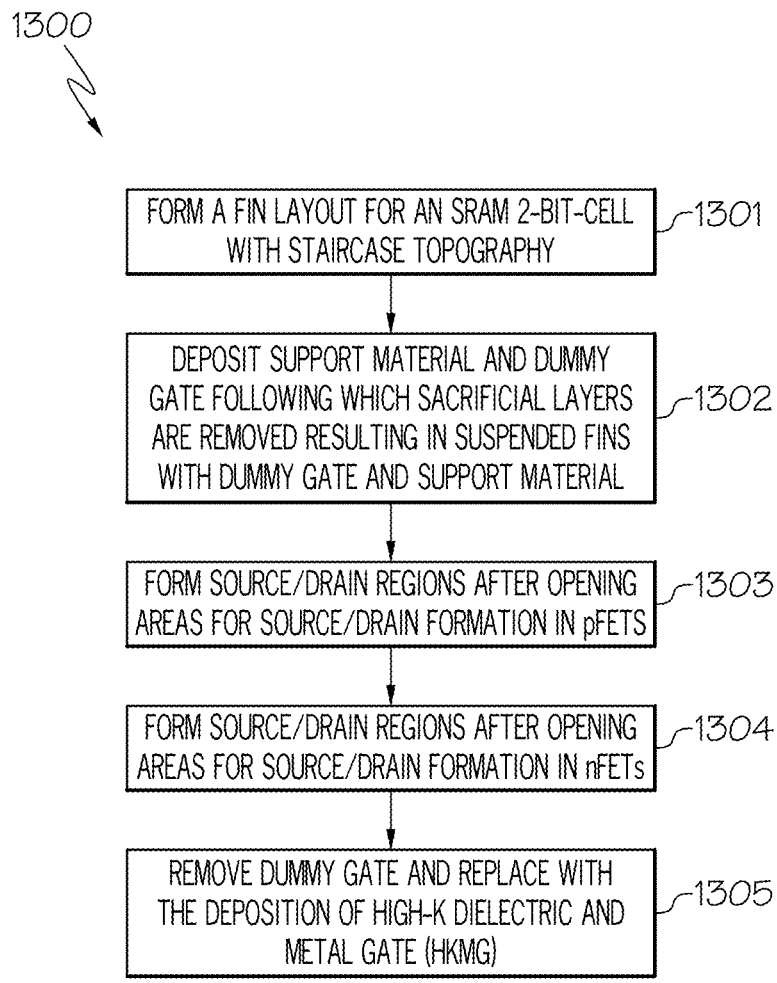
FIG. 13 is a flowchart of an alternative method for creating a three-dimensional SRAM architecture in accordance with an embodiment of the present invention.

FIG. 13 is a flowchart of an alternative method 1300 for creating a three-dimensional SRAM architecture in accordance with an embodiment of the present invention. FIGS. 14A-14E depict top-down views of the SRAM layout for creating a three-dimensional SRAM architecture using the steps described in FIG. 13 in accordance with an embodiment of the present invention.

Referring to FIG. 13, in conjunction with FIGS. 14A-14E, in step 1301, a fin layout 1401 for an SRAM 2-bit-cell with staircase topography 1402 is formed as discussed above as shown in FIG. 14A.

Figure 14A:
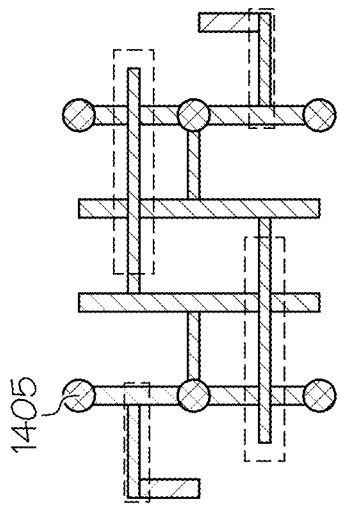
FIGS. 14A-14E depict top-down views of the SRAM layout for creating a three-dimensional SRAM architecture using the steps described in FIG. 13 in accordance with an embodiment of the present invention.
Figure 14B:
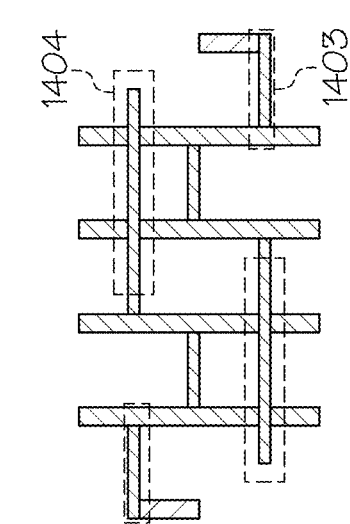

In step 1302, support material 1403 (support for channel release) and dummy gate 1404 are deposited, following which sacrificial layers are removed (not shown), resulting in suspended fins with dummy gate 1404 and support material 1403, whose top-view is shown in FIG. 14B.

Figure 14C:
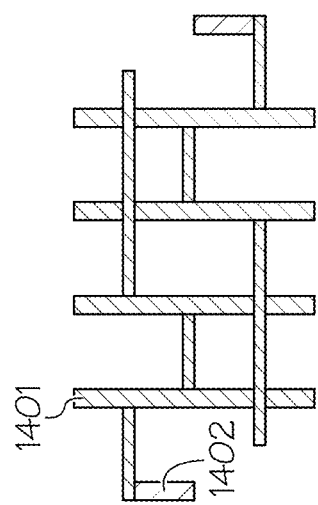

In step 1303, source/drain regions 1405 after formed after opening areas 1405 for source/drain formation in pFETs as shown in FIG. 14C. In one embodiment, source/drain regions 1405 are formed by epitaxial growth of carbon-doped silicon.

Figure 14D:
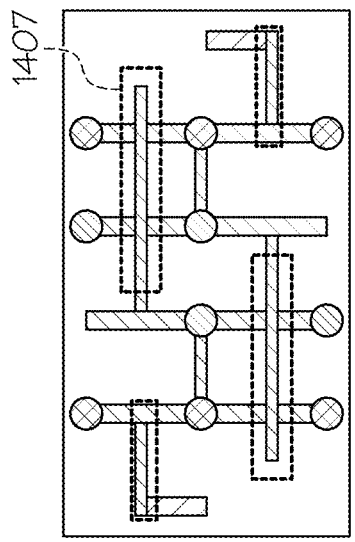

In step 1304, source/drain regions 1406 after formed after opening areas 1406 for source/drain formation in nFETs as shown in FIG. 14D. An optional low-k dielectric may also be deposited in open areas (shown as a surrounding box in FIG. 14D). In one embodiment, source/drain regions 1406 are formed by epitaxial growth of silicon-germanium (SiGe).

Figure 14E:
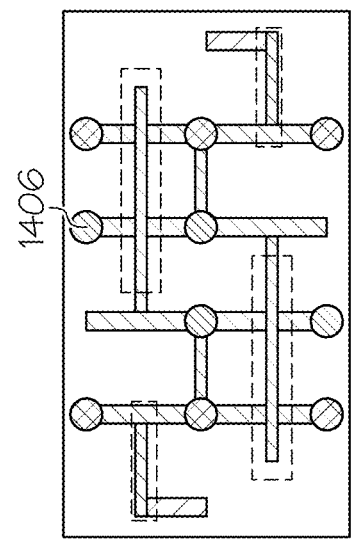

In step 1305, dummy gate 1404 is removed and replaced with the deposition of high k-dielectric and metal gate (HKMG) 1407 as shown in FIG. 14E.

In one embodiment, the 3D SRAM device includes nanosheet FETs along the vertical direction of a fin having an aspect ratio of at least 5:1 and a sidewall angle greater than 89.5 degrees. In one embodiment, the wall angle is measured by measuring the critical feature dimension at the top and bottom of the fins, for instance, the top of the fin cross-section measures 10 nm, and the bottom measures 10.2 nm. In one embodiment, the cross-section measurements are performed using metrology techniques, such as scanning electron microscopy (SEM), atomic force microscopy (AFM), transmission electron microscopy (TEM), optical scatterometry, etc.

As previously discussed, Static Random-Access Memory (SRAM) is commonly used in integrated circuits due to its fast access time and compatibility with CMOS logic processes. Although transistors have scaled to three-dimensions (3D), such as with FinFETs and next-generation nanosheet transistors, the placement of SRAM transistors remains planar. The use of nanosheet transistors for logic devices brings the opportunity to create 3D SRAM designs, in a manner similar to the shift from 2D to 3D NAND Flash. Nanosheet FETs have horizontally stacked gate-all-around structures that can be a good replacement of FinFETs at the 5 nm technology node and beyond. They enable versatile designs and show higher performance and electrostatics than FinFETs for the same footprint. However, the maximum height of the fins and thereby the maximum number of nanosheet layers is limited by a non-zero etch taper during the pattern transfer step to etch the fins using plasma etching. With the proposed Catalyst Influenced Chemical Etching (CICE), semiconductor fins can be etched with no etch taper, smooth sidewalls, and no maximum height limitation. CICE enables stacking of as many nanosheet layers as desired, and also enables a new 3D stacked architecture for SRAM cells.

Furthermore, as stated in the Background section, photon-based quantum computing when integrated with PICs, single photon sources and detectors can enable large scale quantum circuits with the potential of scale up using mature CMOS technology. However, certain challenges arise in the miniaturization of photonic quantum circuits due to extremely low defect tolerance during fabrication of these quantum circuit elements. Integration with other elements of photonic circuits and losses during transmission of photons in PICs affect yield and are a barrier to deployment in industry.

Embodiments of the present invention address such challenges by novel fabrication processes and process integration techniques to reduce these losses and improve yield and performance.

A brief discussion regarding silicon photonics is now deemed appropriate. CMOS compatible silicon photonics allows for integration of optical components on the same silicon chip with CMOS transistors, and can enable high bandwidth low energy communications for high performance multi-core devices.

Silicon waveguide core materials include single crystal silicon, (Ge)-doped silica core, hydrogenated amorphous silicon, recrystallized poly Si, silicon nitride, silicon carbide, germanium, gallium nitride (GaN), gallium phosphide (GaP), III-V semiconductors, etc.

Silicon waveguide cladding materials include silicon dioxide, silicon oxynitride, air, porous silicon, porous silicon oxide, metal oxides, etc.

SOI (silicon-on-insulator) wafers are the primary platform for silicon photonics, with 1-2 dB/cm propagation loss for silicon single-mode waveguides.

The basic design of a photonics material includes a core and cladding material, where the refractive index of the core is greater than that of the cladding material, and both are transparent to the operating wavelength. A higher index contrast waveguide has a smaller footprint as it can tolerate smaller bends with low loss. Single crystal silicon is an ideal waveguide material due to its high refractive index (3.476) compared to the cladding (1.444 for silicon dioxide) at a 1550 nm wavelength. However, silicon waveguides are highly sensitive to fabrication defects—sidewall roughness increases coupling loss with light sources and transmission loss and phase error for transverse electric (TE) polarization light. Variations in width and height affect the effective index for transverse magnetic (TM) polarization. Additionally, vertical taper could improve coupling loss, but it increases fabrication complexity.

Passive devices do not need an electric input for optical functionality. Examples include optical couplers, arrayed waveguide gratings (AWGs), Mach-Zehnder Interferometers (MZI) and ring resonators. AWGs have the lowest footprint with silicon; however, sidewall roughness induces phase error, which further introduces large crosstalk, high loss, spectral shape deformation, etc., during wavelength division de/multiplexing (WDM). The resonance wavelengths in ring resonators are highly sensitive to effective index variation, which is affected by width and thickness variations.

Line Edge Roughness (LER) of the waveguides used in these devices can be reduced using nanoimprint lithography, and sidewall damage can be reduced using Catalyst Influenced Chemical Etching (CICE). CICE also ensures that the sidewall taper is kept to >89.5°. Vertical tapers can be achieved for lowering coupling loss by using crystallographic etching of silicon. The core sidewalls have a surface roughness less than 1 nm 1 sigma and the core feature line edge roughness is less than 2 nm 1 sigma. These values can be measured using atomic force microscope (AFM), transmission electron microscopy (TEM), scanning electron microscopy (SEM), optical metrology, and by waveguide performance improvement.

Photons have emerged as a leading approach to quantum information science. A typical photonic quantum computer includes photon sources, detectors, and sophisticated optical circuits. Using the silicon-photonic route to quantum computing has the advantage of utilizing the mature and vast semiconductor industry for scale up. Photonic-integrated circuits (PICs) are already being developed by the semiconductor industry for optical interconnects. Integrating silicon-based PICs with photon sources and detectors in a single chip can enable low loss, high yield quantum circuits.

The ideal single-photon source has three important properties—purity, indistinguishability and brightness. Single photon sources include indium gallium arsenide (InGaAs), gallium arsenide (GaAs), II-VI tellurides and selenides, III-V nitrides, nitrogen-vacancy and silicon-vacancy in diamonds, rare-earth atomic dopants and defects in two-dimensional (2D) monolayer materials. Based on their bandgap, the emission spectra and operating temperatures (cryogenic to room temperature) can be determined. Quantum dots (QDs) based on III-V semiconductors are one of the best performing single-photon sources (SPSs) at present. SPSs can also be obtained using QDs in micropillar, microdisk, tapered nanowire, microlens, bulls-eye and photonic-crystal cavities.

Such QDs, when coupled to photonic structures, can be integrated on a single chip by applying advanced semiconductor micro-processing technologies. This can achieve near-unity coupling efficiency between the emitter and waveguide device. However, a major issue with QD-based on-chip SPSs is the loss of photon indistinguishability related to charge fluctuation from nearby etched devices. Passivation techniques have been used to decrease the surface states found on the rough etched surfaces. However, even with passivation techniques, the sizes of the waveguides have to be increased to keep etched surfaces away from the QDs.

Embodiments of the present invention utilize Catalyst Influenced Chemical Etching (CICE) to etch the silicon waveguides thereby creating waveguides with smooth sidewalls to improve coupling efficiency and eliminate charge fluctuations that may affect photon indistinguishability.

Superconducting nanowire single-photon detectors (SNSPDs) based on sub-100-nm-wide and 3- to 6-nm-thick niobium nitride (NbN) nanowires can detect infrared photons with the lowest timing jitter (TJ). Other SNSPD materials include niobium titanium nitride (NbTiN), tungsten silicide, niobium silicide and molybdenum silicide. Building systems with multiple SNSPDs suffers from low yield, exacerbated when integrated onto photonic chips.

Traditional plasma etching of niobium nitride (NbN) to fabricate the required nanofeatures can create residual plasma damage in the surrounding silicon. This can be avoided by using selective atomic layer deposition (ALD) of NbN, where the precursors are dosed in a manner similar to area-selective ALD of titanium nitride (TiN). In one embodiment, $H_2$ plasma-treated amorphous carbon can be used in areas where NbN is to be excluded from deposition thereby enabling deposition of the nanoscale NbN only in the detector areas. Alternatively, atomic layer etching can be used with a protective etch stop to protect the silicon during etch. Isolating the NbN and removing portions of it using Chemical Mechanical Polishing (CMP) can also be used to pattern the NbN.

Atomic Layer Deposition precursors to enable selective ALD of NbN includes (a) $NbCl_5$ and $NH_3$, (b) $Nb(N^tBu)(NEtMe)_3$ and $H_2$ plasma, (c) $NbCl_5$ and $Me_2NNH_2$. These precursors can be used to selectively deposit material on the required deposition surface, selective to certain ALD-suppressing materials engineering based on surface chemistries. ALD-suppressing surfaces include carbon, hydrogen plasma treated carbon, spin-on-carbon, polymer, acrylates, etc. The material to be deposited on can be silicon, silicon dioxide, native oxide on silicon, aluminum oxide, etc.

Figure 15:
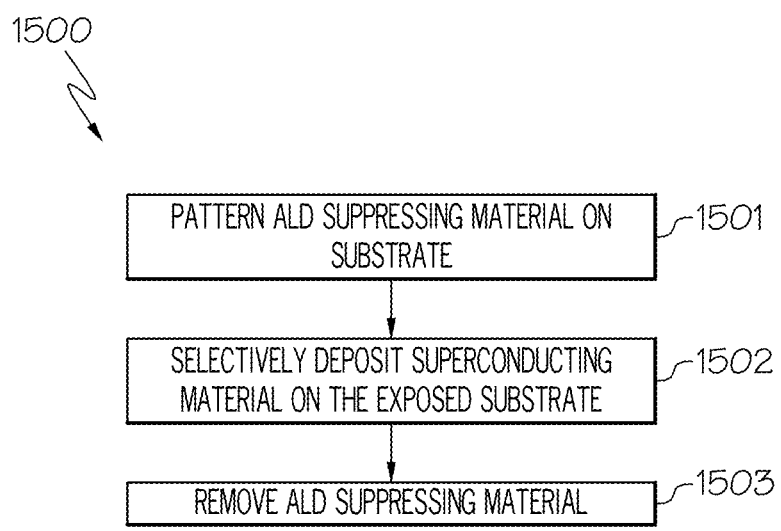
FIG. 15 is a flowchart of a method for patterning of superconducting material, such as NbN, without surface damage in accordance with an embodiment of the present invention.

FIG. 15 is a flowchart of a method 1500 for patterning of superconducting material, such as NbN, niobium titanium nitride (NbTiN), tungsten silicide, niobium silicide and molybdenum silicide, without surface damage in accordance with an embodiment of the present invention. FIGS. 16A-16D depict the cross-sectional views for patterning of superconducting material without surface damage using the steps described in FIG. 15 in accordance with an embodiment of the present invention.

Figure 16A:
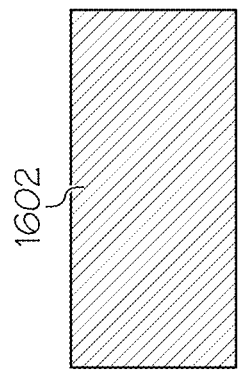
FIGS. 16A-16D depict the cross-sectional views for patterning of superconducting material without surface damage using the steps described in FIG. 15 in accordance with an embodiment of the present invention.
Figure 16B:
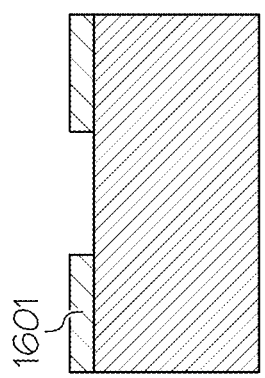

Referring now to FIG. 15, in conjunction with FIGS. 16A-16D, in step 1601, atomic layer deposition (ALD) suppressing material 1601 is patterned on a substrate 1602 (e.g., bulk silicon, silicon-on-insulator (SOI), epitaxial silicon, III-Vs, gallium nitride (GaN), germanium (Ge)) as shown in FIGS. 16A and 16B.

Figure 16C:
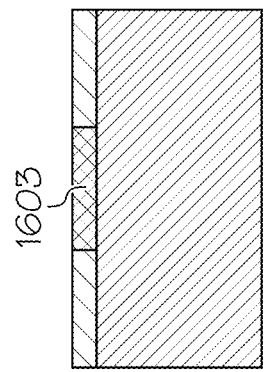
Figure 16D:
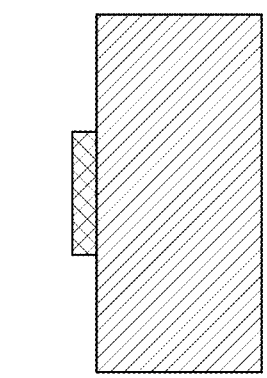

In step 1502, superconducting material 1603, such as NbN, is selectively deposited on the exposed substrate 1602 as shown in FIG. 16C. In one embodiment, such superconducting material 1603 has a smallest lateral dimension less than 100 nm. In one embodiment, superconducting material 1603 is deposited via selective atomic layer deposition.

In step 1503, the ALD suppressing material 1601 is removed as shown in FIG. 20D. In one embodiment, ALD suppressing material 1601 is removed using gentle oxidizing plasma.

An alternative process for patterning of superconducting material, such as NbN, without surface damage is discussed below in connection with FIGS. 17 and 18A-18F.

Figure 17:
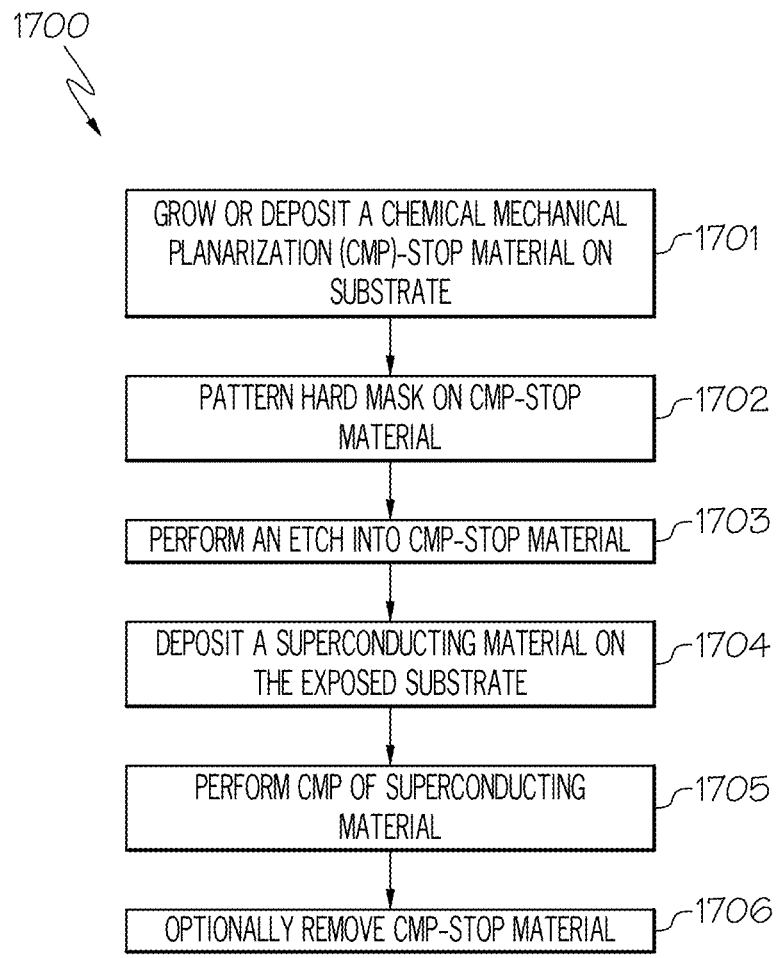
FIG. 17 is a flowchart of an alternative method for patterning of superconducting material, such as NbN, without surface damage in accordance with an embodiment of the present invention.

FIG. 17 is a flowchart of an alternative method 1700 for patterning of superconducting material, such as NbN, niobium titanium nitride (NbTiN), tungsten silicide, niobium silicide and molybdenum silicide, without surface damage in accordance with an embodiment of the present invention. FIGS. 18A-18F depict the cross-sectional views for patterning of superconducting material without surface damage using the steps described in FIG. 21 in accordance with an embodiment of the present invention.

Figure 18A:
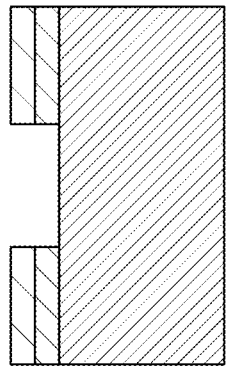
FIGS. 18A-18F depict the cross-sectional views for patterning of superconducting material without surface damage using the steps described in FIG. 17 in accordance with an embodiment of the present invention.
Figure 18D:
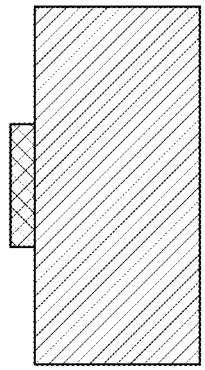
Figure 18B:
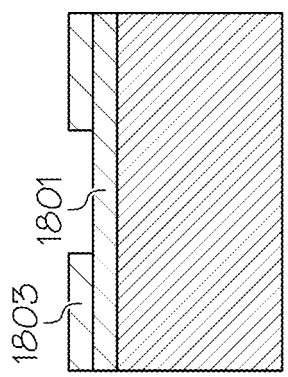

Referring to FIG. 17, in conjunction with FIGS. 18A-18F, in step 1701, a chemical mechanical polishing (CMP)-stop material 1801, such as silicon oxide and silicon nitride, is grown or deposited on substrate 1802 (e.g., bulk silicon, silicon on insulator (SOI), epitaxial silicon, III-Vs, gallium nitride (GaN), germanium (Ge)) as shown in FIGS. 18A and 18B.

In step 1702, a hard mask 1803 is patterned on CMP-stop material 1801 as shown in FIG. 18B to etch CMP-stop material 1801.

Figure 18E:
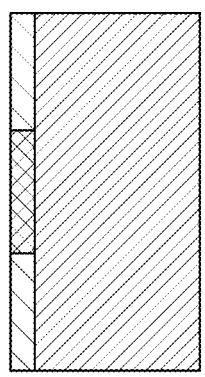
Figure 18C:
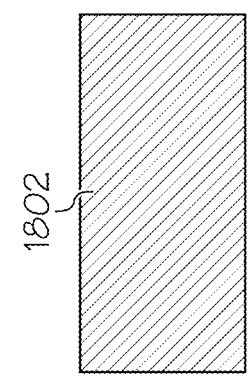

In step 1703, an etch into CMP-stop material 1801 is performed as shown in FIG. 18C.

In step 1704, a superconducting material 1804, such as NbN, is deposited on the exposed substrate 1802 as shown in FIG. 18D. In one embodiment, superconducting material 1804 has a smallest lateral dimension less than 100 nm. In one embodiment, superconducting material 1804 is deposited via selective atomic layer deposition.

In step 1705, a CMP of superconducting material 1804 is performed as shown in FIG. 18E.

Figure 18F:
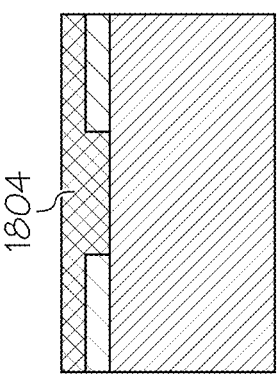

In step 1706, CMP-stop material 1801 is optionally removed as shown in FIG. 18F.

A further alternative process for patterning of superconducting material, such as NbN, without surface damage is discussed below in connection with FIGS. 19 and 20A-20E.

Figure 19:
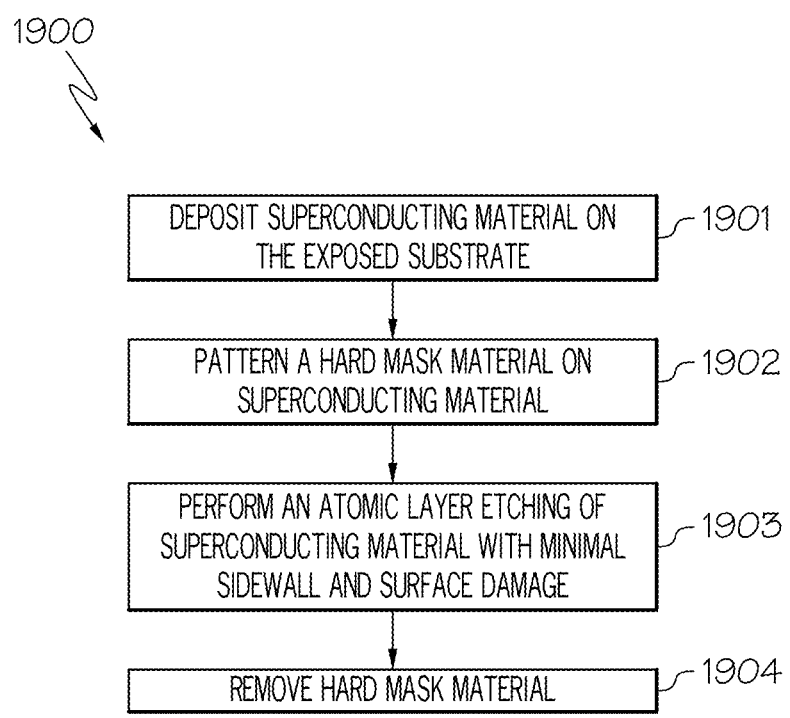
FIG. 19 is a flowchart of another alternative method for patterning of superconducting material, such as NbN, without surface damage in accordance with an embodiment of the present invention.

FIG. 19 is a flowchart of another alternative method 1900 for patterning of superconducting material, such as NbN, niobium titanium nitride (NbTiN), tungsten silicide, niobium silicide and molybdenum silicide, without surface damage in accordance with an embodiment of the present invention. FIGS. 20A-20E depict the cross-sectional views for patterning of superconducting material without surface damage using the steps described in FIG. 19 in accordance with an embodiment of the present invention.

Referring to FIG. 19, in conjunction with FIGS. 20A-20E, in step 1901, a superconducting material 2001, such as NbN, is deposited on the exposed substrate 2002 (e.g., bulk silicon, silicon on insulator (SOI), epitaxial silicon, III-Vs, gallium nitride (GaN), germanium (Ge)) as shown in FIGS. 20A and 20B. In one embodiment, superconducting material 2001 has a smallest lateral dimension less than 100 nm. In one embodiment, superconducting material 2001 is deposited via selective atomic layer deposition.

In step 1902, a hard mask material 2003 is patterned on superconducting material 2001 as shown in FIG. 20C.

In step 1903, an atomic layer etching of the exposed superconducting material 2001 is performed with minimal sidewall and surface damage as shown in FIG. 20D.

In step 1904, hard mask material 2003 is removed as shown in FIG. 20E.

A further alternative process for patterning of superconducting material, such as NbN, without surface damage is discussed below in connection with FIGS. 21 and 22A-22G.

Figure 21:
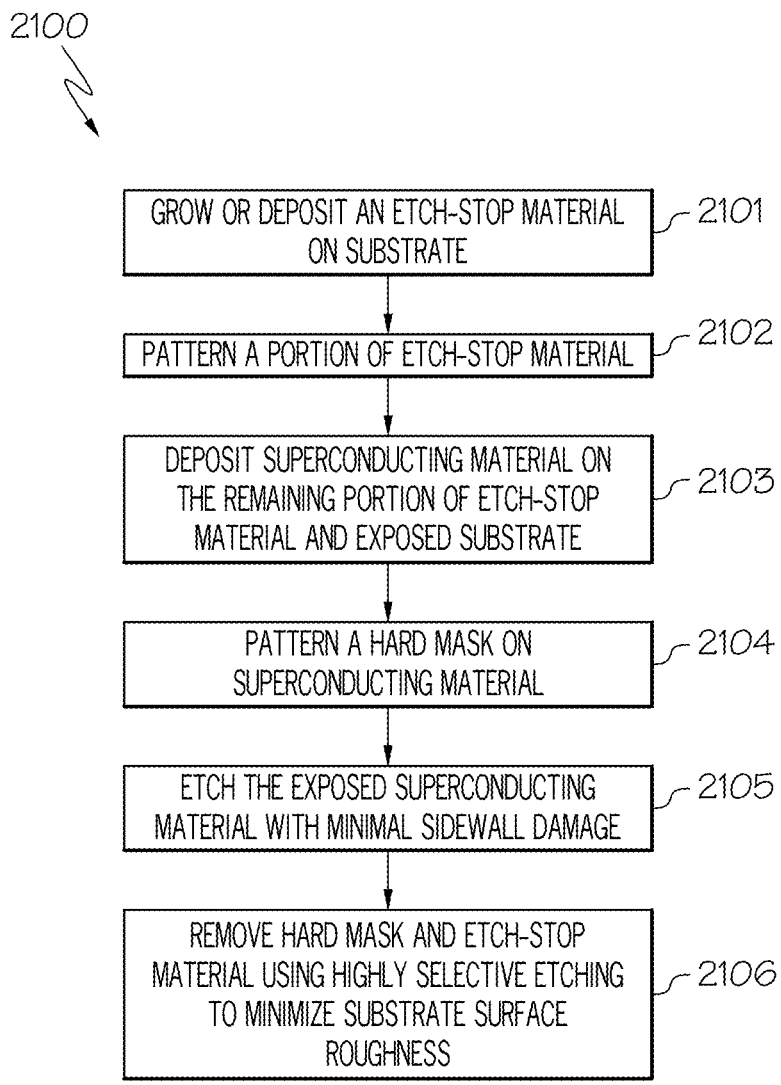
FIG. 21 is a flowchart of an additional alternative method for patterning of superconducting material, such as NbN, without surface damage in accordance with an embodiment of the present invention.

FIG. 21 is a flowchart of an additional alternative method 2100 for patterning of superconducting material, such as NbN, niobium titanium nitride (NbTiN), tungsten silicide, niobium silicide and molybdenum silicide, without surface damage in accordance with an embodiment of the present invention. FIGS. 22A-22G depict the cross-sectional views for patterning of superconducting material without surface damage using the steps described in FIG. 25 in accordance with an embodiment of the present invention.

Referring to FIG. 21, in conjunction with FIGS. 22A-22G, in step 2101, an etch-stop material 2201 (e.g., silicon oxide, silicon nitride) is grown or deposited on substrate 2202 (e.g., bulk silicon, silicon on insulator (SOI), epitaxial silicon, III-Vs, gallium nitride (GaN), germanium (Ge)) as shown in FIGS. 22A and 22B.

In step 2102, a portion of etch-stop material 2201 is patterned as shown in FIG. 22C.

In step 2103, superconducting material 2203, such as NbN, is deposited on the remaining portion of etch-stop material 2201 and exposed substrate 2202 as shown in FIG. 22D. In one embodiment, superconducting material 2203 has a smallest lateral dimension less than 100 nm. In one embodiment, superconducting material 2203 is deposited via selective atomic layer deposition.

In step 2104, a hard mask 2204 is patterned on superconducting material 2203 as shown in FIG. 22E.

In step 2105, the exposed superconducting material 2203 is etched with minimal sidewall damage, such as via a plasma etch or an atomic layer etch as shown in FIG. 22F.

In step 2106, hard mask 2204 and etch-stop material 2201 are removed using highly selective etching, such as isotropic dry etch, vapor etch, wet etch, to minimize substrate surface roughness as shown in FIG. 22G.

Furthermore, embodiments of the present invention include optical circuits using waveguides.

Waveguides with silicon or silicon nitride core, silicon oxide or silicon oxynitride cladding can be readily fabricated from SOI (Silicon-on-Insulator) wafers using standard CMOS processes. Optical lithography and etching techniques are used to form the silicon waveguides. However, this process suffers from high losses, mainly caused by sidewall roughness. The sidewall roughness may be due to line edge roughness (LER) in optical lithography, plasma damage during etching of silicon, and also due to processing steps of other photonic circuit elements, such as the SNSPDs. Electron beam lithography have been used to decrease LER, resulting in smoother waveguide sidewalls and better yield. Smoothing techniques have been used to reduce sidewall roughness after plasma etch. However, the smoothing techniques consume some of the silicon and affect feature size control, and electron-beam lithography has very low throughput.

In one embodiment, nanoimprint lithography to control LER during lithography and Catalyst Influenced Chemical Etching (CICE) are used to fabricate waveguides with no sidewall damage and no etch taper, thereby enabling very low transmission losses. Thus, the smooth plasma-free etching of silicon waveguides using the principles of the present invention with no sidewall damage and no etch taper can enable low loss, high yield silicon waveguides for large-scale single-chip integrated silicon photonic quantum computers.

Catalysts for CICE with high yield patterning and removal can enable fabrication optical circuits using CICE. Catalysts, such as Au, Ag, Ru, Pt, Pd, Ir, Rh, $RuO_2$, $IrO_2$, W, TiN, etc. can be used. CMOS-compatible catalysts allow using semiconductor manufacturing for high volume manufacturing of these devices for photonics, optical interconnects and quantum computing chips.

A discussion regarding silicon waveguide fabrication with CICE, such as creating waveguides with a silicon core with (1) uniform etch depth, (2) under-etch of silicon with oxidation compensation, (3) under-etch of silicon with a second etch step to remove silicon and (4) over etch of silicon, is provided below.

Silicon waveguides with low line edge roughness (LER) and sidewall roughness, and >89.5° sidewall angle, can be created on a variety of Si substrates using CICE, as described below in connection with FIGS. 23 and 24A-24E.

Figure 23:
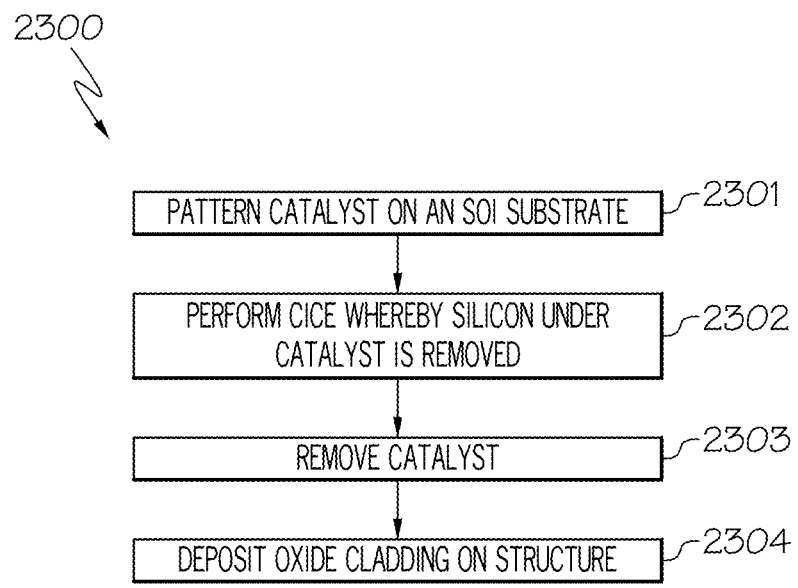
FIG. 23 is a flowchart of a method for creating waveguides with CICE in accordance with an embodiment of the present invention.

FIG. 23 is a flowchart of a method 2300 for creating waveguides with CICE in accordance with an embodiment of the present invention. FIGS. 24A-24E depict the cross-sectional views for creating waveguides with CICE using the steps described in FIG. 23 in accordance with an embodiment of the present invention.

Referring to FIG. 23, in conjunction with FIGS. 24A-24E, in step 2301, catalyst 2401 is patterned on an SOI substrate 2402, consisting of silicon 2403, insulator 2404 and silicon substrate 2405, as shown in FIGS. 24A and 24B.

In step 2302, CICE is performed whereby silicon 2403 under catalyst 2401 is removed as shown in FIG. 24C.

In step 2303, catalyst 2401 is removed as shown in FIG. 24D.

In step 2304, oxide cladding 2406 is deposited on the structure of FIG. 24D, namely, the exposed portion of insulator 2404 and the remaining portion of silicon 2403, as shown in FIG. 24E.

An alternative process for creating waveguides with CICE is discussed below in connection with FIGS. 25 and 26A-26F.

Figure 25:
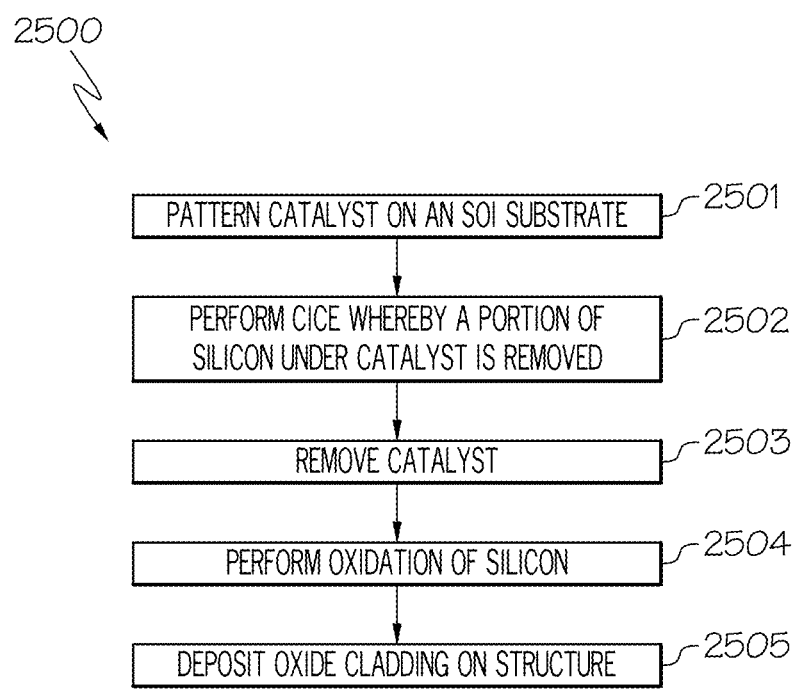
FIG. 25 is a flowchart of an alternative method for creating waveguides with CICE in accordance with an embodiment of the present invention.

FIG. 25 is a flowchart of an alternative method 2500 for creating waveguides with CICE in accordance with an embodiment of the present invention. FIGS. 26A-26F depict the cross-sectional views for creating waveguides with CICE using the steps described in FIG. 25 in accordance with an embodiment of the present invention.

Figure 26C:
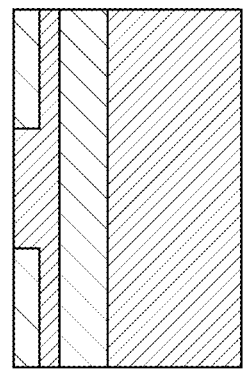
FIGS. 26A-26F depict the cross-sectional views for creating waveguides with CICE using the steps described in FIG. 25 in accordance with an embodiment of the present invention.
Figure 26F:
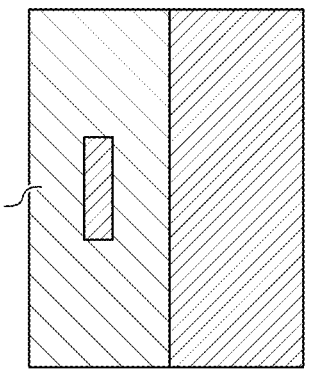
Figure 26B:
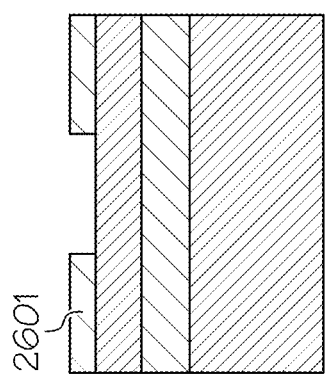
Figure 26E:
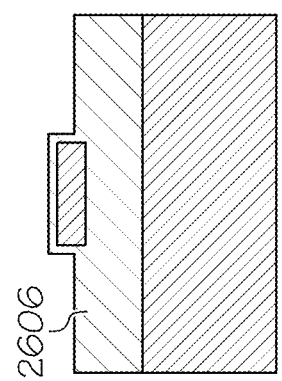
Figure 26A:
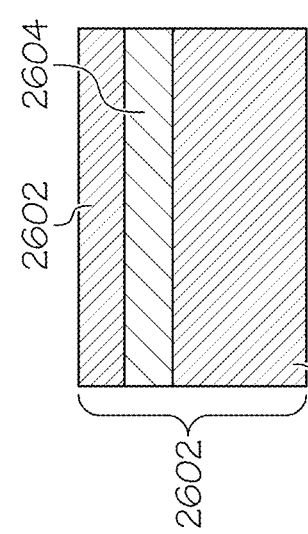

Referring to FIG. 25, in conjunction with FIGS. 26A-26F, in step 2501, catalyst 2601 is patterned on an SOI substrate 2602, consisting of silicon 2603, insulator 2604 and silicon substrate 2605, as shown in FIGS. 26A and 26B.

In step 2502, CICE is performed whereby a portion of silicon 2603 under catalyst 2601 is removed as shown in FIG. 26C.

Figure 26D:
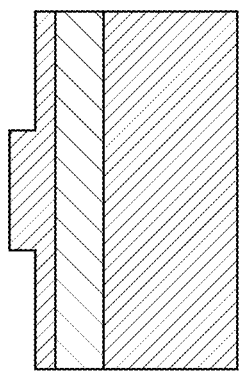

In step 2503, catalyst 2601 is removed as shown in FIG. 26D.

In step 2504, oxidation of silicon (see element 2606) is performed involving the oxidation of silicon 2603 as shown in FIG. 26E.

In step 2505, oxide cladding 2607 is deposited on the structure of FIG. 26E, namely, the oxidized silicon 2606, as shown in FIG. 26F.

A further alternative process for creating waveguides with CICE is discussed below in connection with FIGS. 27 and 28A-27H.

Figure 27:
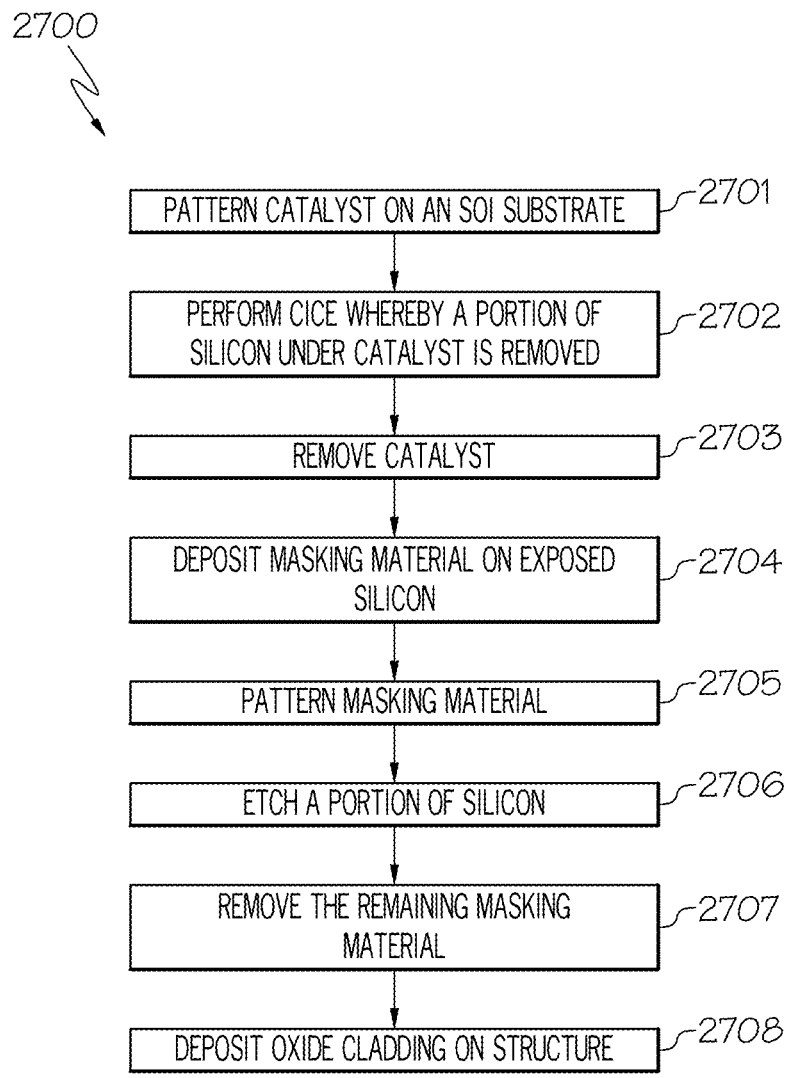
FIG. 27 is a flowchart of a further alternative method for creating waveguides with CICE in accordance with an embodiment of the present invention.

FIG. 27 is a flowchart of a further alternative method 2700 for creating waveguides with CICE in accordance with an embodiment of the present invention. FIGS. 28A-28H depict the cross-sectional views for creating waveguides with CICE using the steps described in FIG. 27 in accordance with an embodiment of the present invention.

Referring to FIG. 27, in conjunction with FIGS. 28A-28H, in step 2701, catalyst 2801 is patterned on an SOI substrate 2802, consisting of silicon 2803, insulator 2804 and silicon substrate 2805, as shown in FIGS. 28A and 28B.

In step 2702, CICE is performed whereby a portion of silicon 2803 under catalyst 2801 is removed as shown in FIG. 28C.

In step 2703, catalyst 2801 is removed as shown in FIG. 28D.

In step 2704, masking material 2806, such as photoresist, silicon dioxide, spin-on-carbon, is deposited on exposed silicon 2803 as shown in FIG. 28E.

In step 2705, masking material 2806 is patterned in a manner as shown in FIG. 28F.

In step 2706, a portion of silicon 2803 is etched, such as via plasma etching, atomic layer etching, wet etch, CICE, etc. as shown in FIG. 28G.

In step 2707, the remaining masking material 2806 is removed as shown in FIG. 28H.

In step 2708, oxide cladding 2807 is deposited on the structure of FIG. 28G after the removal of the remaining masking material 2806, namely, the exposed portion of silicon 2803 and insulator 2804 after the removal of the remaining masking material 2806, as shown in FIG. 28H.

Another alternative process for creating waveguides with CICE is discussed below in connection with FIGS. 29 and 30A-30E.

Figure 29:
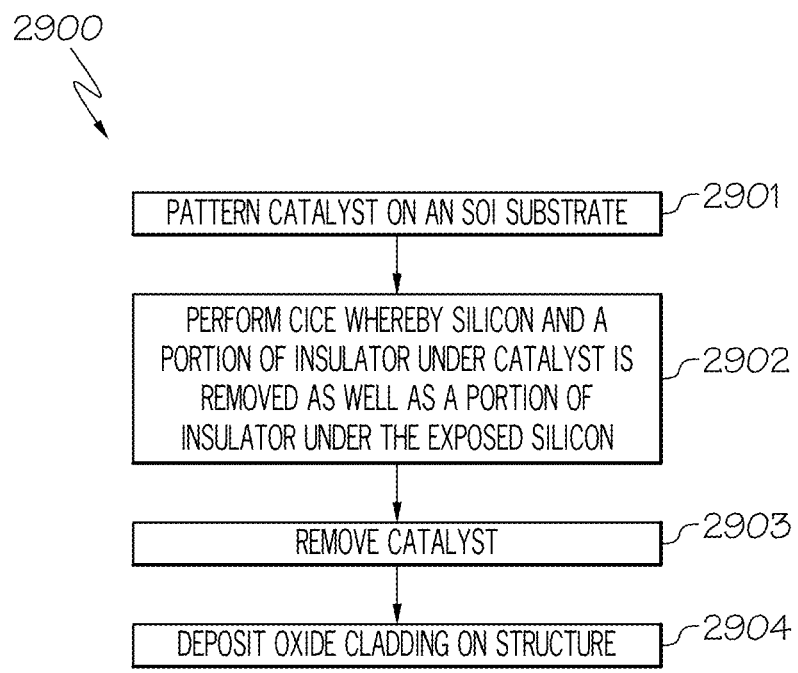
FIG. 29 is a flowchart of another alternative method for creating waveguides with CICE in accordance with an embodiment of the present invention.

FIG. 29 is a flowchart of another alternative method 2900 for creating waveguides with CICE in accordance with an embodiment of the present invention. FIGS. 33A-33E depict the cross-sectional views for creating waveguides with CICE using the steps described in FIG. 29 in accordance with an embodiment of the present invention.

Referring to FIG. 29, in conjunction with FIGS. 30A-30E, in step 2901, catalyst 3001 is patterned on an SOI substrate 3002, consisting of silicon 3003, insulator 3004 and silicon substrate 3005, as shown in FIGS. 30A and 30B.

In step 2902, CICE is performed whereby silicon 3003 and a portion of insulator 3004 under catalyst 3001 is removed as well as a portion of insulator 3004 under the exposed silicon 3003 (portion of silicon 3003 not patterned with catalyst 3001) as shown in FIG. 30C.

In step 2903, catalyst 3001 is removed as shown in FIG. 30D.

In step 2904, oxide cladding 3006 is deposited on the structure of FIG. 30D, namely, the exposed silicon 3003 and the exposed insulator 3004, as shown in FIG. 30E.

Another alternative process for creating waveguides with CICE is discussed below in connection with FIGS. 31 and 32A-32H. In particular, FIG. 31 is a method for creating waveguides with a silicon nitride core using CICE.

Figure 31:
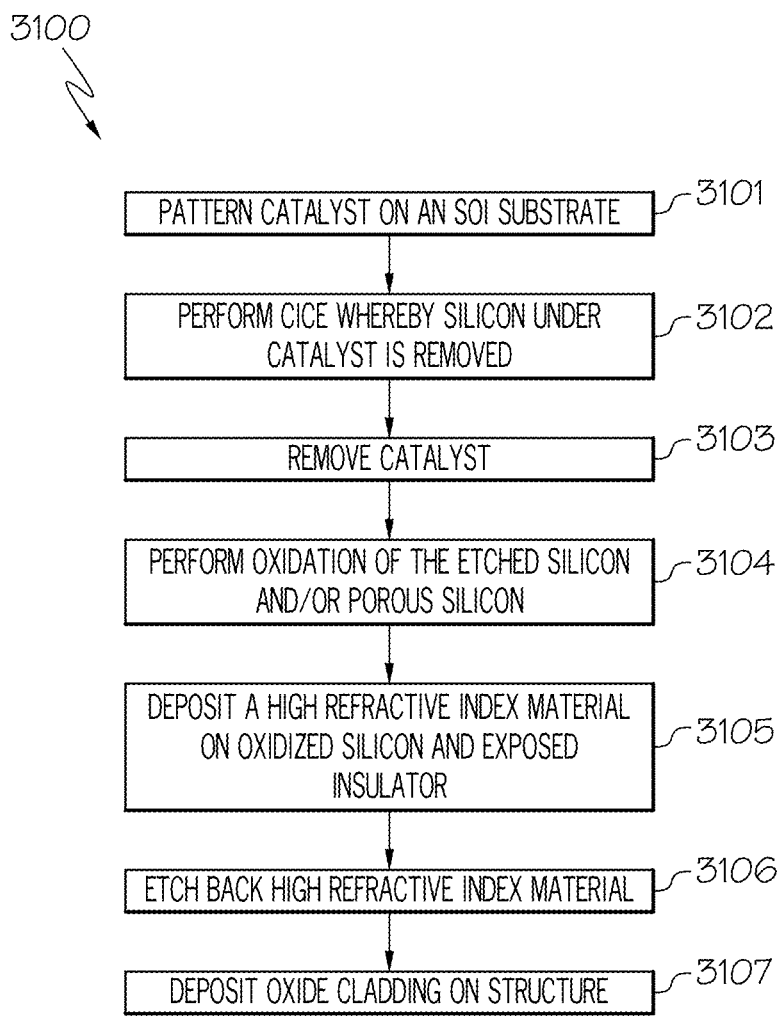
FIG. 31 is a flowchart of a further alternative method for creating waveguides with CICE in accordance with an embodiment of the present invention.

FIG. 31 is a flowchart of a further alternative method 3100 for creating waveguides with CICE in accordance with an embodiment of the present invention. FIGS. 32A-32H depict the cross-sectional views for creating waveguides with CICE using the steps described in FIG. 31 in accordance with an embodiment of the present invention.

Figure 32D:
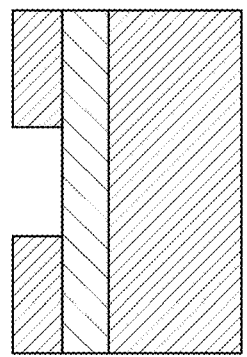
FIGS. 32A-32H depict the cross-sectional views for creating waveguides with CICE using the steps described in FIG. 31 in accordance with an embodiment of the present invention.
Figure 32H:
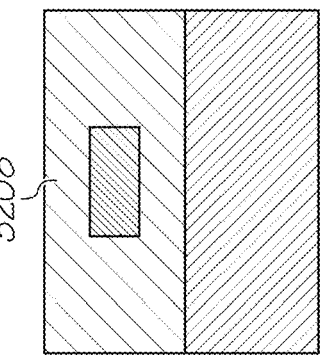
Figure 32C:
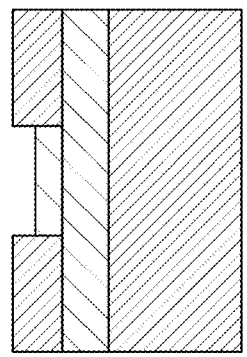
Figure 32G:
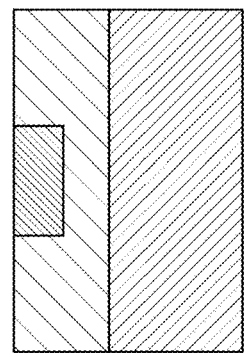
Figure 32B:
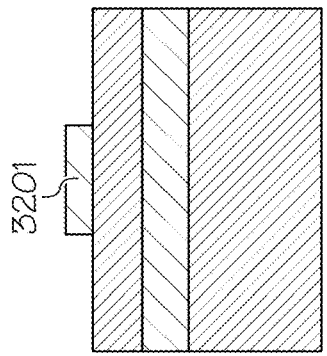
Figure 32F:
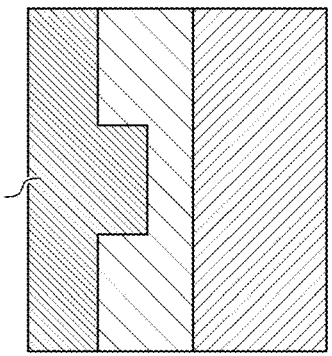
Figure 32A:
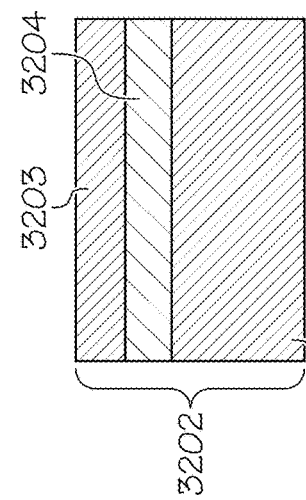

Referring to FIG. 31, in conjunction with FIGS. 32A-32H, in step 3101, catalyst 3201 is patterned on an SOI substrate 3202, consisting of silicon 3203, insulator 3204 and silicon substrate 3205, as shown in FIGS. 32A and 32B.

In step 3102, CICE is performed whereby silicon 3203 under catalyst 3201 is removed as shown in FIG. 32C.

In step 3103, catalyst 3201 is removed as shown in FIG. 32D.

Figure 32E:
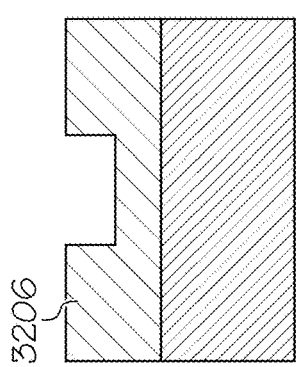

In step 3104, oxidation of the etched silicon and/or porous silicon (oxidized silicon 3606) is performed as shown in FIG. 32E.

In step 3105, a high refractive index material 3207 (e.g., silicon nitride) is deposited on oxidized silicon 3206 and exposed insulator 3204 as shown in FIG. 32F.

In step 3106, the high refractive index material 3207 is etched back, such as via chemical mechanical polishing, plasma etching, wet etching, etc., to the level of oxidized silicon 3206 as shown in FIG. 32G.

In step 3107, oxide cladding 3208 is deposited on the structure of FIG. 32G, namely, the exposed oxidized silicon 3206 and the exposed high refractive index material 3207, as shown in FIG. 32H.

Further alternative processes for creating waveguides with CICE are discussed below in connection with FIGS. 33, 34A-34G, 35 and 36A-36I Such processes are directed to creating waveguides using bulk silicon wafers with a silicon core and a core with a high refractive index material (e.g., silicon nitride). After oxidation of porous silicon, silicon dioxide is deposited using atom layer deposition to smoothen any porous surface before further processing.

Figure 33:
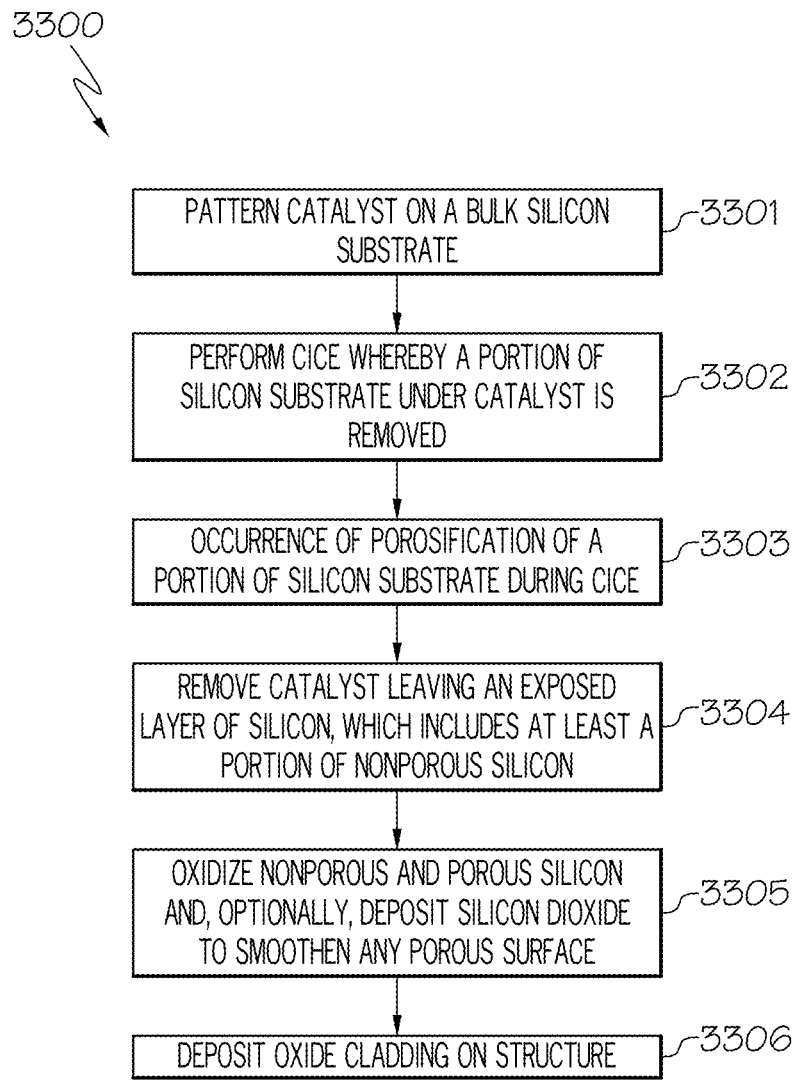
FIG. 33 is a flowchart of a method for creating waveguides using bulk silicon wafers with CICE in accordance with an embodiment of the present invention.

FIG. 33 is a flowchart of a method 3300 for creating waveguides using bulk silicon wafers with CICE in accordance with an embodiment of the present invention. FIGS. 34A-34G depict the cross-sectional views for creating waveguides using bulk silicon wafers with CICE using the steps described in FIG. 33 in accordance with an embodiment of the present invention.

Referring to FIG. 33, in conjunction with FIGS. 34A-34G, in step 3301, catalyst 3401 is patterned on a bulk silicon substrate (e.g., low doped bulk silicon substrate) 3402 as shown in FIGS. 34A and 34B.

In step 3302, CICE is performed whereby a portion of silicon substrate 3402 under catalyst 3401 is removed as shown in FIG. 34C.

In step 3303, the porosification of the portion of silicon substrate 3402 (see element 3403) occurs during CICE as shown in FIG. 34D.

In step 3304, catalyst 3401 is removed leaving an exposed layer of silicon 3404, which includes at least a portion of nonporous silicon, as shown in FIG. 34E.

In step 3305, nonporous and porous silicon is oxidized (see element 3405), such as the oxidization of porous silicon 3403 and the oxidization of at least a portion of nonporous silicon 3804 as shown in FIG. 34F. Furthermore, silicon dioxide may optionally be deposited, such as via atomic layer deposition, to smoothen any porous surface.

In step 3306, oxide cladding 3406 is deposited on the structure of FIG. 34F, namely, the oxidized silicon 3405, as shown in FIG. 34G.

An alternative process for creating waveguides using bulk silicon wafers with CICE is discussed below in connection with FIGS. 35 and 36A-36I.

Figure 35:
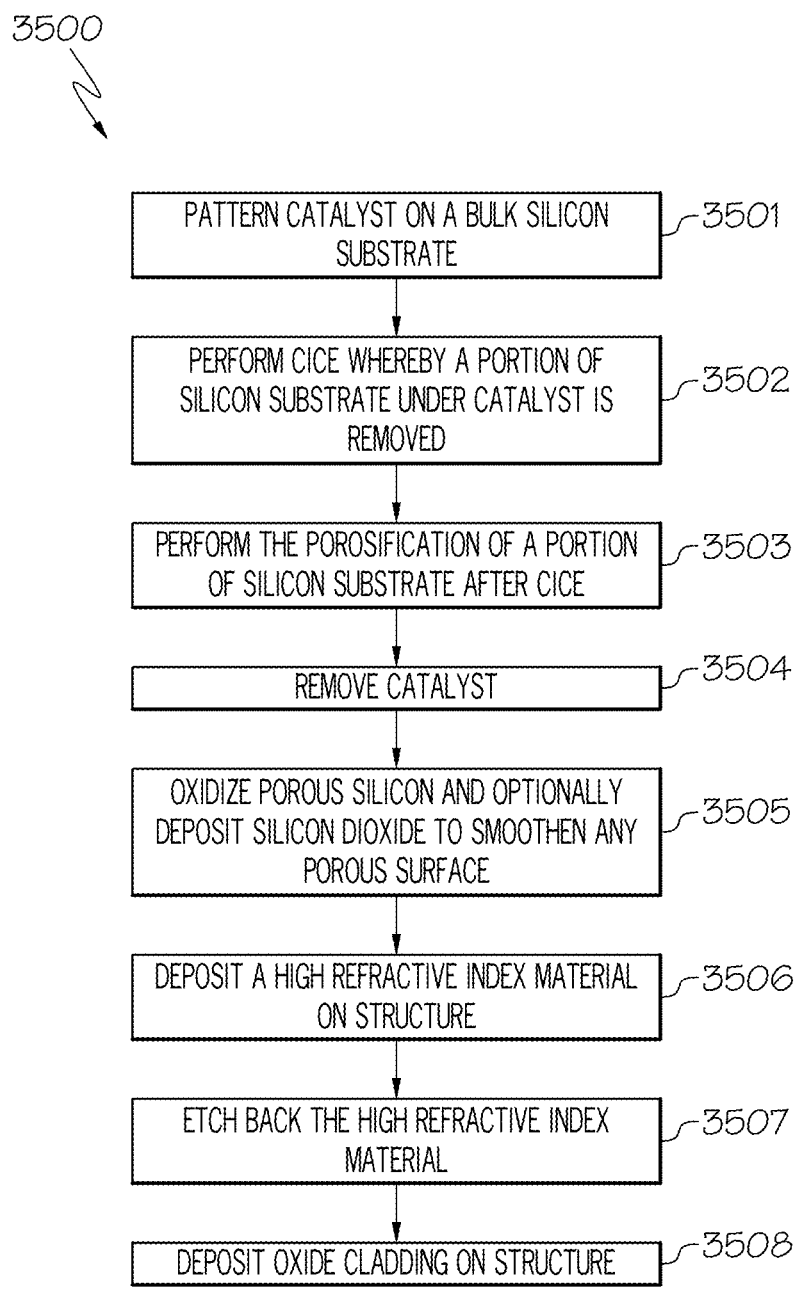
FIG. 35 is a flowchart of an alternative method for creating waveguides using bulk silicon wafers with CICE in accordance with an embodiment of the present invention.

FIG. 35 is a flowchart of an alternative method 3500 for creating waveguides using bulk silicon wafers with CICE in accordance with an embodiment of the present invention. FIGS. 36A-36I depict the cross-sectional views for creating waveguides using bulk silicon wafers with CICE using the steps described in FIG. 35 in accordance with an embodiment of the present invention.

Figure 36A:
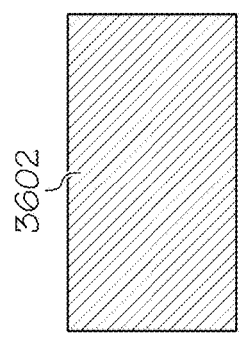
FIGS. 36A-36I depict the cross-sectional views for creating waveguides using bulk silicon wafers with CICE using the steps described in FIG. 35 in accordance with an embodiment of the present invention.
Figure 36B:
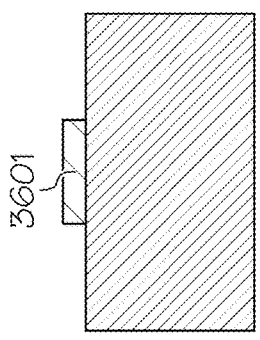

Referring to FIG. 35, in conjunction with FIGS. 36A-36I, in step 3501, catalyst 3601 is patterned on a bulk silicon substrate 3602 as shown in FIGS. 36A and 36B.

Figure 36C:
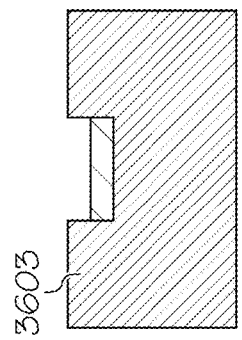

In step 3502, CICE is performed whereby a portion of silicon substrate 3602 under catalyst 3601 is removed as shown in FIG. 36C.

Figure 36D:
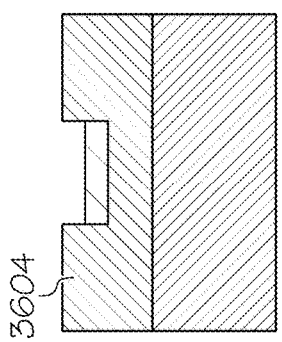

In step 3503, the porosification of a portion of silicon substrate 3602 (see element 3603) is performed after CICE as shown in FIG. 36D. In one embodiment, the porosification is performed using electrochemical etching of the silicon in the same tool and same etchant used for CICE. In one embodiment, the porosification is performed using electric fields.

Figure 36E:
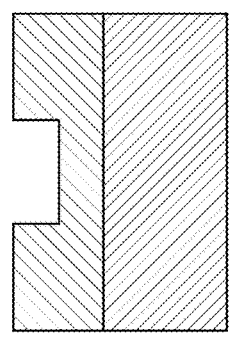

In step 3504, catalyst 3601 is removed as shown in FIG. 36E.

Figure 36F:
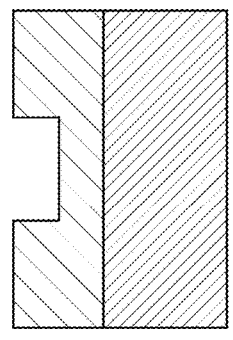

In step 3505, the porous silicon is oxidized (see element 3604), such as the oxidization of porous silicon 3603 as shown in FIG. 36F. Furthermore, silicon dioxide may optionally be deposited, such as via atomic layer deposition, to smoothen any porous surface.

Figure 36G:
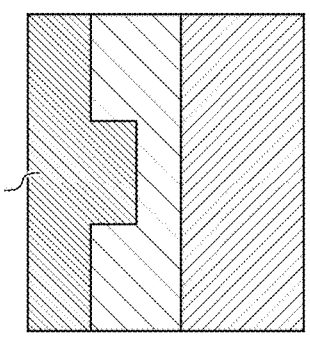

In step 3506, a high refractive index material 3605, such as silicon nitride, is deposited on the structure of FIG. 36F, namely, the oxidized silicon 3604, as shown in FIG. 36G.

Figure 36H:
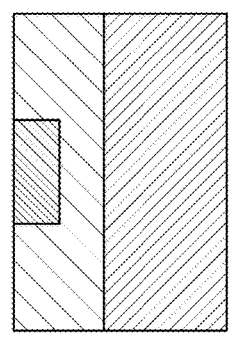

In step 3507, the high refractive index material 3605 is etched back, such as via chemical mechanical polishing, plasma etching, wet etching, etc. to the level of oxidized silicon 3604 as shown in FIG. 36H.

Figure 36I:
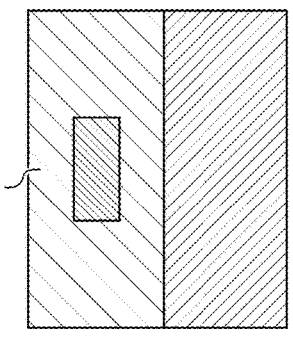

In step 3508, oxide cladding 3606 is deposited on the structure of FIG. 36H, namely, the oxidized silicon 3604 and exposed portion of high refractive index material 3605, as shown in FIG. 36I.

Further alternative processes for creating waveguides with CICE are discussed below in connection with FIGS. 37, 38A-38F, 39 and 40A-40H. Such processes are directed to creating waveguides using silicon wafers with a silicon core and a core with a high refractive index material (e.g., silicon nitride). After oxidation of porous silicon, silicon dioxide is deposited using atom layer deposition to smoothen any porous surface before further processing.

Figure 37:
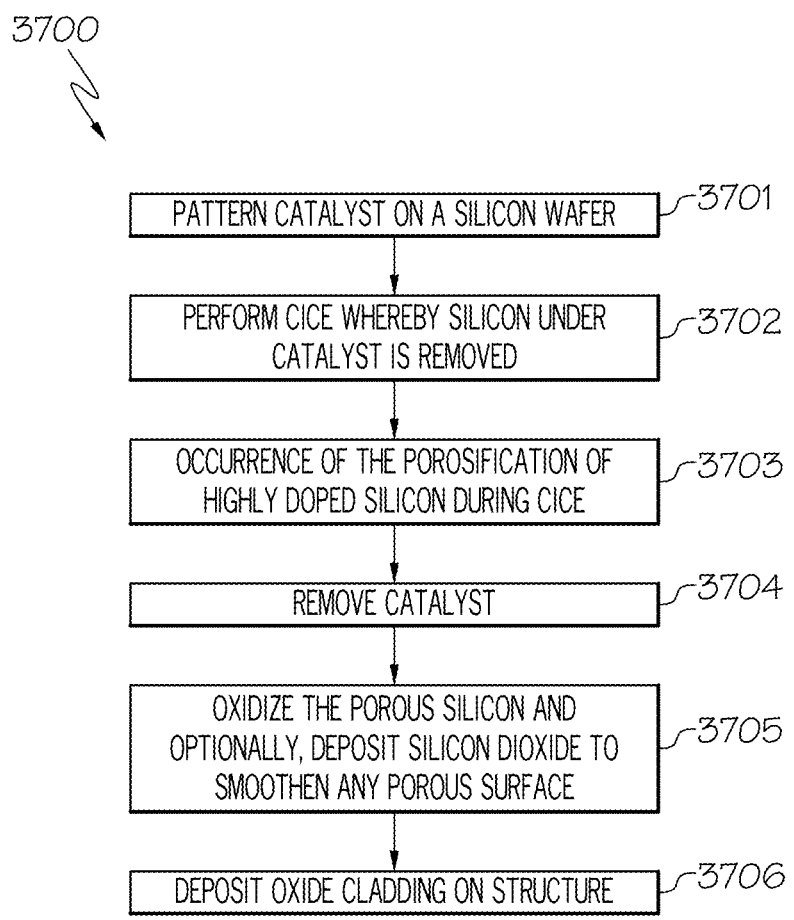
FIG. 37 is a flowchart of a method for creating waveguides using silicon wafers with CICE in accordance with an embodiment of the present invention.

FIG. 37 is a flowchart of a method 3700 for creating waveguides using silicon wafers with CICE in accordance with an embodiment of the present invention. FIGS. 38A-38F depict the cross-sectional views for creating waveguides using silicon wafers with CICE using the steps described in FIG. 37 in accordance with an embodiment of the present invention.

Referring to FIG. 37, in conjunction with FIGS. 38A-38F, in step 3701, catalyst 3801 is patterned on a silicon layer 3802 (e.g., low doped epitaxial (epi) silicon layer) on a silicon substrate 3803 (e.g., highly doped silicon substrate) as shown in FIGS. 38A and 38B.

In step 3702, CICE is performed whereby silicon 3802, 3803 under catalyst 3801 is removed as shown in FIG. 38C.

In step 3703, the porosification of highly doped silicon (see element 3804) occurs during CICE as shown in FIG. 38C.

In step 3704, catalyst 3801 is removed as shown in FIG. 38D.

In step 3705, the porous silicon 3804 is oxidized (see element 3805) as shown in FIG. 38E. Optionally, silicon dioxide is deposited, such as via atomic layer deposition, to smoothen any porous surface.

In step 3706, oxide cladding 3806 is deposited on the structure of FIG. 38E, namely, the remaining portion of silicon substrate 3803 and the remaining portion of silicon wafer 3802, as shown in FIG. 38F.

An alternative process for creating waveguides using silicon wafers with CICE is discussed below in connection with FIGS. 39 and 40A-40H.

Figure 39:
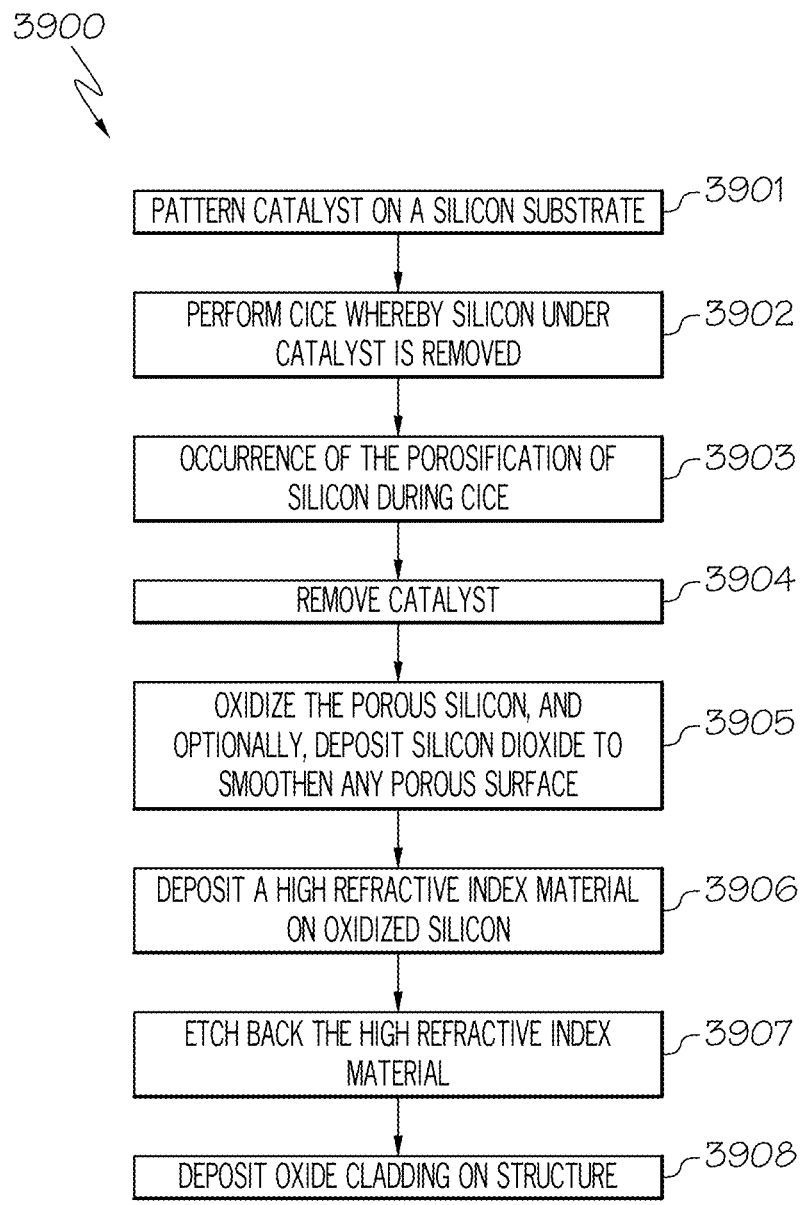
FIG. 39 is a flowchart of an alternative method for creating waveguides using silicon wafers with CICE in accordance with an embodiment of the present invention.

FIG. 39 is a flowchart of an alternative method 3900 for creating waveguides using silicon wafers with CICE in accordance with an embodiment of the present invention. FIGS. 40A-40H depict the cross-sectional views for creating waveguides using silicon wafers with CICE using the steps described in FIG. 39 in accordance with an embodiment of the present invention.

Figure 40A:
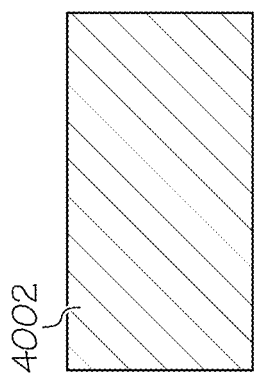
FIGS. 40A-40H depict the cross-sectional views for creating waveguides using silicon wafers with CICE using the steps described in FIG. 39 in accordance with an embodiment of the present invention.
Figure 40B:
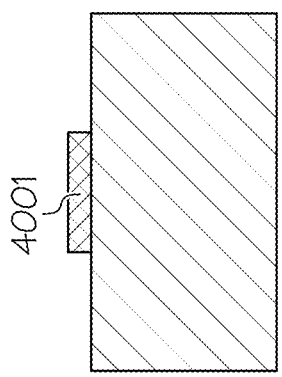

Referring to FIG. 39, in conjunction with FIGS. 40A-40H, in step 3901, catalyst 4001 is patterned on a silicon substrate 4002 (e.g., highly doped or low doped bulk silicon substrate) as shown in FIGS. 40A and 40B.

Figure 40C:
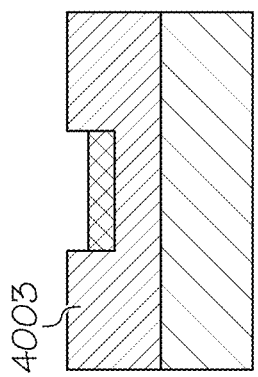

In step 3902, CICE is performed whereby silicon 4002 under catalyst 4001 is removed as shown in FIG. 40C.

In step 3903, the porosification of silicon (see element 4003) occurs during CICE as shown in FIG. 40C.

Figure 40D:
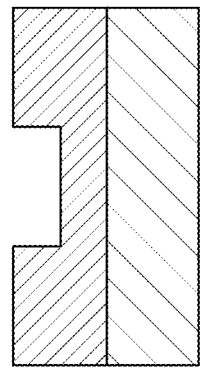

In step 3904, catalyst 4001 is removed as shown in FIG. 40D.

Figure 40E:
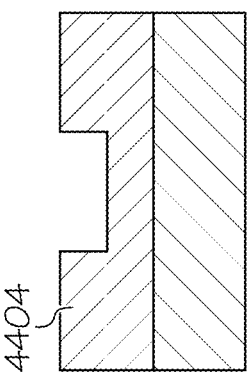

In step 3905, the porous silicon 4003 is oxidized (see element 4004) as shown in FIG. 40E. Optionally, silicon dioxide is deposited, such as via atomic layer deposition, to smoothen any porous surface.

Figure 40F:
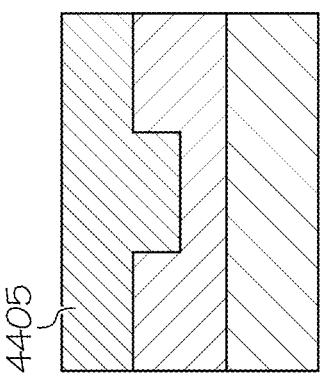

In step 3906, a high refractive index material 4005 (e.g., silicon nitride) is deposited on oxidized silicon 4004 as shown in FIG. 40F.

Figure 40G:
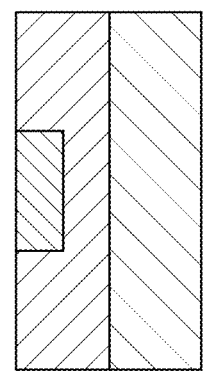

In step 3907, the high refractive index material 4005 is etched back, such as via chemical mechanical polishing, plasma etching, wet etching, etc., to the level of oxidized silicon 4004 as shown in FIG. 40G.

Figure 40H:
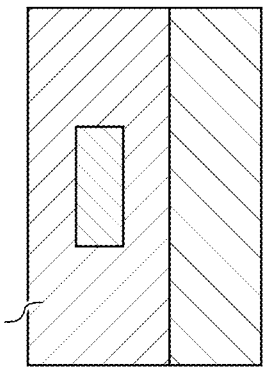

In step 3908, oxide cladding 4006 is deposited on the structure of FIG. 40G, namely, the oxidized silicon 4004 and the exposed portion of high refractive index material 4005, as shown in FIG. 40H.

Embodiments of the present invention also can fabricate multilayer silicon waveguides with CICE.

Multiple stacked layers of silicon waveguides can be made on the same substrate with a single crystal silicon core by using silicon superlattice etching (SiSE). In one embodiment, the substrate includes a material stack that consists of alternating layers of silicon of different doping types and/or concentrations, alternating layers of silicon, silicon-germanium alloy ($Si_xGe_{1-x}$) and/or germanium, etc. In one embodiment, the thickness of each layer of the alternating layers is between 1 nm and 500 nm.

SiSE can be used to tune the porosity as the catalyst etches into the silicon by taking advantage of the electrochemical nature of the etch as discussed in U.S. Patent Application Publication No. 2018/060176, Sreenivasan et al., "Catalyst Influenced Pattern Transfer Technology," which is hereby incorporated by reference herein in its entirety. Alternating layers of porous and non-porous silicon have been demonstrated by utilizing different etch parameters, such as by varying the doping concentration of silicon, electric field current density or concentration of oxidant during MACE.

Figure 41:
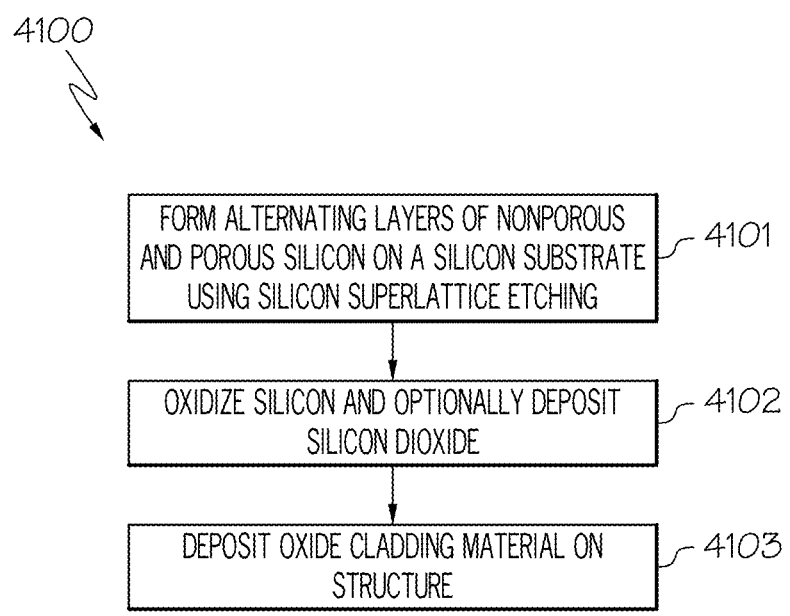
FIG. 41 is a flowchart for creating multiple layers of silicon waveguides using silicon superlattice etching (SiSE) in accordance with an embodiment of the present invention.
Figure 42A:
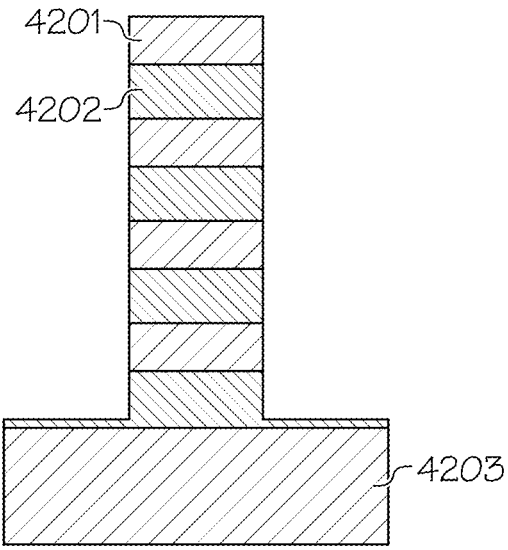
FIGS. 42A-42C depict the cross-sectional views for creating multiple layers of silicon waveguides using SiSE using the steps described in FIG. 45 in accordance with an embodiment of the present invention.
Figure 42B:
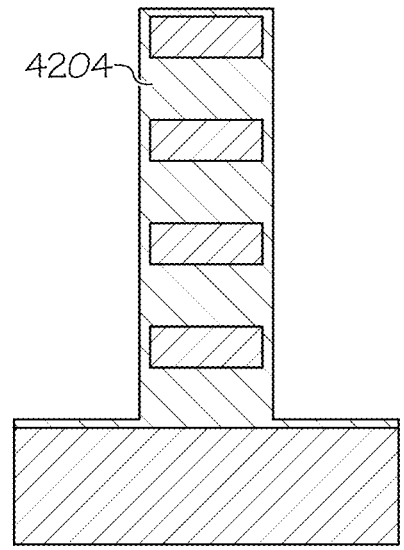
Figure 42C:
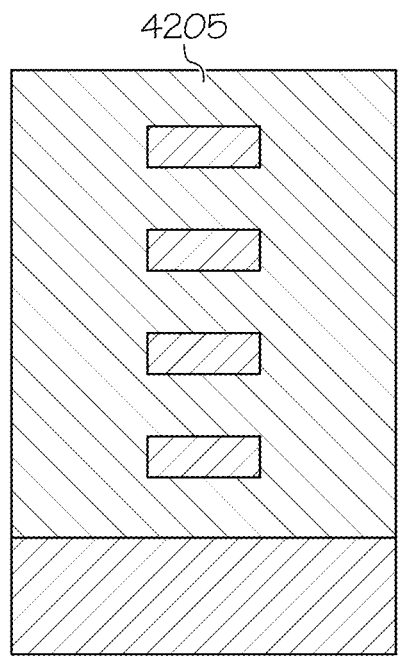

FIG. 41 is a flowchart of a method 4100 for creating multiple layers of silicon waveguides using SiSE in accordance with an embodiment of the present invention. FIGS. 42A-42C depict the cross-sectional views for creating multiple layers of silicon waveguides using SiSE using the steps described in FIG. 41 in accordance with an embodiment of the present invention.

Referring to FIG. 41, in conjunction with FIGS. 42A-42C, in step 4101, alternating layers of nonporous and porous silicon 4201, 4202, respectively, are formed on a silicon substrate 4203 using SiSE as discussed in Sreenivasan et al. as shown in FIG. 42A.

In step 4102, silicon 4202 is oxidized (see element 4204) as shown in FIG. 42B. Optionally, silicon dioxide is deposited, such as via atomic layer deposition.

In step 4103, oxide cladding material 4605 is deposited on the structure of FIG. 42B, as shown in FIG. 42C.

In one embodiment of the present invention, a method for making multi stacks of waveguides comprises creating a material stack comprising two or more layers of alternating semiconducting films, where each of the two or more layers of alternating semiconducting films is different from another in at least one of the following properties: material, doping concentration and dopant material. The method further comprises etching the material stack by catalyst influenced chemical etching such that layers differing in the properties produce etched nanostructures differing in at least one of the following: porosity, etch rates and thermal processing rates. The method additionally comprises selectively processing one of the two or more layers of alternating semiconducting films to either change a chemical composition or remove it. Further, a processed layer of alternating semiconducting films acts as a core for waveguides where the core comprises one of the following: a single crystal silicon, a germanium-doped silica core, a hydrogenated amorphous silicon, a recrystallized poly Si, silicon nitride, silicon carbide, germanium, gallium nitride, gallium phosphide, and III-V semiconductors. Further, a processed layer of alternating semiconducting films acts as cladding for waveguides, where the cladding comprises one of the following: silicon dioxide, silicon oxynitride, air, porous silicon, porous silicon oxide, and metal oxides.

In another embodiment of the present invention, a method for making multi stacks of waveguides comprises providing a semiconducting material, where the semiconducting material comprises one of the following: a single crystal bulk silicon wafer, a layer of polysilicon of thickness greater than 100 nm deposited on a substrate, a layer of amorphous silicon of thickness greater than 100 nm deposited on a substrate, a silicon-on-insulator wafer, and a layer of epitaxial silicon of thickness greater than 100 nm on a substrate, silicon, germanium, and silicon-germanium alloy ($Si_xGe_{1-x}$). The method further comprises patterning a catalyst layer on a surface of the semiconducting material. In one embodiment, the catalyst comprises ruthenium. The method additionally comprises performing catalyst influenced chemical etching comprising exposing the patterned catalyst layer to an etchant, where the patterned catalyst layer and the etchant cause etching of the semiconducting material to form nanostructures. Furthermore, the method comprises exposing the semiconducting material to a time-varying electric field to produce alternating layers of etched nanostructures, where at least one of the alternating layers is porous. Additionally, the method comprises selectively processing one of the alternating layers to either change its chemical composition or remove it. Further, a processed layer of alternating semiconducting films acts as a core for waveguides where the core comprises one of the following: a single crystal silicon, a germanium-doped silica core, a hydrogenated amorphous silicon, a recrystallized poly Si, silicon nitride, silicon carbide, germanium, gallium nitride, gallium phosphide, and III-V semiconductors. Further, a processed layer of alternating semiconducting films acts as cladding for waveguides, where the cladding comprises one of the following: silicon dioxide, silicon oxynitride, air, porous silicon, porous silicon oxide, and metal oxides.

In a further embodiment of the present invention, a photonic waveguide comprises a core having a wall angle that is greater than 89.5 degrees, where the core is surrounded by a cladding material with a lower refractive index, and where the core is created using catalyst influenced chemical etching, where the core comprises silicon or silicon nitride, where the cladding material comprises silicon oxide, silicon oxynitride, or air. Further, the sidewalls of the core have a surface roughness less than 1 nm 1 sigma, where a core feature line edge roughness is less than 2 nm 1 sigma.

In another embodiment of the present invention, a quantum computing device with single photon detectors comprises a superconducting material with a smallest lateral dimension less than 100 nm, where the superconducting material is deposited using selective atomic layer deposition. In one embodiment, the superconducting material comprises one of the following: niobium nitride (NbN), niobium titanium nitride (NbTiN), tungsten silicide, niobium silicide and molybdenum silicide.

As previous discussed, silicon photonics can enable higher performance computing in electronic, photonic as well as quantum computers. Electronic computers can achieve higher bandwidth at lower energy using optical interconnects. Photon-based quantum computing when integrated with photonic integrated circuits (PICs), single photon sources and detectors can enable large scale quantum circuits with the potential of scale up using mature CMOS technology. However, optical waveguides, a key element in PICs suffer from transmission losses and loss of photon indistinguishability caused by imperfections in the fabrication process. Additionally, integration with other elements of photonic circuits affect yield and are a barrier to deployment in industry. Various embodiments of the present invention provide for a novel fabrication processes and process integration techniques to reduce losses and improve yield and performance of PICs.

Optical waveguides, a key element in photonic integrated circuits (PICs), suffer from transmission losses and loss of photon indistinguishability caused by imperfections in the fabrication process. The principles of the present invention use nanoimprint lithography to minimize line edge roughness, Catalyst Influenced Chemical Etching (CICE) to minimize sidewall angle and sidewall damage, and selective atomic layer deposition of superconducting materials in quantum computers that use PICs.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A method for making multilayer nanostructures, the method comprising:
    providing a semiconducting material comprising two or more layers;
    patterning a catalyst layer on a surface of said semiconducting material, wherein said catalyst layer comprises ruthenium;
    exposing said patterned catalyst layer to an etchant, wherein said patterned catalyst layer and said etchant cause etching of said semiconducting material to form vertical nanostructures, wherein said vertical nanostructures comprise two or more layers; and
    selectively processing one or more of said two or more layers of said vertical nanostructures to either change its chemical composition or remove it.

2. The method as recited in claim 1, wherein said semiconducting material comprises alternating layers, wherein the method further comprises:
    forming a resulting structure after selectively processing one of said alternating layers to either change its chemical composition or remove it, wherein said resulting structure is used as a fin for subsequent formation of fin field-effect transistors (FinFETs), lateral nanowire FETs or nanosheet FETs.

3. The method as recited in claim 2 further comprising:
    forming source and drain regions using carbon-doped silicon material and silicon-germanium material for p-FETs and n-FETs, respectively.

4. The method as recited in claim 2, wherein a minimum thickness of at least one of said alternating layers is defined by requirements of transistor channel thickness.

5. The method as recited in claim 1, wherein one or more of said two or more layers of said vertical nanostructures are different in at least one of the following: material, morphology, porosity, etch rates, thermal processing rates, doping concentration and dopant material.

* * * * *

UNITED STATES PATENT AND TRADEMARK OFFICE
CERTIFICATE OF CORRECTION

| | |
|---|---|
| PATENT NO. | : 11,881,435 B2 |
| APPLICATION NO. | : 17/735476 |
| DATED | : January 23, 2024 |
| INVENTOR(S) | : Sreenivasan et al. |

Page 1 of 1

It is certified that error appears in the above-identified patent and that said Letters Patent is hereby corrected as shown below:

In the Specification

Please replace the term "89.5" at Column 13, Line 26 with the term "89.5°".

Signed and Sealed this
Fifteenth Day of October, 2024

*Katherine Kelly Vidal*

Katherine Kelly Vidal
*Director of the United States Patent and Trademark Office*